United States Patent [19]

Kaneko et al.

[11] Patent Number: 6,009,890
[45] Date of Patent: Jan. 4, 2000

[54] SUBSTRATE TRANSPORTING AND PROCESSING SYSTEM

[75] Inventors: Satoshi Kaneko, Chikushino; Yuji Kamikawa, Koshi-machi; Akira Koguchi, Maebaru; Osamu Kuroda, Tosu; Shigenori Kitahara, Chikugo; Tatsuya Nishida, Kurume, all of Japan

[73] Assignee: Tokyo Electron Limited, Tokyo-to, Japan

[21] Appl. No.: 09/007,753

[22] Filed: Jan. 15, 1998

[30] Foreign Application Priority Data

| | | | |
|---|---|---|---|
| Jan. 21, 1997 | [JP] | Japan | 9-22109 |
| Jan. 29, 1997 | [JP] | Japan | 9-29506 |
| Apr. 18, 1997 | [JP] | Japan | 9-116571 |

[51] Int. Cl.⁷ ...................................................... B08B 3/04
[52] U.S. Cl. ........................... 134/133; 134/134; 134/902
[58] Field of Search ................................. 134/60, 61, 131, 134/133, 902, 134, 208, 181; 198/379, 418

[56] References Cited

U.S. PATENT DOCUMENTS

| | | | |
|---|---|---|---|
| 4,408,560 | 10/1983 | Caratsch | 134/902 |
| 4,693,777 | 9/1987 | Hazano et al. | 134/902 |
| 4,715,392 | 12/1987 | Abe et al. | 134/902 |
| 4,828,878 | 5/1989 | Mankut et al. | 134/902 |
| 5,158,616 | 10/1992 | Kinoshita et al. . | |
| 5,297,568 | 3/1994 | Schmid | 134/902 |
| 5,314,509 | 5/1994 | Kato et al. | 134/902 |
| 5,379,784 | 1/1995 | Nishi et al. . | |
| 5,381,808 | 1/1995 | Kamikawa et al. . | |
| 5,431,179 | 7/1995 | Miyazaki et al. . | |
| 5,482,068 | 1/1996 | Kitahara et al. . | |
| 5,485,644 | 1/1996 | Shinbara et al. . | |
| 5,520,744 | 5/1996 | Fujikawa et al. . | |
| 5,795,405 | 8/1998 | Harnden et al. | 134/902 |

FOREIGN PATENT DOCUMENTS

| | | | |
|---|---|---|---|
| 0768704A2 | 4/1997 | European Pat. Off. . | |
| 3-196626 | 8/1991 | Japan | 134/902 |
| 5-259136 | 10/1993 | Japan | 134/902 |

OTHER PUBLICATIONS

EPO 526,245 134/190, Feb. 1993.

*Primary Examiner*—Frankie L. Stinson
*Attorney, Agent, or Firm*—Smith, Gambrell & Russell, LLP Beveridge, DeGrandi, Weilacher & Young

[57] ABSTRACT

A substrate transporting and processing system generally comprises: a supply section of a carrier 1 for housing therein wafers W to be processed, in a horizontal state; a discharge section of the carrier 1; a wafer unloading arm 14 for unloading the wafers W from said carrier 1; a wafer loading arm 16 for loading the wafers W into the carrier 1; an attitude changing unit 40 for changing the attitude of the wafers W between a horizontal state and a vertical state; a processing section 3 for suitably processing the wafers W; and a wafer transport arm 56 for delivering the wafers W between the attitude changing unit 40 and the processing section 3 and for transporting the wafers W into and from the processing section. Thus, after the wafers W housed in the carrier 1 in the horizontal state are unloaded and the attitude of the wafers W is changed into the vertical state, suitable processes are carried out, and the attitude of the wafers W is changed in the horizontal state after processing, so that the wafers W can be housed in the carrier 1. Thus, it is possible to decrease the size of the whole system to improve the throughput and to improve the yield of products.

26 Claims, 38 Drawing Sheets

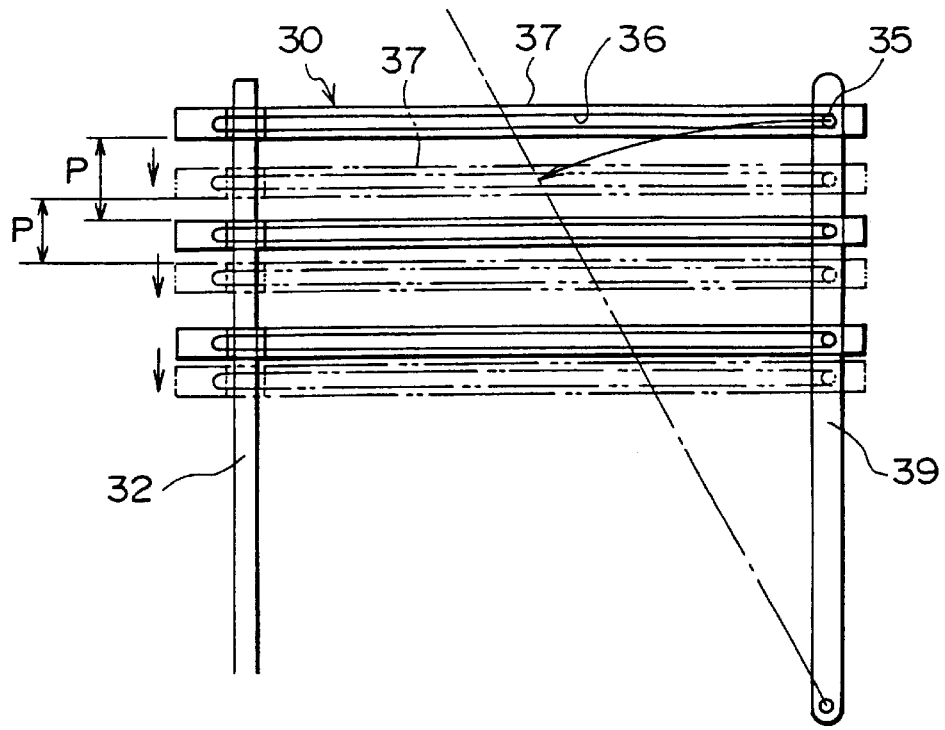
F I G. 12
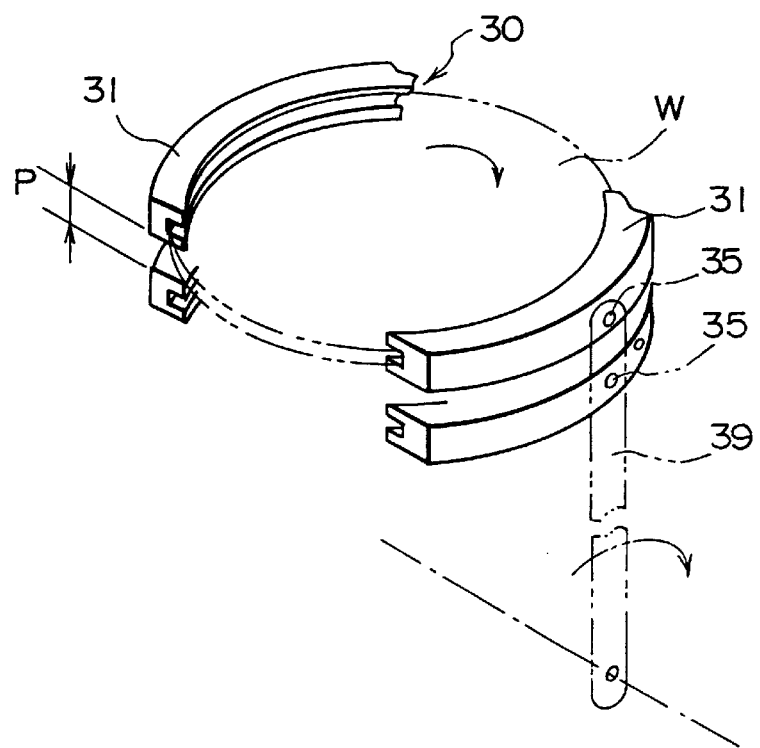
F I G. 13

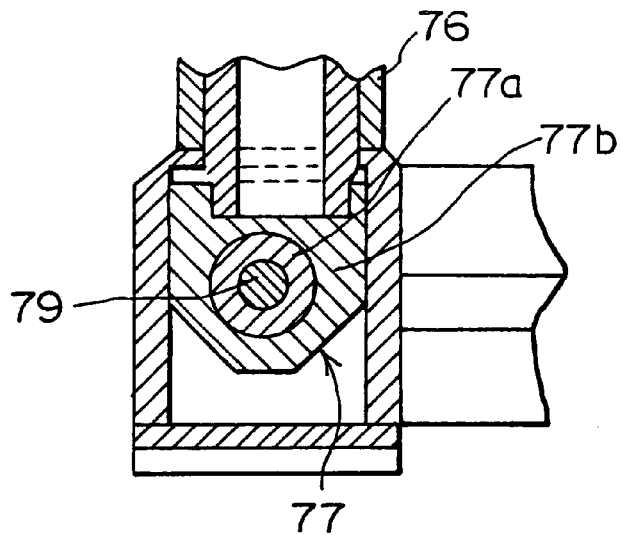
F I G. 21
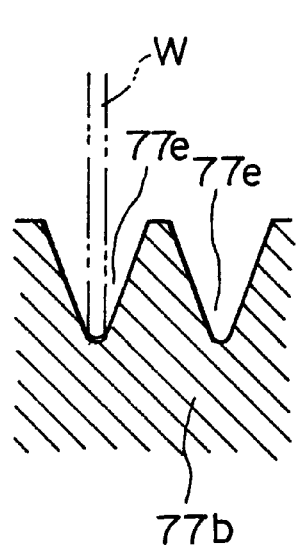
F I G. 22(a)
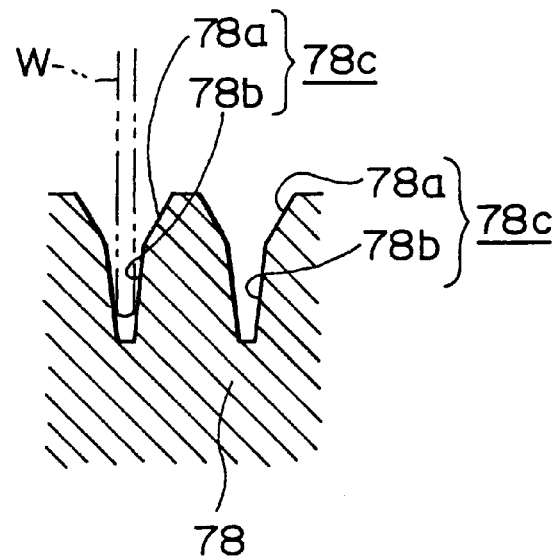
F I G. 22(b)

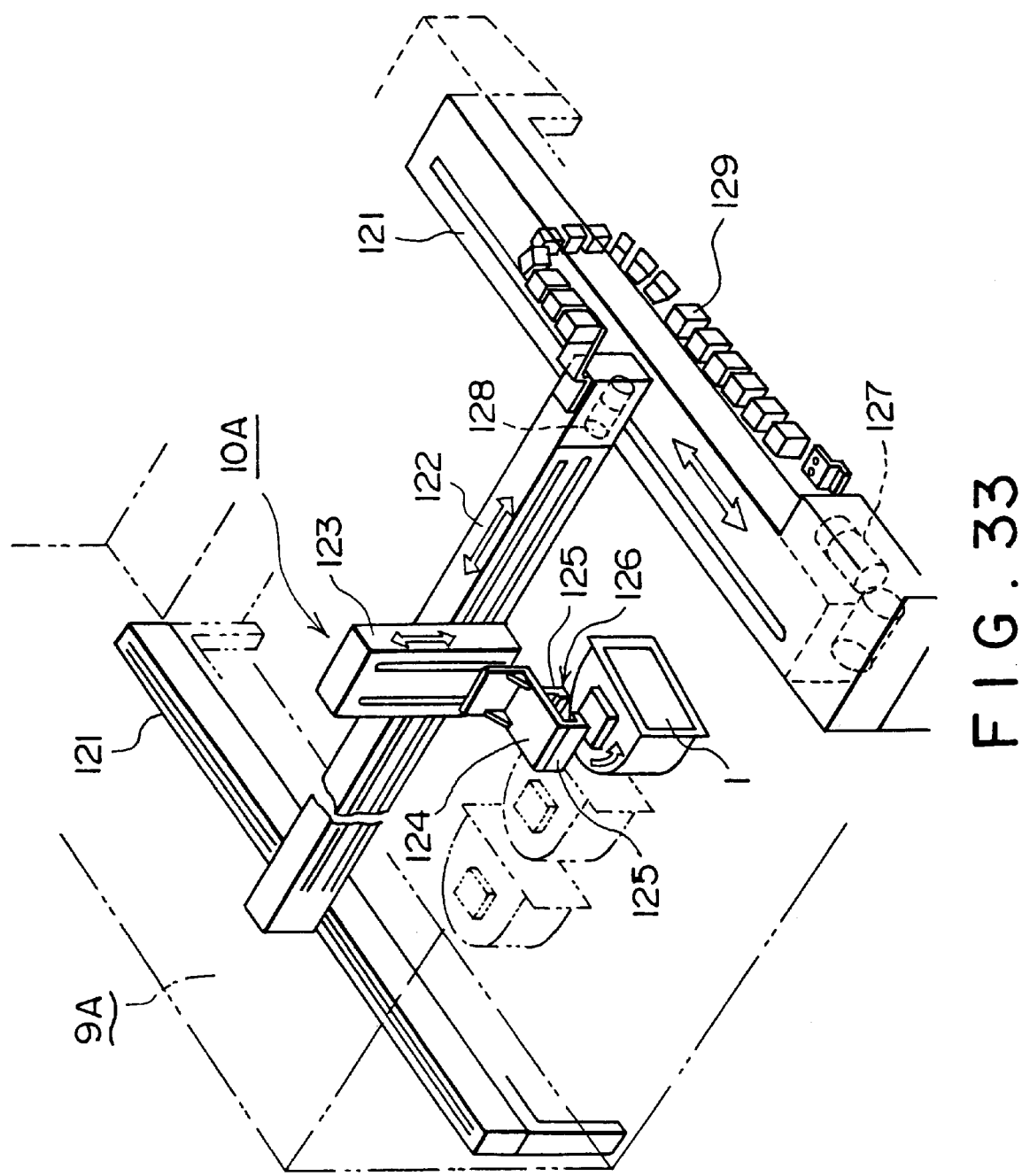
F I G. 33

SUBSTRATE TRANSPORTING AND PROCESSING SYSTEM

BACKGROUND OF THE INVENTION

1. Field of the Invention

The present invention relates generally to a substrate transporting and processing system and a cleaning system. More specifically, the invention relates to a substrate transporting and processing system and cleaning system for sequentially transporting substrates to be processed, such as semiconductor wafers and glass substrates for LCDs, to suitably process the substrates.

2. Description of the Prior Art

In general, in production processes in semiconductor fabrication systems, substrate transporting and processing systems are widely used for sequentially transporting substrates to be processed, such as semiconductor wafers and glass substrates for LCDs (each of which will be hereinafter referred to as a "wafer"), to a processing bath for storing therein a processing solution, such as a chemical and a rinse solution (a cleaning solution), or a dying section to carry out the processings, such as cleaning and drying, of the wafers.

In order to efficiently clean a plurality of wafers, e.g., 50 wafers, in such a substrate transporting and processing system, vertically arranged wafers are preferably transported into and from respective processing units.

In this type of processing system, a plurality of processing units and a cleaning unit of a transport means are typically arranged in a line between a container for housing therein unprocessed wafers, e.g., a supply section of a carrier, and a container for housing therein processed wafers, e.g., a discharge section of the carrier.

In recent years, with the miniaturization, super high integration and mass production of semiconductor devices, the diameter of the wafers has been increased from 8 inches to 12 inches.

However, since the size and weight of the wafers increase with the increase of the diameter of the wafers, if the vertically arranged wafers are transported from the supply section to the discharge section as the conventional manner, when the wafers are delivered between the supply and discharge sections and the processing section, there are problems in that the displacement of the wafers may occur and particles may be produced due to the movement of the wafers, so that the yield of products may be decreased.

In addition, with the increase of the diameter of the wafers, the size of the transport means and the respective processing units increases, so that there are problems in that the size of the whole system increases and the throughput decreases.

By the way, in processes for producing semiconductor devices, cleaning systems are used for removing particles and contamination, such as organic contamination, from the surface of semiconductor wafers (each of which will be hereinafter referred to as a "wafer"). Among the cleaning systems, in a wet cleaning system for immersing wafers in a cleaning solution in a processing bath, there is advantage in that particles adhered to the wafers can be effectively removed.

Typically, the wet cleaning system comprises an interface section, to which a cassette loaded with wafers is transferred, a cleaning section for cleaning and drying the wafers, and a transfer unit for transporting the cassette between the interface section and the cleaning section. The interface section has a transport gate. The cassette transported by an automatic guided vehicle (AGV) is transported into and from the cleaning system via the transport gate. The cleaning section includes a unloader for unloading the wafers from the cassette, various cleaning baths for cleaning the wafers, a drying bath for drying the wafers, and an loader for loading the wafers into the cassette. When the cassette is transferred to the interface section by means of a robot or the like, the cassette is transported into the cleaning section by means of the transfer unit. Then, the wafers are unloaded from the cassette by means of the unloader of the cleaning section. Then, e.g., 50 wafers housed in two cassettes are transported into the respective cleaning baths together to be batch cleaned using various liquids. Then, in the drying bath, the moisture on the surface of the wafers is removed using, e.g., isopropyl alcohol (IPA), simultaneously with volatilization of IPA.

The cleaning system having the above construction is generally located in a clean room having a high cleanliness. The interior of the clean room is maintained in a clean atmosphere wherein dust produced from human bodies and frictional sliding parts of machine, and impurities, such as gases and chemicals, are inhibited from being produced so that the amount of the dust and so forth is as small as possible. On the other hand, since various chemicals are used for cleaning and drying the wafers in the cleaning section of the wet cleaning system, there is a probability that the vapor of chemicals and the vapor of IPA used in the drying bath remain in the cleaning system. If the vapor leaks out of the cleaning system via the transport gate of the interface section, the interior of the clean room is contaminated.

Therefore, the interior of the cleaning system is maintained in an atmosphere of negative pressure, and the pressure inside the clean room is set to be higher than the pressure inside the cleaning system by, e.g., +0.38 mmHg, to prevent the atmosphere inside the cleaning system from leaking out via the transport gate of the interface section.

However, if there is a differential pressure between the cleaning room and the cleaning system, an airflow entering the interior of the cleaning system from the clean room via the transport gate of the interface section is formed. If particles, together with the airflow, enter the interior of the cleaning system, or if the arrow in the system is disturbed, there is a problem in that particles and mist are adhered again to the wafers, which have been cleaned. In addition, if the airflow enters the drying bath, which is drying the wafers using the IPA vapor, it is not possible to suitably supply the IPA vapor to the surfaces of the wafers, and there is a bad influence that water marks remain on the surfaces of the wafers.

On the other hand, in order to inhibit such an airflow from being produced, it has been attempted to provide a baffle board between the interface section and the cleaning section. However, if such a baffle board is provided, the wafers must bypass the baffle board when the wafers are transported between the interface section and the cleaning section, so that it is not possible to provide a straight transport path. Therefore, it takes a lot of time to transport the wafers, so that there are problems in that the tact time is increased and the throughput is decreased.

SUMMARY OF THE INVENTION

It is therefore an object of the present invention to eliminate the aforementioned problems and to provide a substrate transporting and processing system, which has a small size so as to be able to enhance the throughput and to improve the weld of products.

It is another object of the present invention to provide a cleaning system, which can prevent an airflow from entering the interior of the cleaning system from a clean room without decreasing the throughput In order to accomplish the aforementioned and other objects, according to a first aspect of the present invention, a substrate transporting and processing system comprises: a supply section of a container for housing therein a substrate to be processed, in a horizontal state; a discharge section of the container; substrate unloading means for unloading the substrate from the container; substrate loading means for loading the substrate into the container; attitude changing means for changing the attitude of the substrate between a horizontal state and a vertical state; a processing section for suitably processing the substrate; and a substrate transport means for delivering the substrate between the attitude changing means and the processing section and for transporting the substrate in the processing section. In this case, the substrate unloading means and the substrate loading means may comprise substrate unloading/loading means having a substrate unloading section and a substrate loading section.

With this construction, it is possible to change the attitude of the substrate, which is housed in the container in the horizontal state, into the vertical state to process the substrate, and it is possible to change the attitude of the processed substrate into the horizontal state to load the substrate into the container.

According to a second aspect of the present invention, a substrate transporting and processing system comprises: a supply section of a container for housing therein a substrate to be processed, in a horizontal state; a discharge section of the container; substrate unloading means for unloading the substrate from the container; substrate loading means for loading the substrate into the container; attitude changing means for changing the attitude of the substrate between a horizontal state and a vertical state; a processing section for suitably processing the substrate; and substrate transport means for transferring the substrate, the attitude of which has been changed by the attitude changing means, to an interface provided on the opposite side of the processing section to the supply and discharge sections. In this case, the substrate transporting and processing system preferably includes second substrate transport means for delivering the substrate between the processing section and the attitude changing means and for transporting the substrate in the processing section.

With this construction, since the substrates transferred to the interface section provided on the opposite side of the processing section to the supply and discharge sections can be transported to the processing section by the substrate transport means, the substrates can be sequentially transported even if the numbers of processing steps and processing lines are high. In addition, since the substrates can be separately transported in the processing section by the first and second substrate transport means, the throughput can be improved.

According to a third aspect of the present invention, a substrate transporting and processing system comprises: a supply section of a container for housing therein a substrate to be processed, in a horizontal state; a discharge section of the container; a processing section for suitably processing the substrate; an interface section provided on the opposite side of the processing section to the supply and discharge sections; and container transfer means for transferring the container transported to the supply section, to the interface section, wherein the interface section includes: substrate unloading means for unloading the substrate from the container; first attitude changing means for changing the attitude of the substrate, which is unloaded from the container by the substrate unloading means, from a horizontal state to a vertical state; substrate transport means for delivering the substrate between the first attitude changing means and the processing section and for transferring the substrate in the processing section; second attitude changing means, provided on the side of the supply and discharge sections, for changing the attitude of the substrate from the vertical state to the horizontal state; and substrate loading means for loading the substrate into the container. In this case, the substrate transporting and processing system preferably includes second substrate transport means for delivering the substrate between the processing section and the second attitude changing means and for transporting the substrate in the processing section. In addition, the substrate transporting and processing system preferably includes a container waiting section provided along a transfer channel of the container transfer means.

With this construction, the container transported to the supply section can be transferred to the interface section by the container transfer means and transferred to the processing section by the substrate transport means after the attitude of the substrate is changed from the horizontal state to the vertical state by the first attitude changing means. Therefore, the substrate can be sequentially transported even if the numbers of processing steps and processing lines are high. In addition, after the processed substrates are delivered to the second attitude changing means by the second substrate transport means and the attitude of the substrates are changed from the vertical state to the horizontal state, the substrates can be loaded into the container transported from the discharge section by the substrate loading means. Therefore, since the substrates can be separately transported in the processing section by the first and second transport means, the throughput can be improved.

The substrate transporting and processing system may further comprises: a container waiting section for housing an empty container; and container transport means for transporting the container in the supply and discharge sections and between the supply and discharge sections and the container waiting section. In this case, the container waiting section preferably has container moving means for moving the container. With this construction, the container can be smoothly transported in the supply and discharge sections, and the processed substrate can be smoothly transported from and into the empty container.

The substrate transporting and processing system may further comprise container transport means for transporting the container between the supply and discharge sections and a substrate unloading position, at which the substrate is unloaded from the container by the substrate unloading means, and a substrate loading position, at which the substrate is loaded into the container by the substrate loading means. With this construction, the container can be smoothly transported in the supply and discharge sections.

The substrate transporting and processing system may further comprise: a container waiting section for housing the container; first container transport means for transporting the container between the supply and discharge sections and the container waiting section; and second container transport means for transporting the container between the container waiting section and the substrate unloading and loading means. With this construction, the container can be smoothly transported in the supply and discharge sections, and the substrate can be unloaded from and loaded into the container. Therefore, a large number of containers can be stocked a–d a large number of substrates can be sequentially processed.

The substrate transporting and processing system may further comprise positioning means for positioning the substrate unloaded from the container. With this construction, the substrate can be processed in a suitable state.

The attitude transport means may have space adjusting means for adjusting a space between adjacent substrates. With this construction, it is possible to process a plurality of substrates in a uniform state, and it is possible to process a large number of substrates while maintaining the space between the substrates at a necessary minimum value.

The processing section may have a processing bath for receiving the substrate, and a moving mechanism for transporting the substrate into and from the processing bath. In this case, the moving mechanism is preferably formed so as to be capable of transporting the substrate into and from a plurality of processing baths. With this construction, the processing section can be smaller than that having the structure that the transport means is provided in the processing bath. In addition, since the moving mechanism can transport the substrate into and from the plurality of processing baths, it is possible to prevent a processing solution, such as a chemical, from adhering to the substrate transport means.

The processing section may comprise a processing bath for receiving the substrate, chemical supply means for supplying a chemical into the processing bath, and cleaning solution supply means for supplying a cleaning solution into the processing bath. With this construction, it is possible to sequentially carry out the chemical processing and cleaning of the substrate, and it is possible to prevent particles from being adhered to the substrate when transporting the substrate and to decrease the size of the system.

The processing section may have cleaning means for cleaning at least a substrate holding section of the substrate transport means. With this construction, it is possible to clean the substrate holding section of the substrate transport means, and it is possible to prevent the substrate from being contaminated in the atmosphere of the processing section before and after processing The processing section may have cleaning/drying means for cleaning and drying the substrate. With this construction, since the substrate can be dried immediately after cleaning, it is possible to prevent particles from being adhered to the substrate and to prevent water marks from being produced.

The supply section may have a container inlet and a substrate outlet, and the discharge section may have a container outlet and a substrate inlet. With this construction, the container and substrate can be smoothly transported, and the throughput can be improved.

The substrate unloading means and the substrate loading means may be capable of transporting a plurality of substrates. With this construction, a plurality of substrates can be simultaneously unloaded from and loaded into the container, and the throughput can be improved.

The supply section and the discharge section may be provided in parallel, and the processing section may face the supply and discharge sections. With this construction, the container and substrate can be transported on one side of the system, so that the clean room can be effectively utilized and the size of the whole system can be decreased.

The substrate transporting and processing system may further comprise first transport means for delivering the substrate from the attitude changing means to the processing section, and second substrate transport means for delivering the substrate from the processing section to the attitude changing means. With this construction, it is possible to transport the unprocessed substrate and the processed substrate using separate transporting and processing systems, and it is possible to prevent particles and so forth from being adhered again to the processed substrate.

The substrate transport means may be formed so as to be movable to a position facing the attitude changing means, and the substrate transporting and processing system may further comprise substrate delivery means, provided between the substrate transport means and the attitude changing means, for delivering the substrate therebetween. With this construction, since the substrate transport means can have only horizontal and vertical linear mechanism without the need of any rotational mechanisms, the size of the system can be decreased and the system can be simplified, and the throughput can be improved.

According to a fourth aspect of the present invention, there is provided a cleaning system for cleaning an object to be processed, which comprises: an interface section, into and from of which an object to be processed is transported; a cleaning section for cleaning the object; a first shutter for opening and closing a transport gate for transporting the object into and from the interface section; a second shutter for opening and closing a transport passage for transporting the object between the interface section and the cleaning section.

According to this cleaning system, the first and second shutters are open only when the object to be processed is transported, and these shutters are closed when the object is not transported, so that it is possible to prevent airflow from entering the cleaning system from the clean room. For example, the second shutter is closed when the first shutter is open and the first shutter is closed when the second shutter is open, so that the clean room can not be directly communicated with the cleaning system to prevent the production of airflow. Preferably, the driving part of the first shutter is located below a transport gate for transporting the object into and from the interface section, and the driving part of the second shutter is located below a transport passage for transporting the object between the interface section and the cleaning section, so that it is possible to prevent, when particles and contamination are generated from the first and the second driving part, particles and contamination from attaching to the object to be processed. Preferably, when the first shutter is moved downwards, the transport gate for transporting the object into and from the interface section is open, and when the second shutter is moved downwards, the transport passage for transporting the object between the interface section and the cleaning section is open, so that it is possible to prevent, when particles and contamination are generated from the first and the second shutter, particles and contamination from attaching to the object to be processed and it is possible to prevent the first and the second shutter from falling down to the object to be processed when some accident had been happened.

If the first and second shutters, which can be open and closed, are provided, it is possible to remove a bad influence of air entering the interior of the system from external environment when the object is cleaned, and it is possible to decrease the cleaning time, so that it is possible to improve the reliability and operation efficiency of the whole system. Therefore, according to the present invention, it is possible to smoothly clean the object, e.g., it is possible to improve the production efficiency in the production of semiconductor devices.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 12 is a side view of the space adjusting means;

FIG. 13 is a perspective view of a principal part of the space adjusting means;

FIG. 21 is a vertical sectional view of the connecting portion of the supporting rod to the holding member;

FIG. 22(a) is an enlarged sectional view of a holding grove of a side holding member for the wafer boat;

FIG. 22(b) is an enlarged sectional view of an inclination preventing groove of a lower holding member;

FIG. 33 is a schematic perspective view of a container transport robot in the fifth preferred embodiment;

FIG. 40 is a schematic sectional view taken along line C—C of FIG. 39;

FIG. 41 is a schematic sectional view taken along line D—D of FIG. 39;

DESCRIPTION OF THE PREFERRED EMBODIMENTS

Referring now to the accompanying drawings, the preferred embodiments of a substrate transporting and processing system, according to the present invention, will be described below. In particular, the preferred embodiments of a substrate transporting and processing system, which is applied to a cleaning system for semiconductor wafers, according to the present invention, will be described.

[First Preferred Embodiment]

Figure 1:
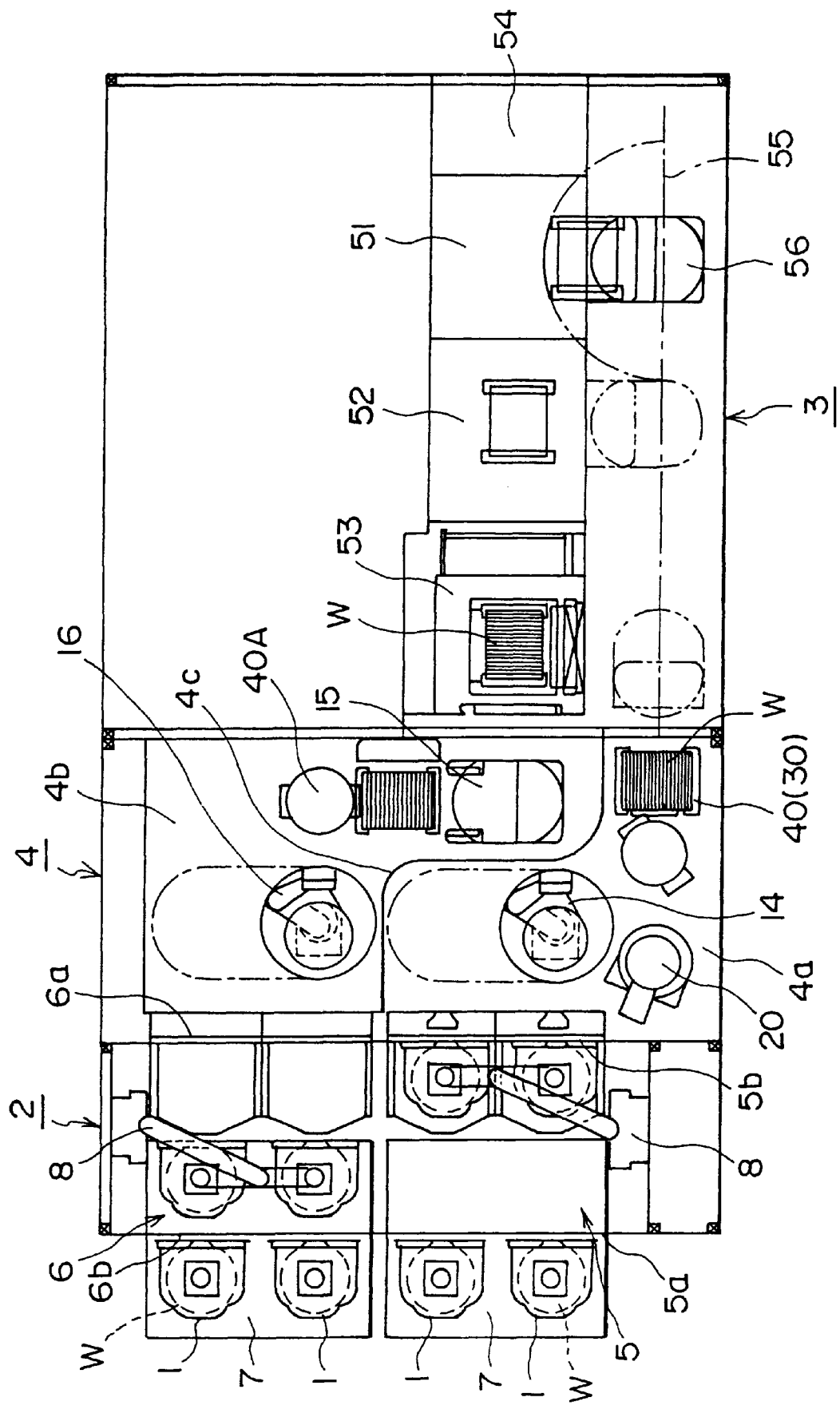
FIG. 1 is a schematic plan view of the first preferred embodiment of a cleaning system, to which a substrate transporting and processing system is applied, according to the present invention.
Figure 2:
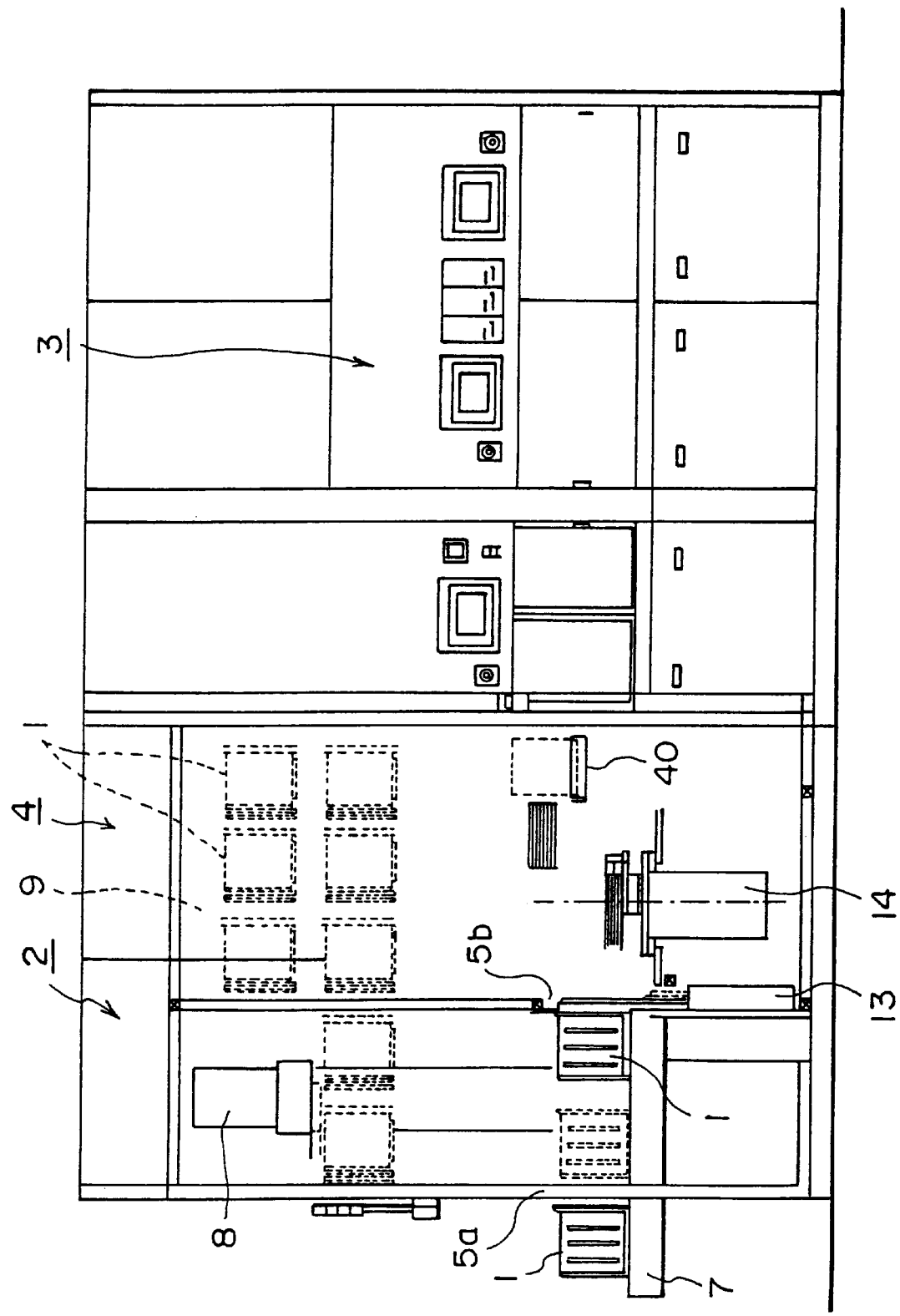
FIG. 2 is a schematic side view of the cleaning system.
Figure 3:
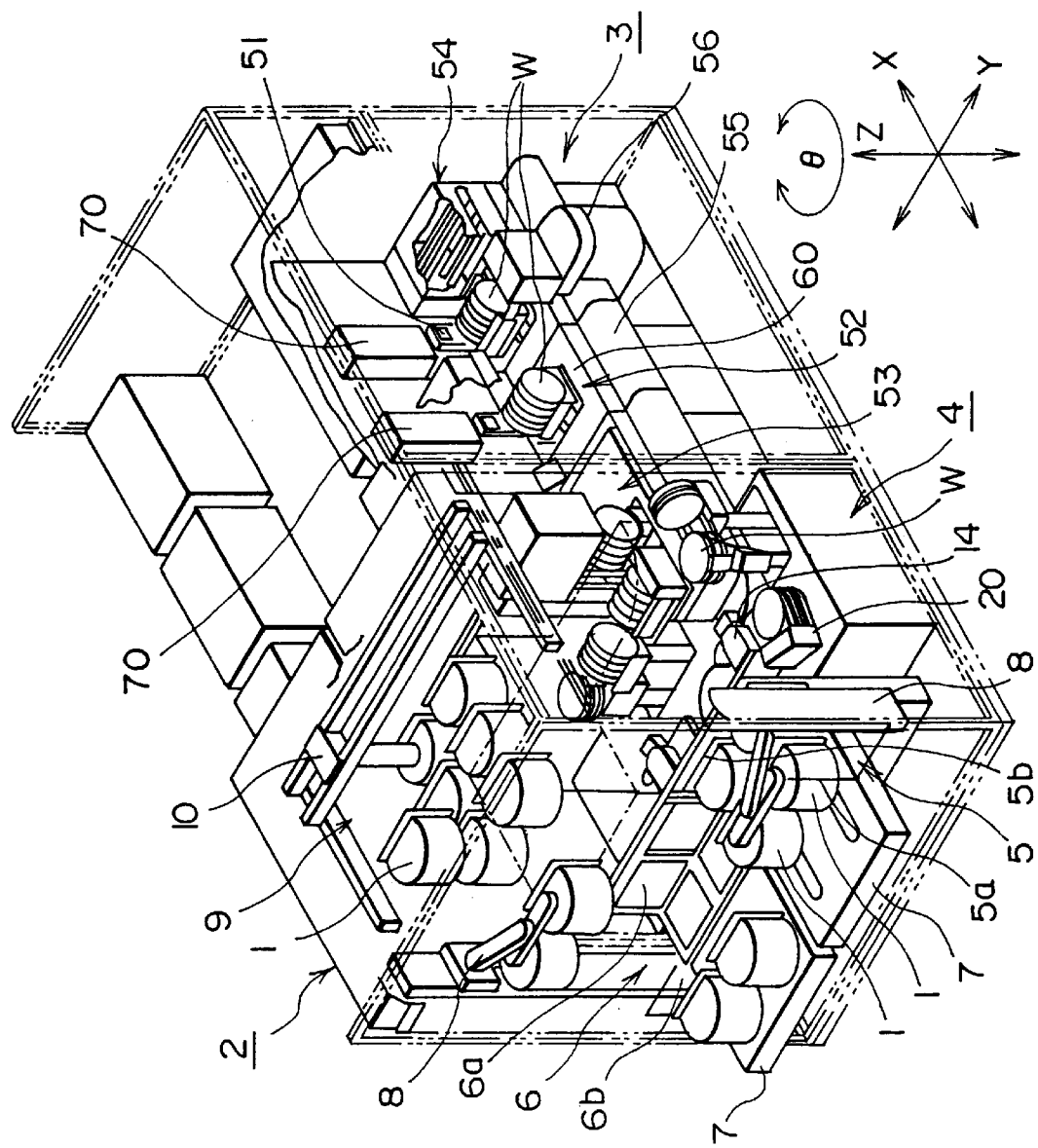
FIG. 3 is a schematic perspective view of the cleaning system.

FIG. 1 is a schematic plan view of the first preferred embodiment of a cleaning system, to which a substrate transporting and processing system is applied, according to the present invention. FIG. 2 is a schematic side view of the cleaning system, and FIG. 3 is a schematic perspective view thereof.

The cleaning system generally comprises a transport section 2 for transporting containers, e.g., carriers 1, each of which horizontally houses therein semiconductor wafers W serving as substrates to be processed (each of which will be hereinafter referred to as a "water"); a processing section 3 for wet-cleaning the wafers W using a chemical and a cleaning solution and for drying the wafers W; and an interface section 4, located between the transport section 2 and the processing section 3, for delivering the wafers W and for adjusting the position of the wafers and changing the attitude of the wafers.

Figure 4:
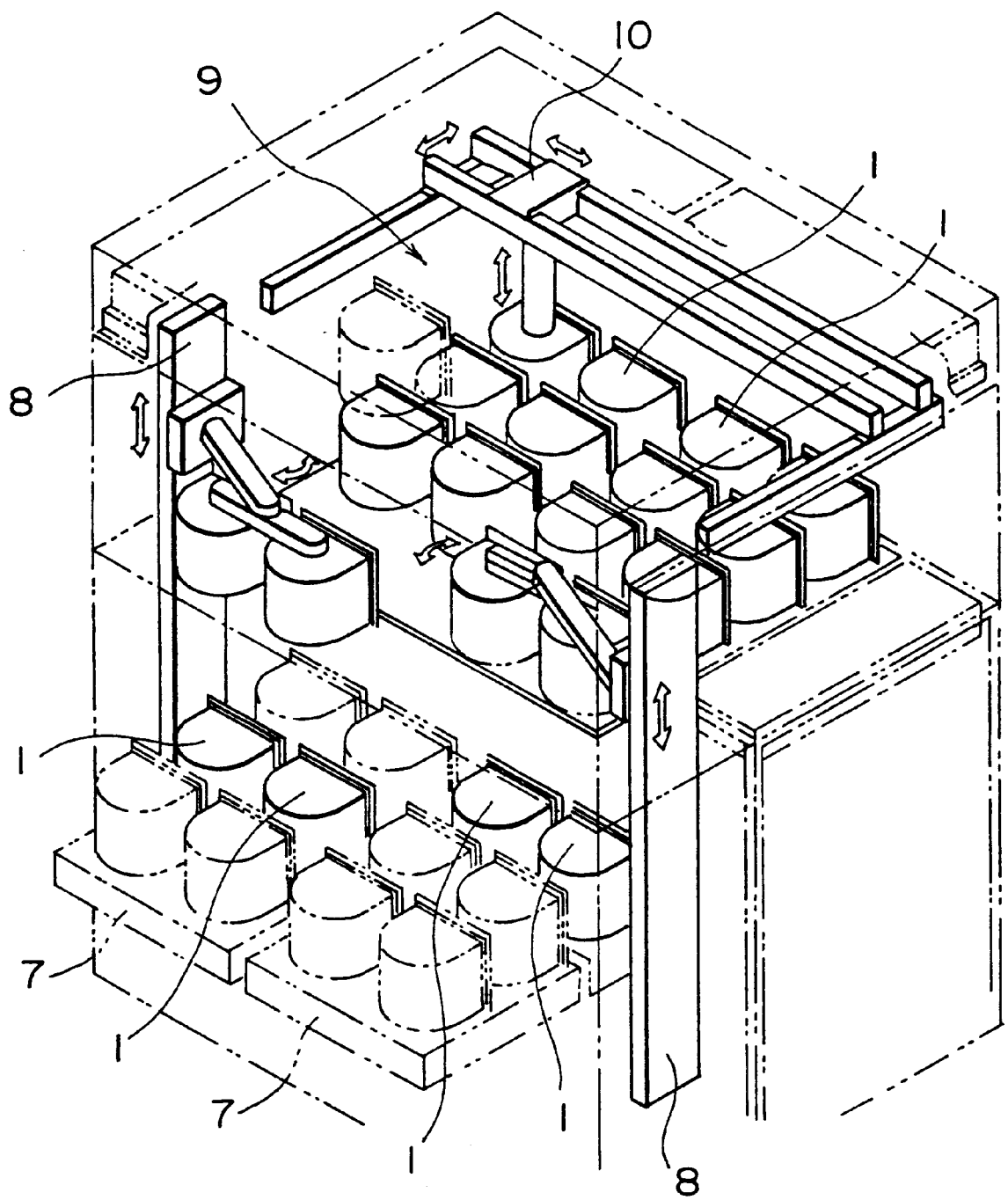
FIG. 4 is a perspective view of a container transport means and a container waiting section according to the present invention.

The transport section 2 comprises a supply section 5 and a discharge section 6, which are provided on one end of the cleaning system in parallel. The supply section 5 has an inlet 5a for the carriers 1, and the discharge section 6 has an outlet 6a for the carriers 1. Slide type mounting tables 7 capable of taking the carriers 1 in and out of the supply section 5 and the discharge section 6, respectively, are provided. The supply section 5 and the discharge section 6 are provided with carrier lifters 8 (container transport means), respectively. The carrier lifters 8 are capable of transporting the carriers 1 between the supply sections or the discharge sections, between the supply section 5 and an unloading position of a wafer unloading arm, which will be described later, or between the discharge section 6 and a loading position of a wafer loading arm. The carrier lifter 8 are also capable of delivering an empty carrier 1 to a carrier waiting section 9 provided above the transport section 2, and of receiving the carrier 1 from the carrier waiting section 9 (see FIGS. 2 and 3). In this case, the carrier waiting section 9 is provided with a carrier transport robot (a container moving means), which is movable in horizontal directions (X and Y directions) and in vertical directions (Z directions). The carrier transport robot 10 aligns empty carriers 1 transported from the supply section 5, and transports the carriers 1 to the discharge section 6 (see FIG. 4). In the carrier waiting section 9, the empty carriers 1 as well as carriers loaded with the wafers W may wait.

Figure 5:
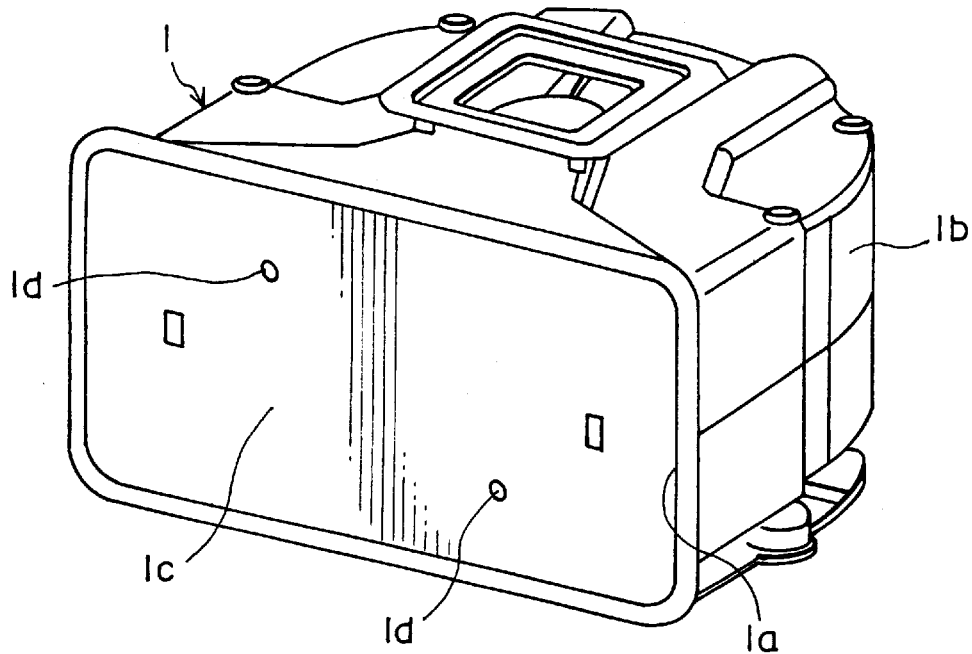
FIG. 5 is a perspective view of an example of a container according to the present invention.
Figure 6:
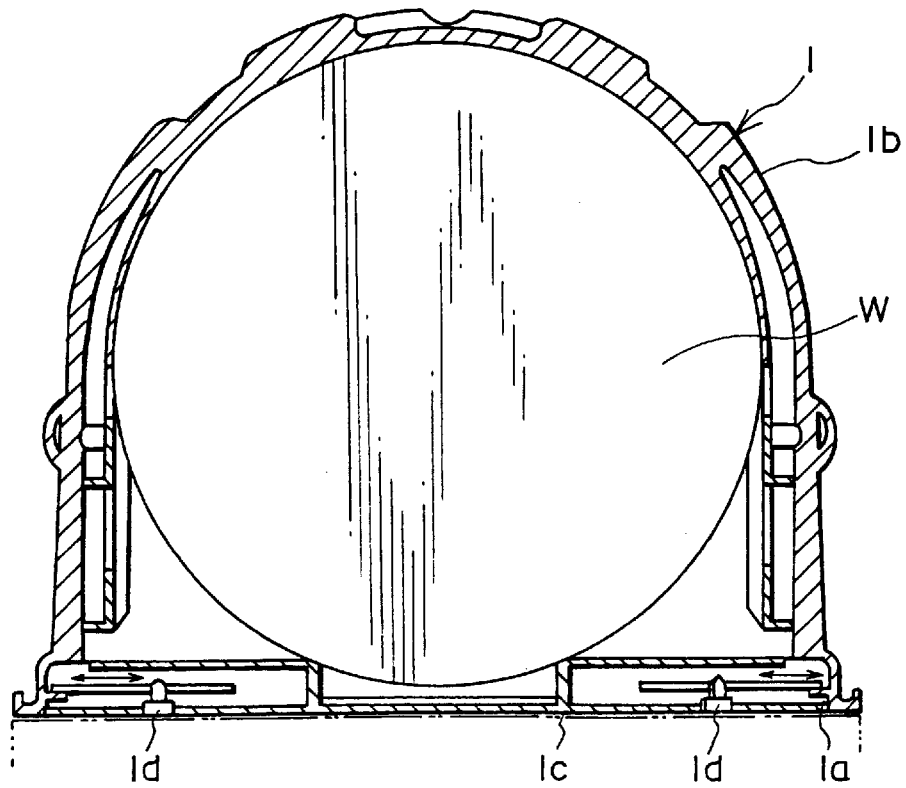
FIG. 6 is a cross-sectional view of the container.

As shown in FIGS. 5 and 6, the carrier 1 comprises: a container body 1b, which has an opening 1a on one side thereof and which has holding grooves (not shown) for horizontally holding a plurality of wafers W, e.g., 25 wafers W, at regular intervals in the inner wall thereof; and a lid 1c for opening and closing the opening 1a of the container body 1b, so that the lid 1c is open and closed by operating an engageable mechanism 1d incorporated in the lid 1c by means of a lid opening/closing unit, which will be described later.

Figure 7:
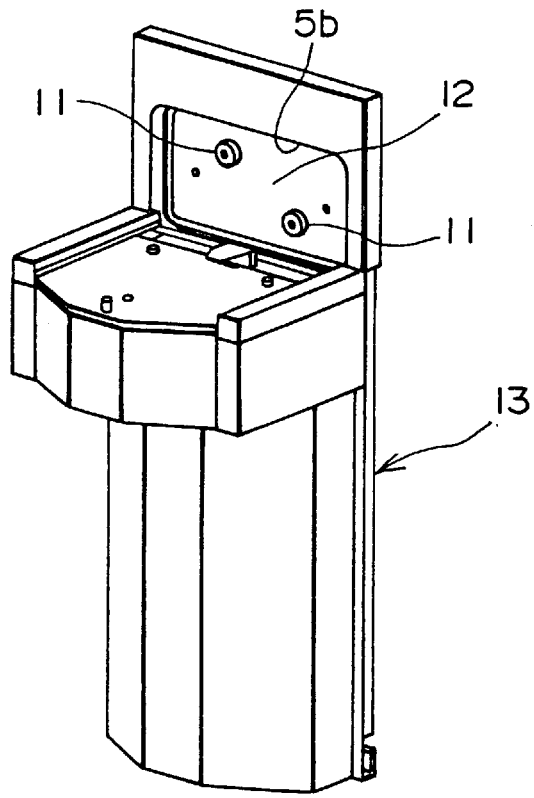
FIG. 7 is a perspective view of a substrate discharge section according to the present invention.
Figure 8:
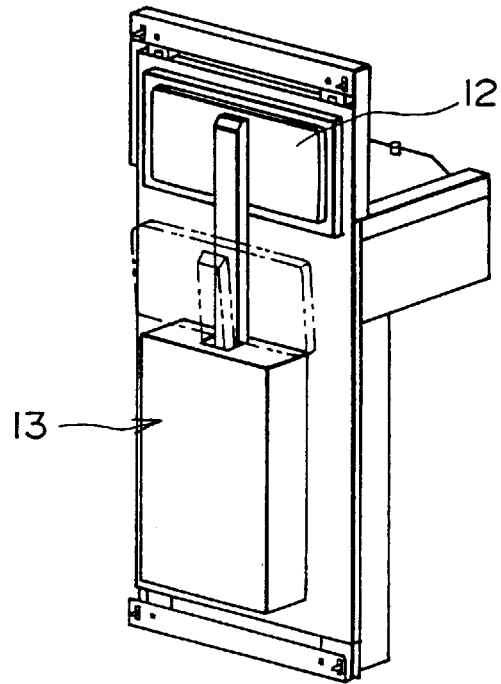
FIG. 8 is a perspective view illustrating the state that a lid of the container is removed from the substrate discharge section.

As shown in FIGS. 7 and 8, each of the wafer outlet 5b of the supply section 5 and the wafer inlet 6a of the discharge section 6 is provided with a lid opening/closing unit 13, which has an engaging pin 11 engaging the engageable mechanism 1d of the lid 1c of the carrier 1 and a lid holding plate 12 and which is capable of vertically moving and oscillating, so that the lid 1c of the carrier 1 is open and closed by means of the lid opening/closing unit 13. Therefore, the lid 1c of the carrier 1, which houses therein the unprocessed wafers W transported to the supply section 5, can be removed by means of the lid opening/closing unit 13 to allow the wafers W to be transported from the carrier 1, and the lid 1c can be closed again by means of the lid opening/closing unit 13 after all the wafers W are transported from the carrier 1. In addition, the lid 1c of the empty carrier 1 transported from the carrier waiting section 9 to the discharge section 6 can be removed by means of the lid opening/closing unit 13 to allow the wafers W to be transported into the carrier 1, and the lid 1c can be closed again by means of the lid opening/closing unit 13 after all the wafers W are transported into the carrier 1.

The interface section 4 is divided by a partition wall 4c into a first chamber 4a adjacent to the supply section 5 and a second chamber 4b adjacent to the discharge section 6. The first chamber 4a houses therein: a wafer unloading arm 14 (a substrate unloading means), which is capable of taking a plurality of wafers W out of the carrier 1 in the supply section 5 to transport the wafers W and which is movable in horizontal directions (X and Y directions) and in vertical directions (Z directions) and rotatable (θ); a notch aligner 20 (a position detection means) for detecting a notch Wa formed in each of the wafers W; a space adjusting mechanism 30 for adjusting a space between the adjacent wafers W taken out by means of the wafer unloading arm 14; and a first attitude changing unit 40 (an attitude changing means) for changing the attitude of the wafers W from a horizontal state into those in a vertical state.

The second chamber 4b houses therein: a wafer delivery arm 15 (a substrate transport means) for receiving a plurality of processed wafers W in the vertical state from the processing section 3 to transport the wafers W; a second attitude changing unit 40A (an attitude changing means) for changing the attitude of the wafers W received from the wafer delivery arm 15 from the vertical state to the horizontal state; and a wafer loading arm 16 (a substrate loading means), which is capable of receiving the plurality of wafers W attitude-changed into the horizontal state by means of the second attitude changing unit 40A to load the wafers W into the empty carrier 1 transported to the discharge section 6 and which is movable in horizontal directions (X and Y directions) and in vertical directions (Z directions) and rotatable (in θ directions). Furthermore, the second chamber 4b is sealed, and the interior thereof is replaced with an inert gas, e.g., $N_2$ gas supplied from a nitrogen ($N_2$) gas source (not shown).

Figure 9:
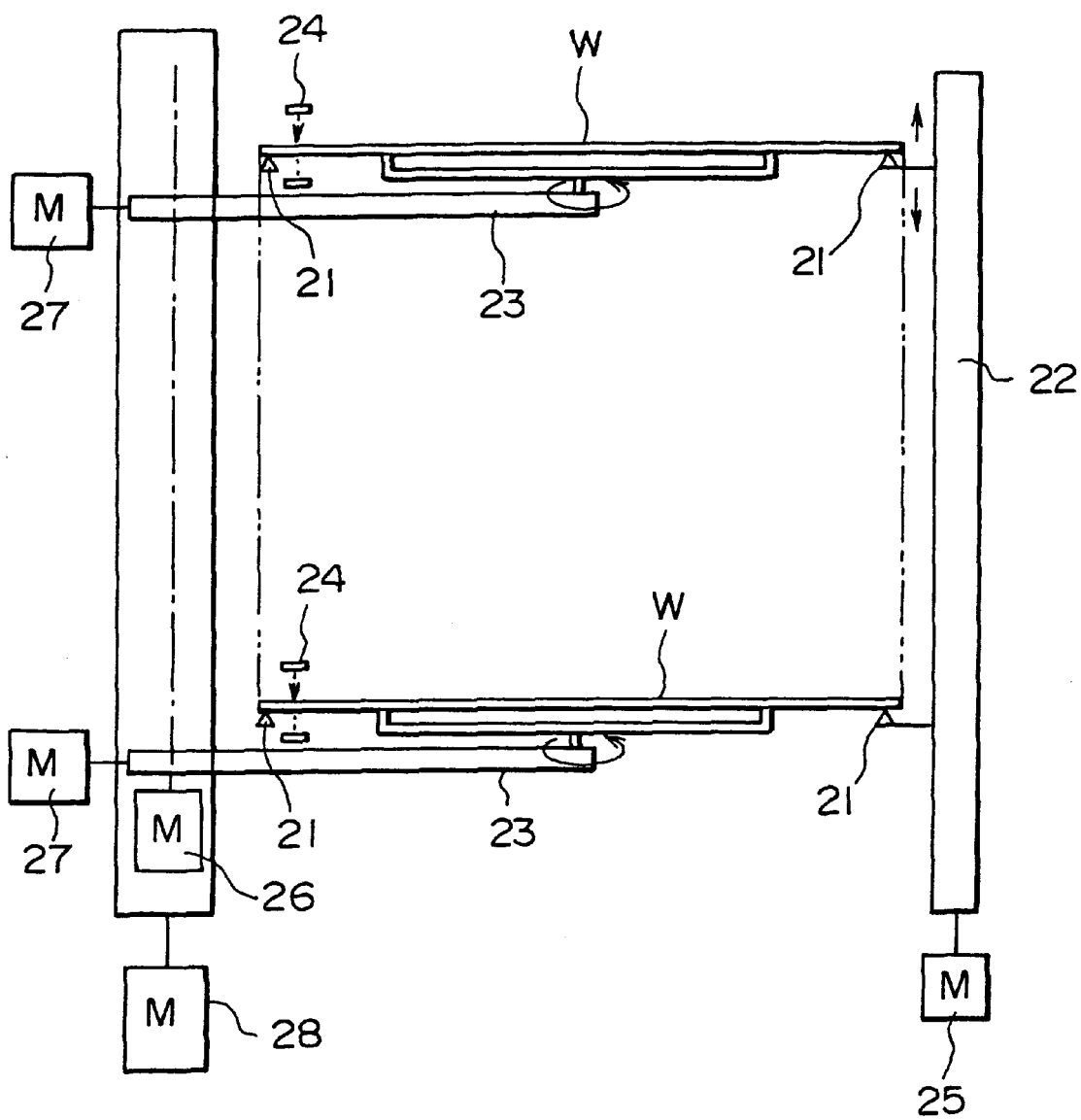
FIG. 9 is a schematic sectional view of a positioning means according to the present invention.
Figure 10:
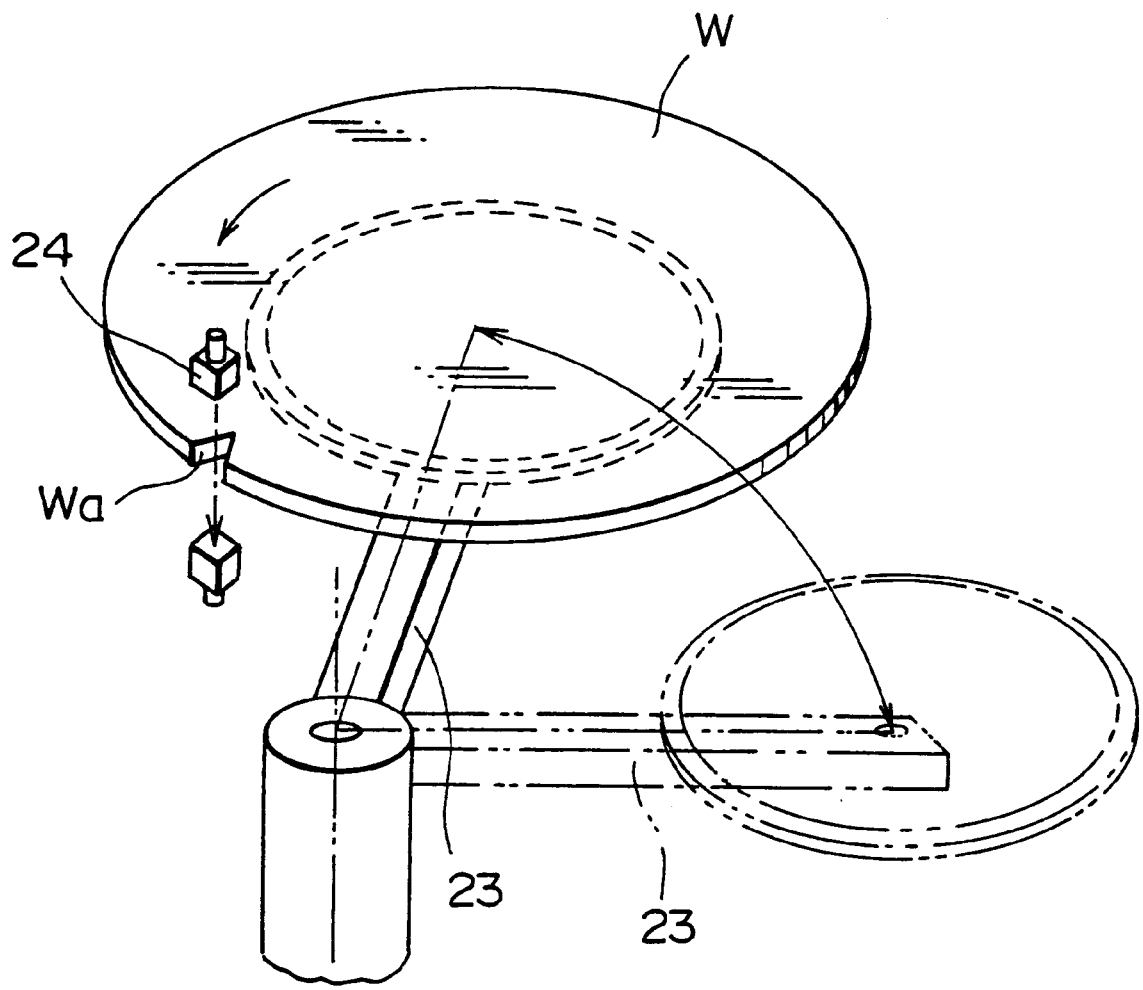
FIG. 10 is a perspective view of a principal part of the positioning means.

As shown in FIGS. 9 and 10, the notch aligner 20 generally comprises: a plurality of supporting plates 21 for supporting thereon the periphery of the lower surface of each of the wafers W transported by means of the wafer unloading arm 14; a space changing mechanism 22 for changing the space between the adjacent supporting plates 21; a rotatable notch arm 23, which is movable to a position below the wafers W supported on the supporting plates 21 for mounting the wafers W thereon; and photo sensors 24, provided so as to face the upper and lower surfaces of the edges of each of the wafers W, for detecting a notch Wa formed in each of the wafers W. Furthermore, the vertical movement of the space changing mechanism 22, the movements of the notch arm 23 approaching and leaving the lower surface of the wafer W, and the vertical movement and rotation of the notch arm 23 may be carried out, e.g., by means of motors 25 through 28 via a ball screw mechanism (not shown), a transmission mechanism (not shown) and so forth.

In order to adjust the space between the adjacent wafers W by means of the notch aligner 20 constructed as described above, the notch arm 23 is inserted into a space below the wafers W while increasing the space between the adjacent wafers W transported by means of the wafer unloading arm 14 to be mounted on the supporting plate 21 and then, the notch arm 23 is moved upwards and rotated while the wafers W are supported thereon, so that the notch Wa is detected by means of the photo sensor 24. Thus, the position of the notch Wa of each of the wafers W is detected, so that the positioning is carried out by the position detection of the notch Wa. After the positioning is carried out, the notch arm 23 moves downwards, and then, the notch arm 23 leaves the lower surface of the wafers W. Thereafter, the space between the adjacent wafers W is decreased by means of the space changing mechanism 22 to the space in the transport state, and then, the wafers W are received by the wafer unloading arm 14 again to be transported to the attitude changing unit 40. Therefore, the plurality of wafers W can be transported to the attitude changing unit 40 while the notches Wa of the wafers W are positioned so as to be aligned with each other.

Figure 11:
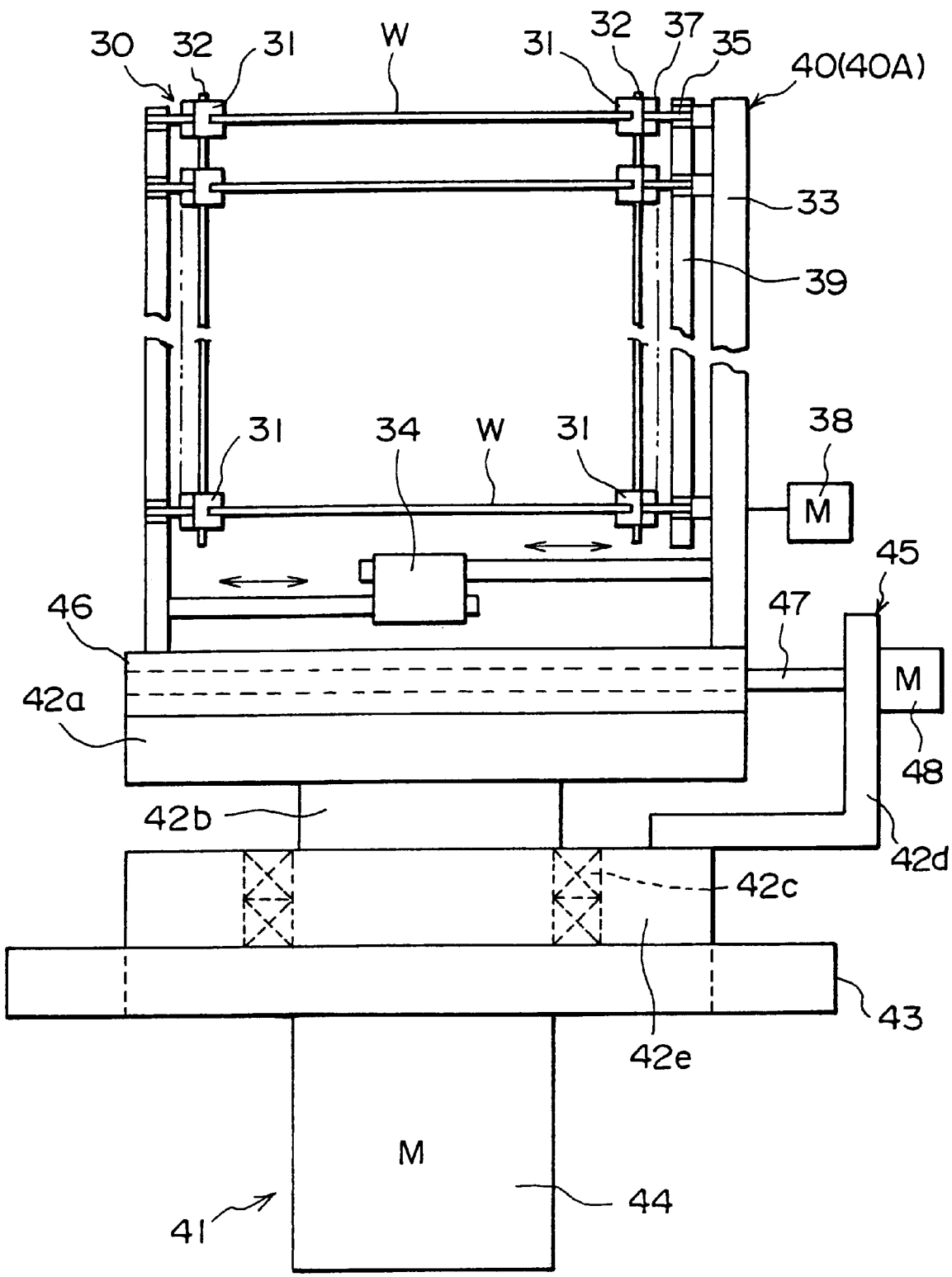
FIG. 11 is a side view of a space adjusting means and an attitude changing means according to the present invention.

As shown in FIGS. 11 through 13, each of the first and second attitude changing units 40 and 40A (only the first attitude changing unit is shown) comprises a space adjusting mechanism 30 for adjusting the space between the adjacent wafers W, a horizontal adjustment mechanism 41 for adjusting the horizontal direction of the wafers W, and an attitude changing mechanism 45 for changing the attitude of the wafers W from the horizontal state to the vertical state.

In this case, the space adjusting mechanism 30 comprises: sets of holding members 31, each set of the holding members 31 facing each other so as to be able to approach and leave each other to hold the corresponding wafer W; guide bars 32 for slidably supporting the holding members 31; a ball screw mechanism 34 for causing the holding members 31 and the guide bars 32 to approach and leave each other via an arm 33; a guide member 37 having a guiding long hole 36 for slidably receiving a pin 35 projecting from the holding member 31; and a link 39 for rotatably supporting the pin 35 to rotate the pin in vertical directions by means of a space adjusting motor 38. With this construction of the space adjusting mechanism 30, when the space adjusting motor 38 is driven to rotate the link 39 counterclockwise, e.g., from the state shown by the solid line of FIG. 12, the holding members 31 approach each other as shown by the two-dot chain line, so that the space between the adjacent wafers W can be changed from P to p (P>p) to optimize the space between the adjacent wafers W in the subsequent processing steps.

The attitude changing mechanism 45 comprises: a rotating shaft 47 mounted on ends of a supporting base 46, on which the space adjusting mechanism 30 is mounted; and an attitude changing motor 48 rotating about the rotating shaft 47. When the attitude changing motor 48 is driven to rotate the rotating shaft 47 by 90 degrees, the attitude of the wafers W can be changed from the horizontal state to the vertical state. In the second attitude changing unit 40A, the attitude of the wafers W can be changed from the vertical state to the horizontal state by inversely rotating the rotating shaft 47.

The horizontal adjustment mechanism 41 is provided for changing the state of the wafers W to an appropriate vertical state. The horizontal adjustment mechanism 41 comprises: a mounting shaft 42b having a mounting part 42a for rotatably mounting the supporting base 46, on which the space adjusting mechanism 30 is mounted; a rotating table 42e, which is rotatably mounted on the mounting shaft 42b via a bearing 42c and on which the attitude changing motor 48 is mounted via a bracket 42d; and a horizontal adjustment motor 44, which is mounted on the bottom of a fixing base 43 for rotatably supporting the rotating table 42e and which rotates the rotating table 42e in horizontal directions. With this construction of the horizontal adjustment mechanism 41, the wafers W positioned by the notch aligner 20 to be delivered from the wafer unloading arm 14 to the attitude changing unit 40 can be rotated in horizontal directions by driving the horizontal adjustment motor 44, so that the horizontal adjustment can be carried out in preparation for the subsequent vertical change.

On the other hand, the processing section 3 includes: a first processing unit 51 for removing particles and organic contamination, which are adhered to the wafers W; a second processing unit 52 for removing metal contamination adhered to the wafers W; a cleaning/drying unit 53 for removing chemical oxide films adhered to the wafers W and for drying the wafers W; and a chuck cleaning unit 54, the units 51 through 54 being aligned with each other. A wafer transport arm 56 (a transport means), which is movable in X and Y directions (horizontal directions) and in Z directions (vertical directions) and rotatable (θ), is provided on a transport channel 55 facing the respective units 51 through 54.

Figure 14:
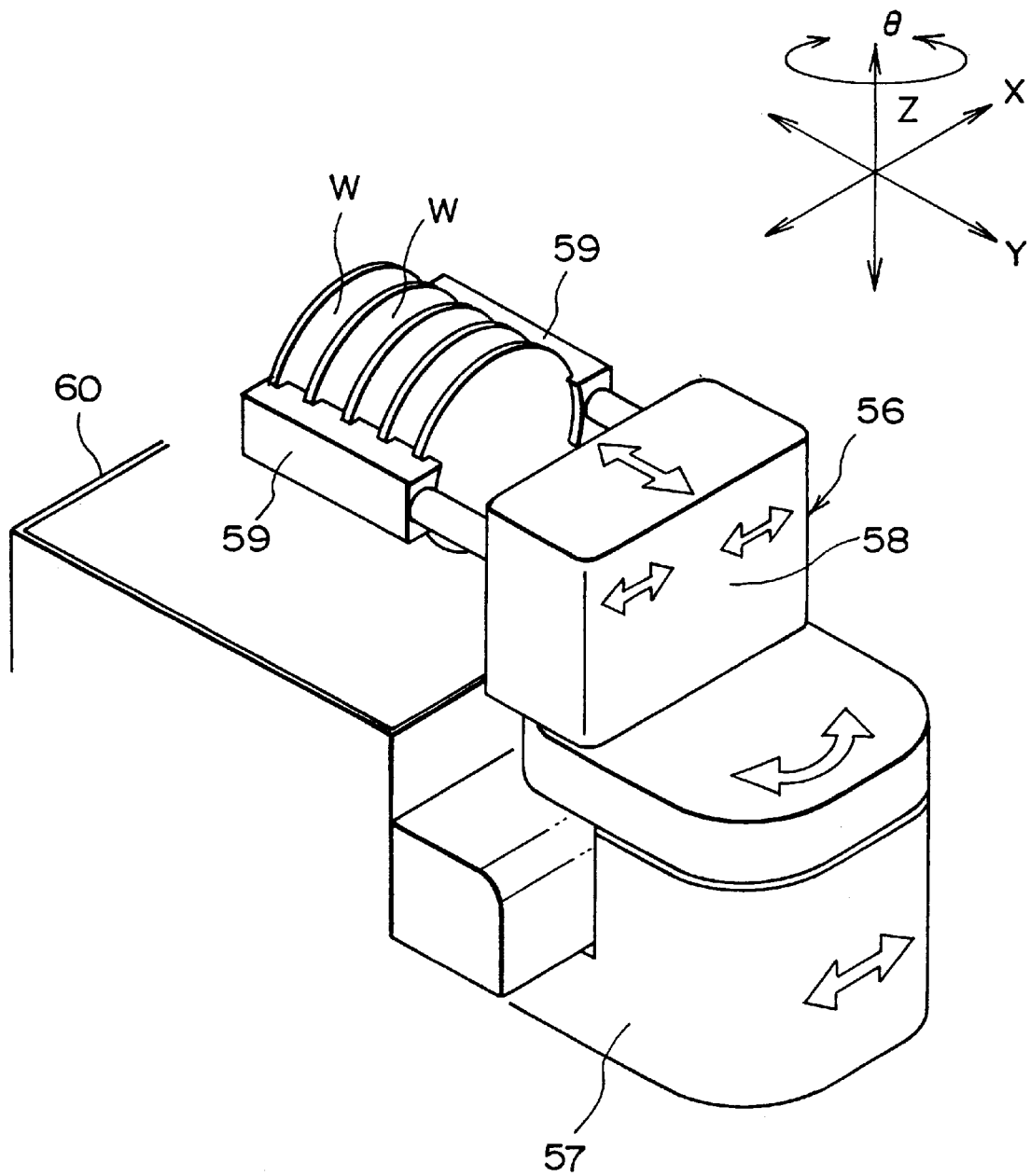
FIG. 14 is a perspective view of a principal part of a substrate transport means according to the present invention.

As shown in FIG. 14, the wafer transport arm 56 comprises: a moving table 57, which is vertically movable along a guide rail (not shown) provided on the transport channel 55; a driving table 58 mounted on the moving table so as to be rotatable and movable in horizontal directions; and a pair of wafer holding chucks 59, which project from the moving table 57 and which are capable of approaching and leaving each other.

Figure 15:
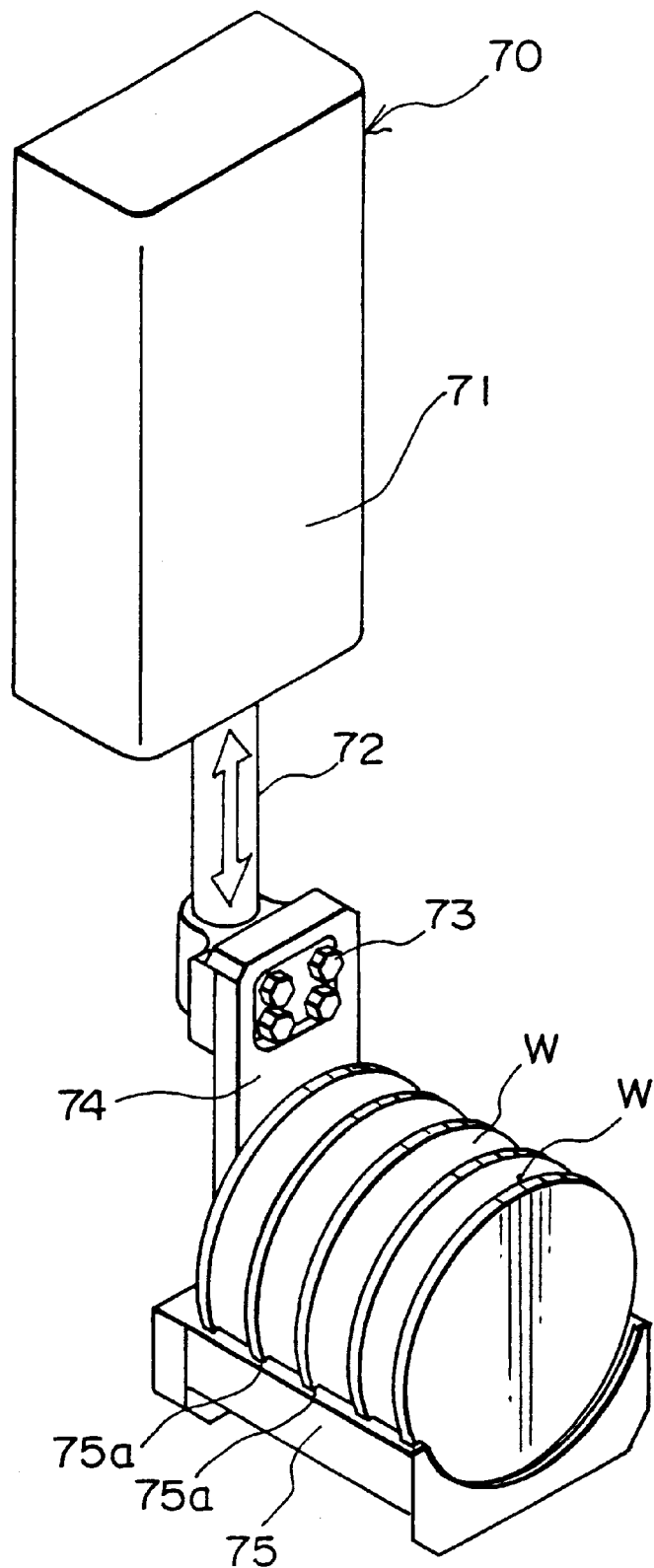
FIG. 15 is a perspective view of a substrate moving means according to the present invention.
Figure 16:
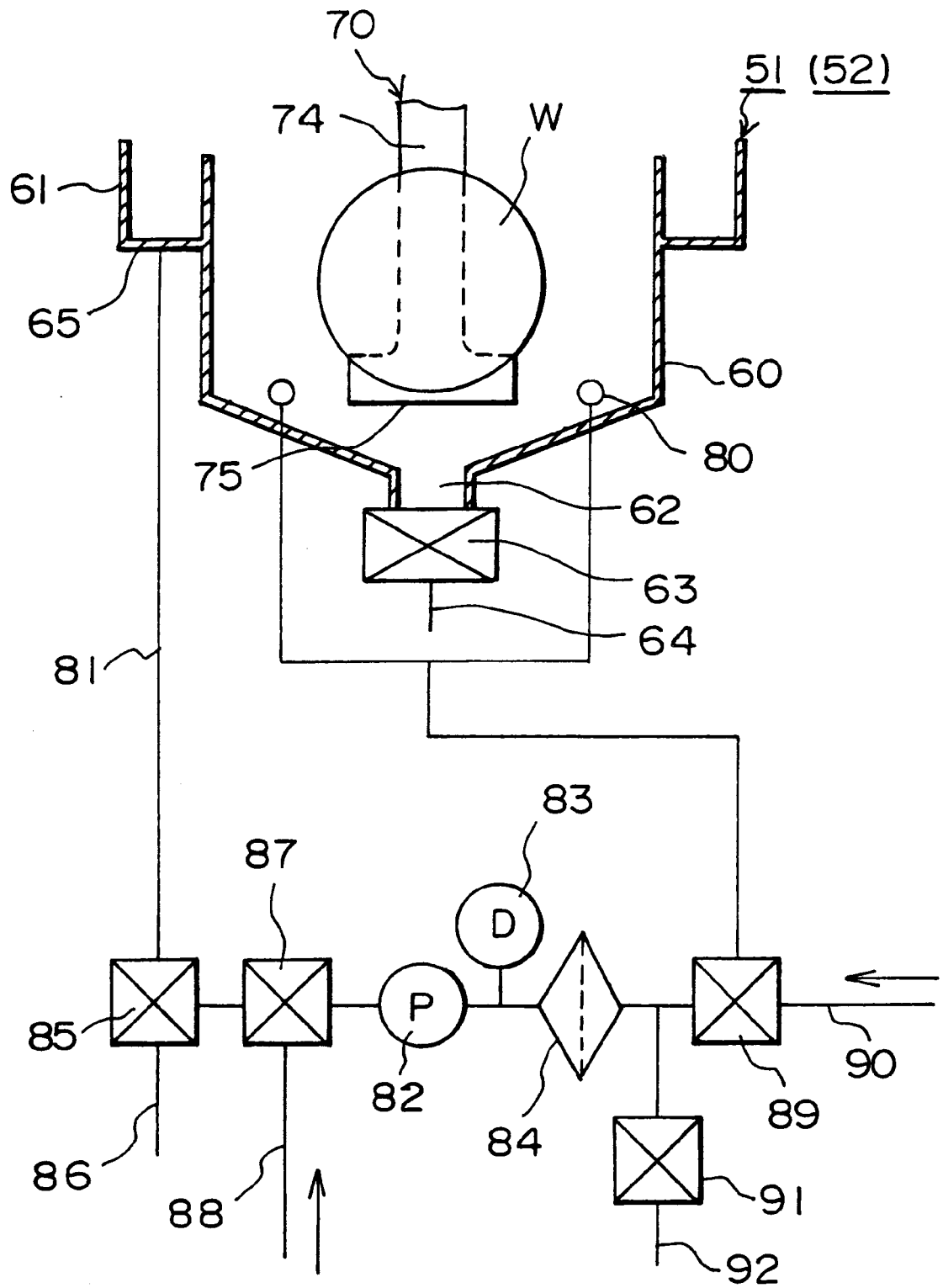
FIG. 16 is a sectional view of an example of a processing unit according to the present invention.
Figure 17:
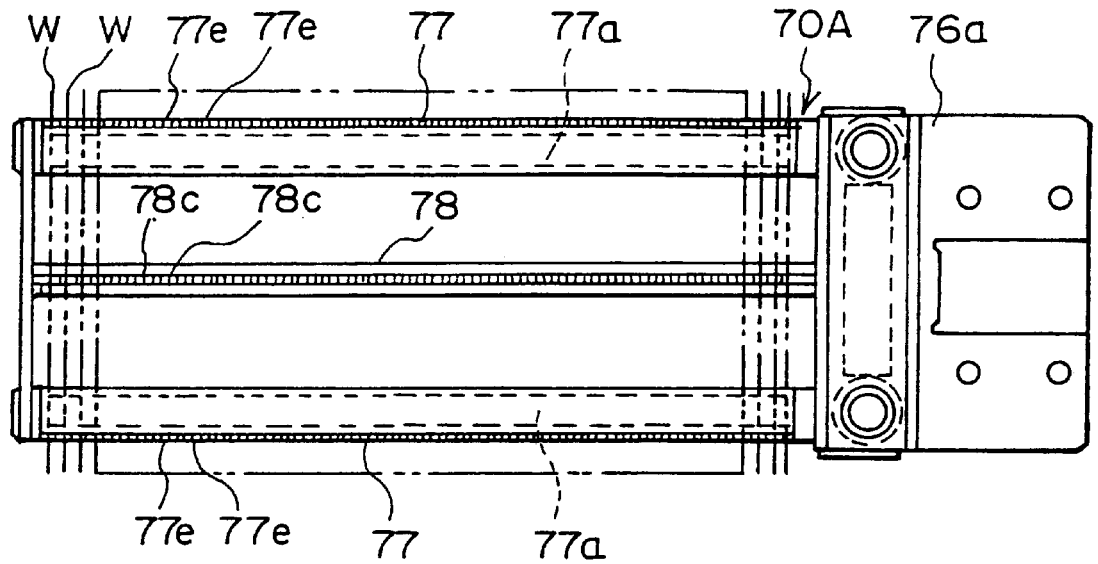
FIG. 17 is a plan view of another preferred embodiment of a wafer boat according to the present invention.
Figure 18:
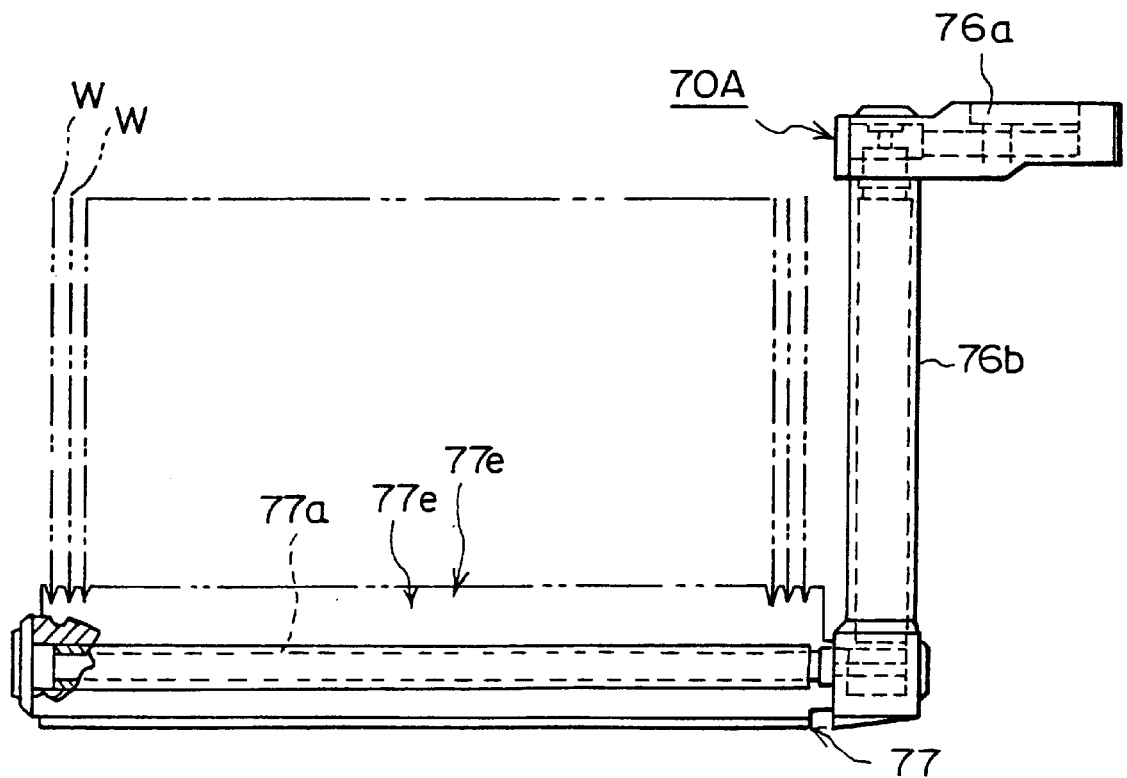
FIG. 18 is a side view of the wafer boat.

As shown in FIGS. 15 and 16, the first and second processing units 51 and 52 comprises: a processing bath 60 for receiving the wafers W therein; an outer bath 61, connected to the upper end opening of the processing bath 60, for receiving therein a chemical, e.g., an APM solution (a mixed solution of ammonia, hydrogen peroxide and pure water) and a HPM solution (a mixed solution of hydrochloric acid, hydrogen peroxide and pure water), and a cleaning solution, e.g., pure water, which overflow the processing bath 60; a moving means, e.g., a wafer boat 70, for holding a plurality of wafers W, e.g., 50 wafers W, at regular intervals in the processing bath 60 and for taking the wafers W in and out of the processing bath 60; and a chemical/pure water supplying means, e.g., a jet nozzle 80, provided on the bottom of the processing bath 60, for supplying a chemical or pure water to the wafers W.

The processing bath 60 and the outer bath 61 are made of a material having a superior corrosion resistance and chemical resistance, e.g., quartz or a polypropylene (P.P). A drain port 62 is formed in the bottom of the processing bath 60 to be connected to a drain pipe 64 via a drain valve 63. A drain port 65 is formed in the bottom of the outer bath 61. A circulating line 81 is connected to the drain port 65 and the jet nozzle 80. The circulating line 81 is provided with a pump 82, a damper 83 and a filter 84. Between the drain port 65 and the pump 82, a drain pipe 86 is provided via a directional control valve 85. Between the directional control valve 85 and the pump 82, a directional control valve 87 is provided. The directional control valve 87 is connected to a chemical supply pipe 88. Between the filter 84 and the jet nozzle 80, a directional control valve 89 is provided. The directional control valve 89 is connected to a pure water supply pipe 90. The pure water supply pipe 90 is connected to a pure water source (not shown), and the chemical supply pipe 88 is connected to a chemical source (not shown). Between the filter 84 and the directional control valve 89, a drain pipe 92 is provided via a drain valve 91.

As described above, if the circulating piping system is provided between the jet nozzle 80 and the drain port 62 of the outer bath 61, it is possible to remove the particles and metal ions, which are adhered to the wafers, while the chemical supplied from the chemical source (not shown) to the processing bath 60 overflows the processing bath 60 to circulate through the circulating line 81 to be supplied from the jet nozzle 80 to the wafers W again. In addition, if pure water supplied from the pure water source is supplied to the jet nozzle 80 by switching the directional control valve after discharging the chemical, it is possible to remove the chemical remaining in the jet nozzle 80. In this case, the pure water overflowing the processing bath 60 is discharged via the drain pipe 86. In this preferred embodiment, the pure water is supplied from the jet nozzle 80 to remove the chemical. However, in this chemical removing process, the pure water may be supplied from additional pure supply section, which is provided, e.g., on the bottom or upper side of the processing bath 60.

Furthermore, a pure water tank (not shown) is provided above the processing bath 60 and the outer bath 61 so that the pure water in the pure water tank is rapidly supplied to the processing bath 60 via the outer bath 61. Thus, the chemical treatment and cleaning of the wafers W housed in the processing bath 60 can be performed, so that it is possible to improve the efficiency of cleaning and to decrease the size of the processing unit.

As shown in FIG. 15, the wafer boat 70 comprises: a reversed T-shaped supporting member 74 fixed to a mounting member 72 by means of a bolt 73, the mounting member 72 being connected to a lift mechanism 71 provided outside of the processing bath 60; and a pair of holding members 75 horizontally supported on the supporting member 71 so as to be vertically movable in the processing bath 60 by means of the lift mechanism 71. In this case, each of the holding members 75 has a plurality of holding grooves 75a, e.g., 50 holding grooves, at regular intervals in longitudinal direction. The supporting member 74 and the holding members 75 are made of a material having superior corrosion resistance, heat resistance and strength resistance, e.g., a polyether etherketone (PEEK) or quartz.

In the above preferred embodiment, while the wafer boat 70 has members 75 horizontally supported on the supporting member 74, another wafer boat, e.g., a wafer boat 70A shown in FIGS. 17 through 22, may be used.

The wafer boat 70A generally comprises: a supporting base member 76a mounted on the mounting member 72 of the lift mechanism 71; a pair of supporting rods 76b provided on the bottom of the supporting base member 76a so as to extend vertically; a pair of side holding members 77 provided on the lower ends of the supporting rods 76b so as to extend horizontally; and a lower holding member 78 extending between the side holding members 77 so as to be in parallel thereto from a linkage member 76c connected between the lower end portions of the supporting rods 76b.

Figure 19:
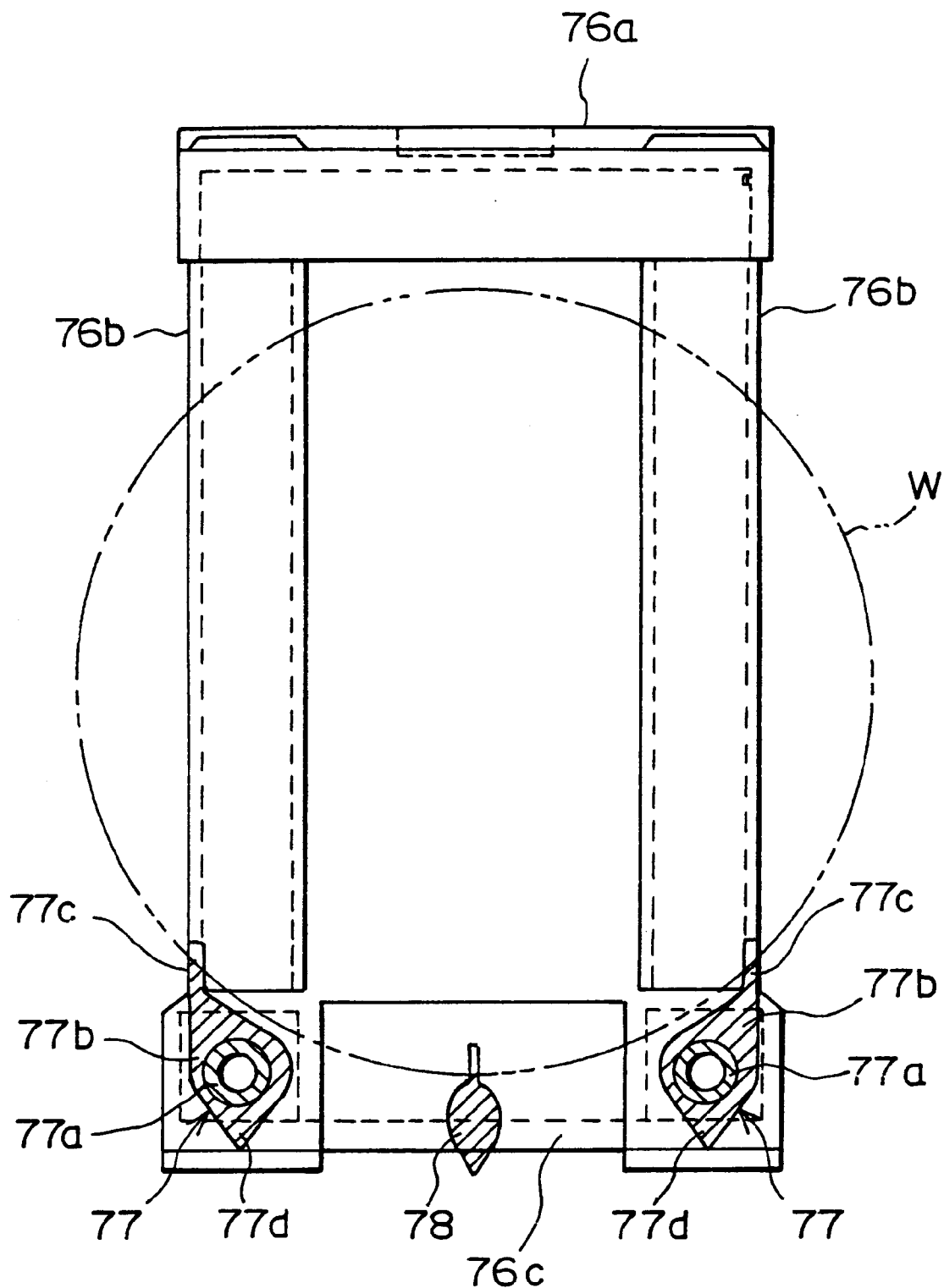
FIG. 19 is a sectional view of the wafer boat.
Figure 20A:
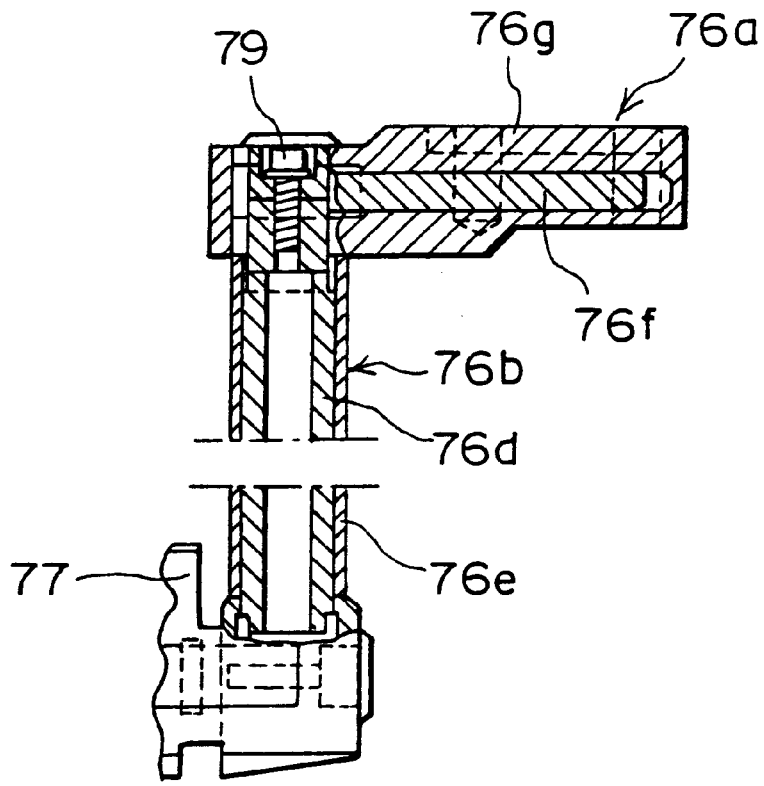
FIG. 20(a) is a sectional view of a connecting portion of a supporting base member to a supporting rod of the wafer boat.
Figure 20B:
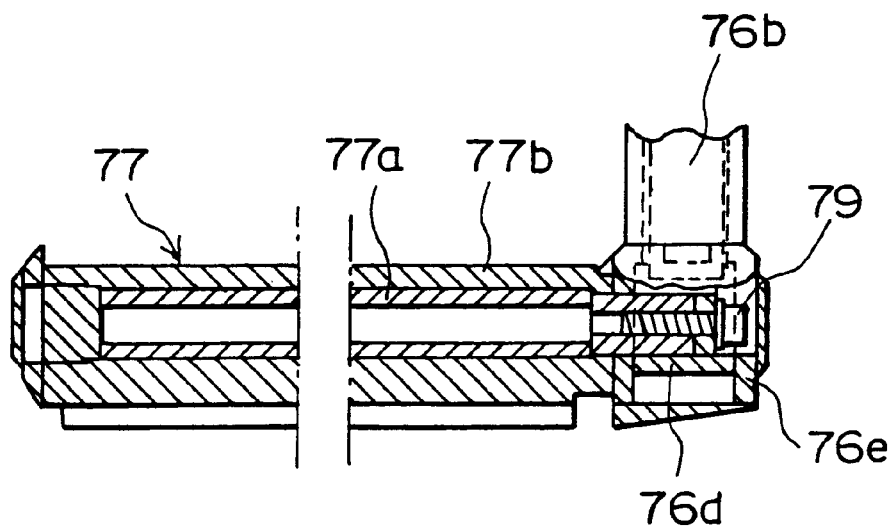
FIG. 20(b) is a sectional view of a connecting portion of the supporting rod to a holding member of the wafer boat.

As shown in FIGS. 19 and 20, each of the side holding members 77 comprises: a rigid core, e.g., a stainless steel pipe 77a; and a coating member 77a for coating the surface of the stainless steel pipe 77a, the coating member being made of a synthetic resin, e.g., a polyether etherketone (PEEK), having a liquid resistance to different kinds of cleaning solution, e.g., chemicals and pure water. The coating member 77b has a wafer holding section 77c projecting upwards from the outer portion thereof, and a liquid draining projection 77d having tapered surfaces extending downwards from the bottom thereof. As shown in FIG. 22(a), the wafer holding section 77c has holding grooves 77e of a substantially V-shaped cross section at regular intervals. The lower holding member 78 is made of a synthetic resin, e.g., a PEEK. As shown in FIG. 22(b), the upper portion of the lower holding member 78 has inclination preventing grooves 78c of a substantially Y-shaped cross section at regular intervals, each of the inclination preventing grooves 78c comprising a wide tapered surface 78a and a narrow tapered surface 78b.

Similar to the side holding members 77, the supporting rod 76b comprises a core, e.g., a stainless pipe 76d, and a PEEK coating member 76e. As shown in FIG. 22(b), the stainless pipe 76d of the supporting rod 76b and the stainless pipe 77a of the side holding member 77 are connected and secured to each other by means of a stainless steel bolt 79, and the coating members 76e and 77b are connected to each other by means of the upset welding (also called vat welding). Similarly, the supporting base member 76a also comprises a stainless steel core 76f, and a PEEK coating member 76g coating the core 76f. The core 76f and the stainless pipe 76d are connected to each other by means of the stainless bolt 79, which passes through the core 76f to engage the stainless pipe 76d of the supporting rod 76b. The coating members 76e and 76g are connected to each other by means of the upset welding (the vat welding) (see FIG. 20(a)).

As described above, the wafer boat 70A comprises the stainless steel cores 77a, 76a, 76f and the PEEK coating members 77b, 76e, 76g, so that the wafer boat 70A can have a suitable rigidity and the volume thereof can be as small as possible.

In the cleaning/drying unit 53, after the chemical oxide film produced on the wafers W by hydrofluoric acid is removed, the wafers W are dried by a dry steam, e.g., isopropyl alcohol (IPA) gas. In the chuck cleaning unit 54, the chuck 59 of the wafer transport arm 56 is supplied with pure water to be cleaned, and supplied with a dry gas, e.g., $N_2$ gas, to be dried.

Figure 23:
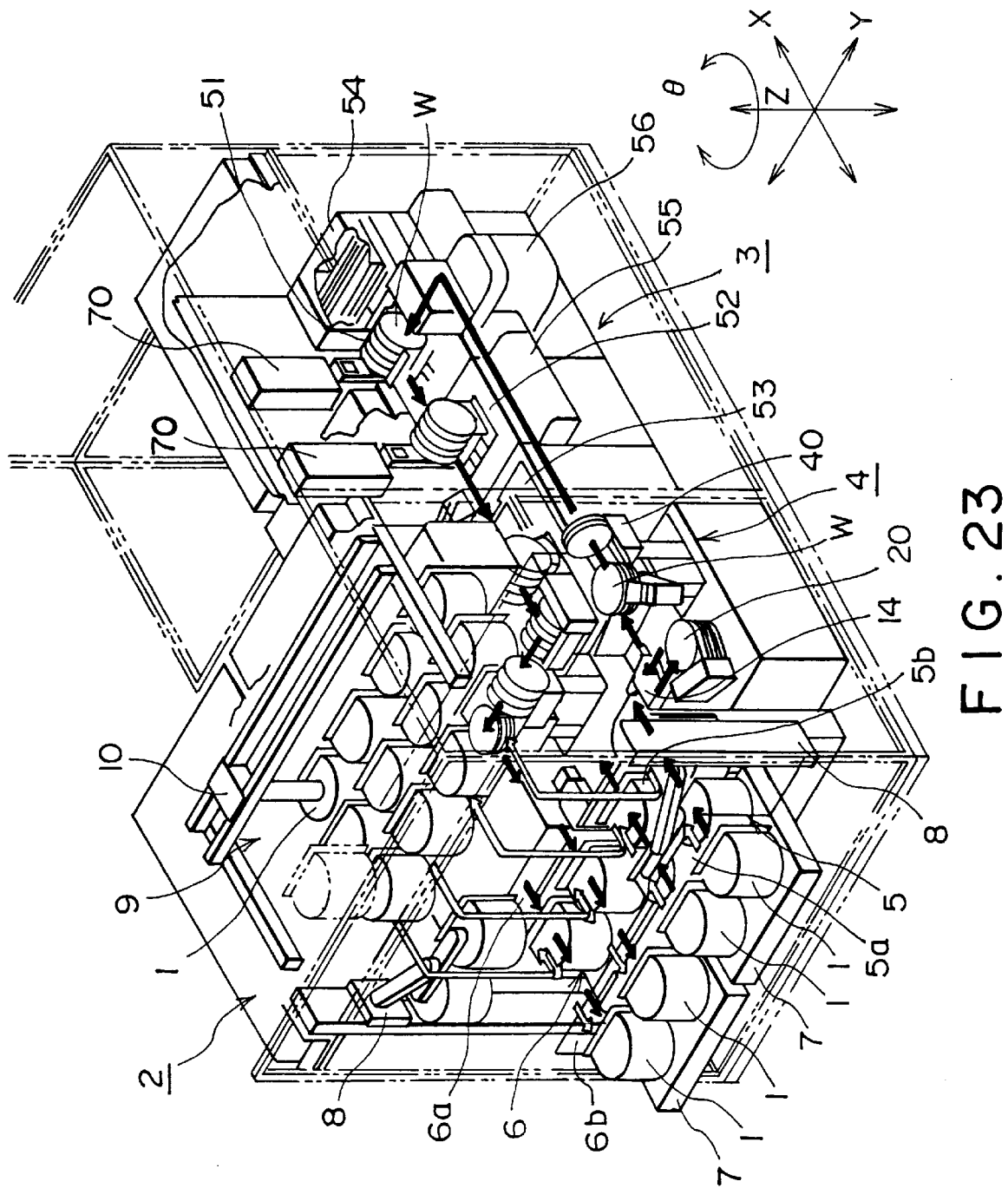
FIG. 23 is a schematic perspective view illustrating a substrate transporting form according to the present invention.

Referring to FIG. 23, a process for transporting and processing the wafers W in the cleaning unit will be described below. In FIG. 23, outline arrows denote the flow of the carriers 1, and black arrows denote the flow of the wafers W.

First, when the carrier 1 loaded with the unprocessed wafers W is mounted on the mounting table 7, which is arranged in front of the carrier inlet 5 of the supply section 5, by means of an operator or a transport robot, the mounting table 7 moves so that the carrier 1 is transported into the supply section 5. The carrier 1 transported into the supply section 5 waits for the interface section 4 while the lid 1c is open by means of the lid opening/closing unit 13. Then, the wafer unloading arm 14 provided in the interface section 4 enters the carrier 1 to take the wafers W out of the carrier 1 to deliver the wafers W to the notch aligner 20. The empty carrier 1, from which the wafers W have been unloaded, is transported to the carrier waiting section 9 above the transport section. The carrier 1 transported to the supply section 5 is transported to the carrier inlet 5a by means of the carrier lifter 8 so as to be in preparation for the next transport.

The notches Wa of the plurality of wafers W transported to the notch aligner 20 are aligned and positioned by means of the notch aligner 20. The positioned wafers W are received by the wafer unloading arm 14 again, and then, transported to the attitude changing unit 40.

After the plurality of wafers W transported to the attitude changing unit 40 are adjusted so as to be at regular intervals by means of the space adjusting mechanism 30 provided in the attitude changing unit 40, the wafers W are adjusted so as to be horizontal by means of the horizontal adjustment mechanism 41. Thereafter, the attitude of the wafers W is changed from the horizontal state to the vertical state.

When the attitude of the wafers W is changed to the vertical state, the wafer transport arm 56 moves a location below the attitude-changed wafers W to receive the wafers W, and delivers the wafers W to the wafer boat 70 of the first processing unit 51. Then, the wafer boats 70 and 70A move downwards so that the wafers W are housed in the processing bath 60. The wafers W housed in the processing bath 60 are cleaned using a cleaning solution, e.g., pure water, after removing particles and organic contamination using a chemical, e.g., an APM solution (a mixed solution of ammonia, hydrogen peroxide and pure water). Thus, the primary-cleaned wafers W are received by the wafer transport arm 56 to be delivered to the second processing unit 52, and then, cleaned using pure water after removing metal contamination using a chemical, e.g., a HPM solution (a mixed solution of hydrochloric acid, hydrogen peroxide and pure water). The wafers W thus cleaned are received by the wafer transport arm 56 again to be transported to the cleaning/drying unit 53. In the cleaning/drying unit 53, the wafers W are dried by contacting a dry steam, e.g., isopropyl alcohol (IPA) gas, after removing a chemical oxide film using hydrofluoric acid.

After the dried wafers W are received by the wafer delivery arm 15 in the second chamber 4b, the wafers W are delivered to the second attitude changing unit 40A, by which the attitude of the wafers W is changed from the vertical state to the horizontal state. The wafers W changed to the horizontal state are received by the wafer loading arm 16 to be housed in the empty carrier 1 waiting in the discharge section 6. At this time, the empty carrier 1 is transported from the carrier waiting section 9 to the discharge section 6 by means of the carrier lifter 8, and waits in the discharge section 6 while the lid 1c is open by means of the lid opening/closing unit 13. After the wafers W are housed in the carrier 1, the lid 1c is closed, and the carrier 1 is transferred from the discharge section 6.

In the processing section 3, since the chemicals and cleaning solution are adhered to the wafer transport arm 56, which transported the cleaned wafers W to the cleaning/drying unit 53, the cleaned wafers W are transported to the chuck cleaning unit 54 before receiving unprocessed wafers W. Then, the chuck portion 59 of the wafer transport arm 56 is cleaned and dried to be in preparation for the next transport of the wafers W.

If a fan filter unit, e.g., a HEPA filter or an ULPA filter, is provided on the transport section 2, the processing section 3 and the interface section 4, it is possible to provide a system having a higher cleanliness.

[Second Preferred Embodiment]

Figure 24:
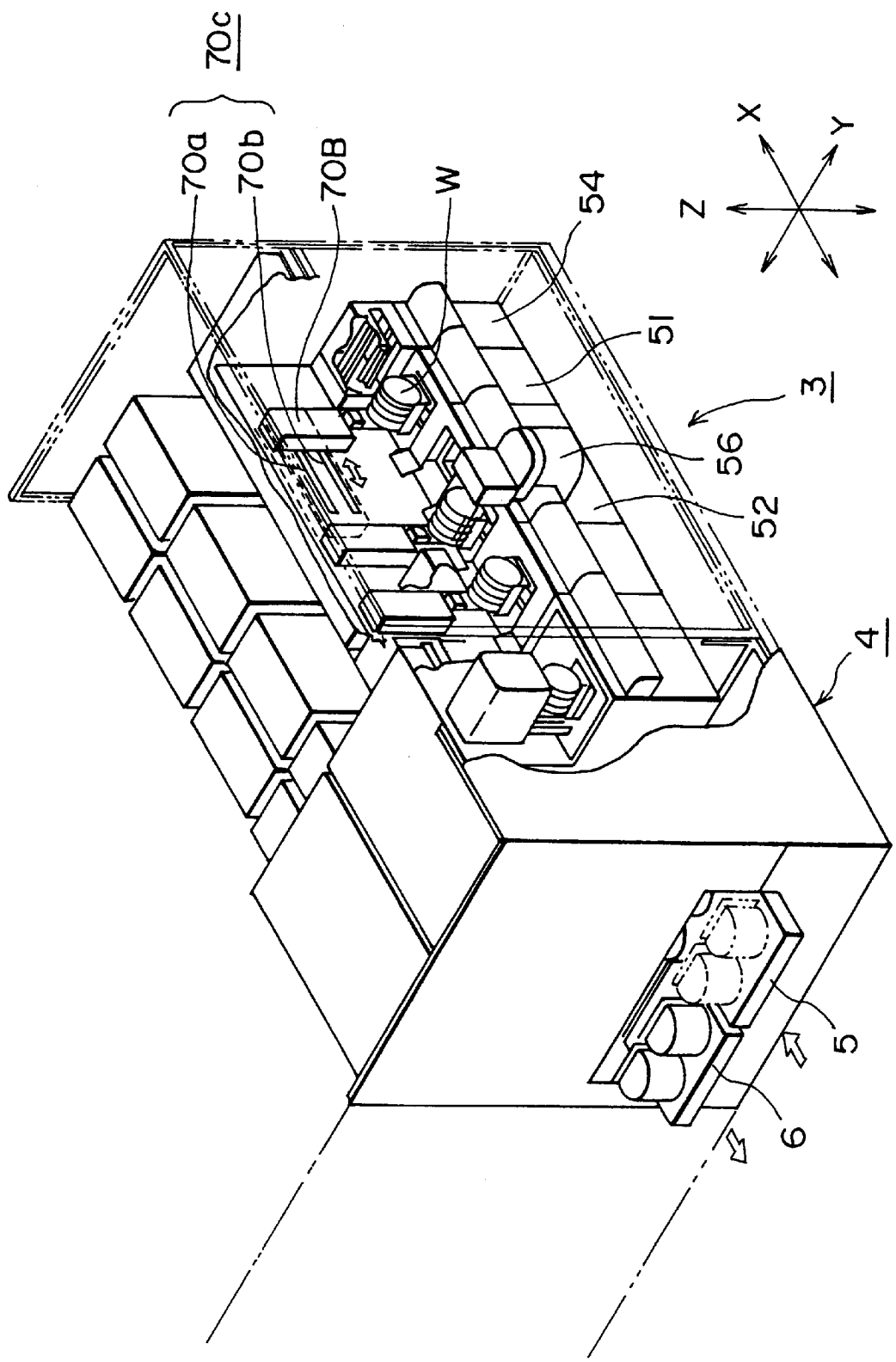
FIG. 24 is a schematic perspective view of the second preferred embodiment of the present invention.

While the wafer boats 70 and 70A have been provided for the processing bath 60 of each of the processing units 51 through 54 in the first preferred embodiment, the present invention should not be limited thereto, but one wafer boat 70B may be provided for a plurality of processing baths, e.g., two processing baths 60 (see FIG. 24). That is, as shown in FIG. 24, a lift mechanism 71 may be movable in horizontal directions (X directions) by means of a guide rail 70a, which is in parallel to the adjacent processing baths 60, and a guide moving means 70c having a pole screw shaft 70b, so that wafers W may be transported into and from two processing baths.

With this construction, the chemical processed wafers W may be housed in the adjacent processing bath 60 to be cleaned with pure water without being received by the wafer transport arm 56. Therefore, in a case where the wafers W are received by the wafer transport arm 56 immediately after the chemical treatment of the wafers W is completed, there is a problem in that the chemical is adhered to the wafer transport arm 56. However, this problem can be solved by this preferred embodiment.

Furthermore, in the second preferred embodiment, other elements are the same as those in the first preferred embodiment, so that the same reference numbers as those in the first preferred embodiment are used for the same elements as those therein, and the duplicate descriptions are omitted.

[Third Preferred Embodiment]

Figure 25:
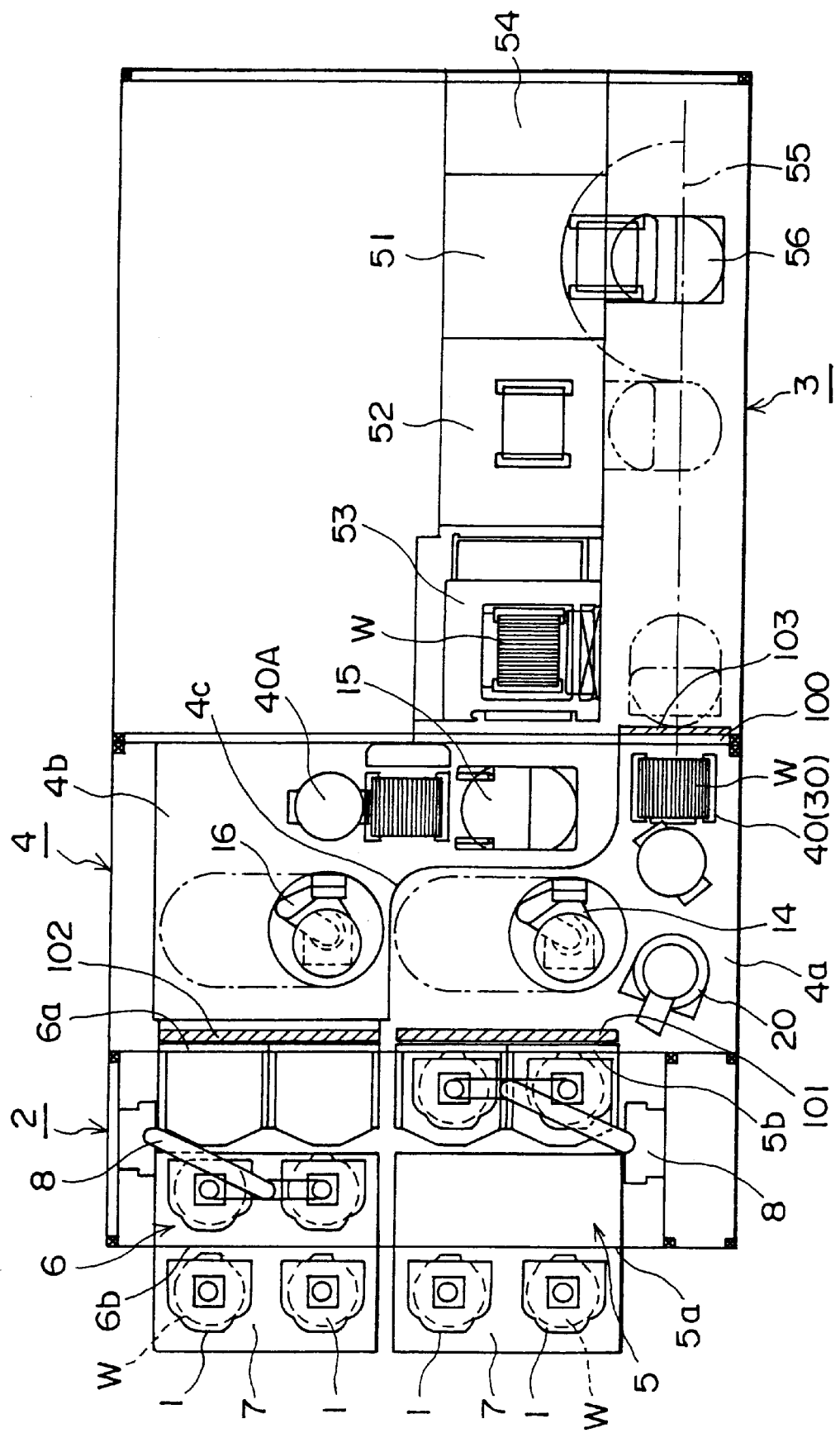
FIG. 25 is a schematic perspective view of the third preferred embodiment of the present invention.

While the closed type carrier 1 having the lid 1c has been used in the above preferred embodiments, the present invention should not be limited thereto, but an open type carrier having no lid may be used for the transport of wafers W to be processed. In a case where an open type carrier is used, as shown in FIG. 25, shutters 101, 102 and 103 capable of being open and closed are provided for the wafer outlet 5b of the supply section 5, the wafer inlet 6a of the discharge section 6, and the communication port between the interface section 4 and the processing section 3, respectively. When the wafers W are delivered from the supply section 5, the shutter 102 for the wafer inlet 6a of the discharge section 6 and the shutter 101 for the communication port 110 between the interface par 4 and the processing section 3 must be closed. When the wafers W are delivered to the processing section 3, the shutter 101 for the wafer outlet 5b of the supply section 5 and the shutter 102 for the wafer inlet 6a of the discharge section 6 must be closed. In a case where the wafers W are not delivered to the discharge section 6, the shutter 102 for the wafer inlet 6a of the discharge section 6 must be closed. In FIG. 25, since other elements are the same as those in the first preferred embodiment, the same reference numbers are used for the same elements, and the descriptions thereof are omitted.

[Fourth Preferred Embodiment]

In the above preferred embodiments, while the wafers W have been delivered between the interface section 4 and the processing section 3 to be delivered to the respective processing units 51 through 53 by moving the wafer transport arm 56 in the processing section 3 in horizontal (X, Y) directions and in vertical (Z) directions and rotating (θ) the transport arm 56, the wafer transport arm 56 may be moved only in horizontal (X, Y) directions to simplify the wafer transport arm and to decrease the size of the system.

Figure 26:
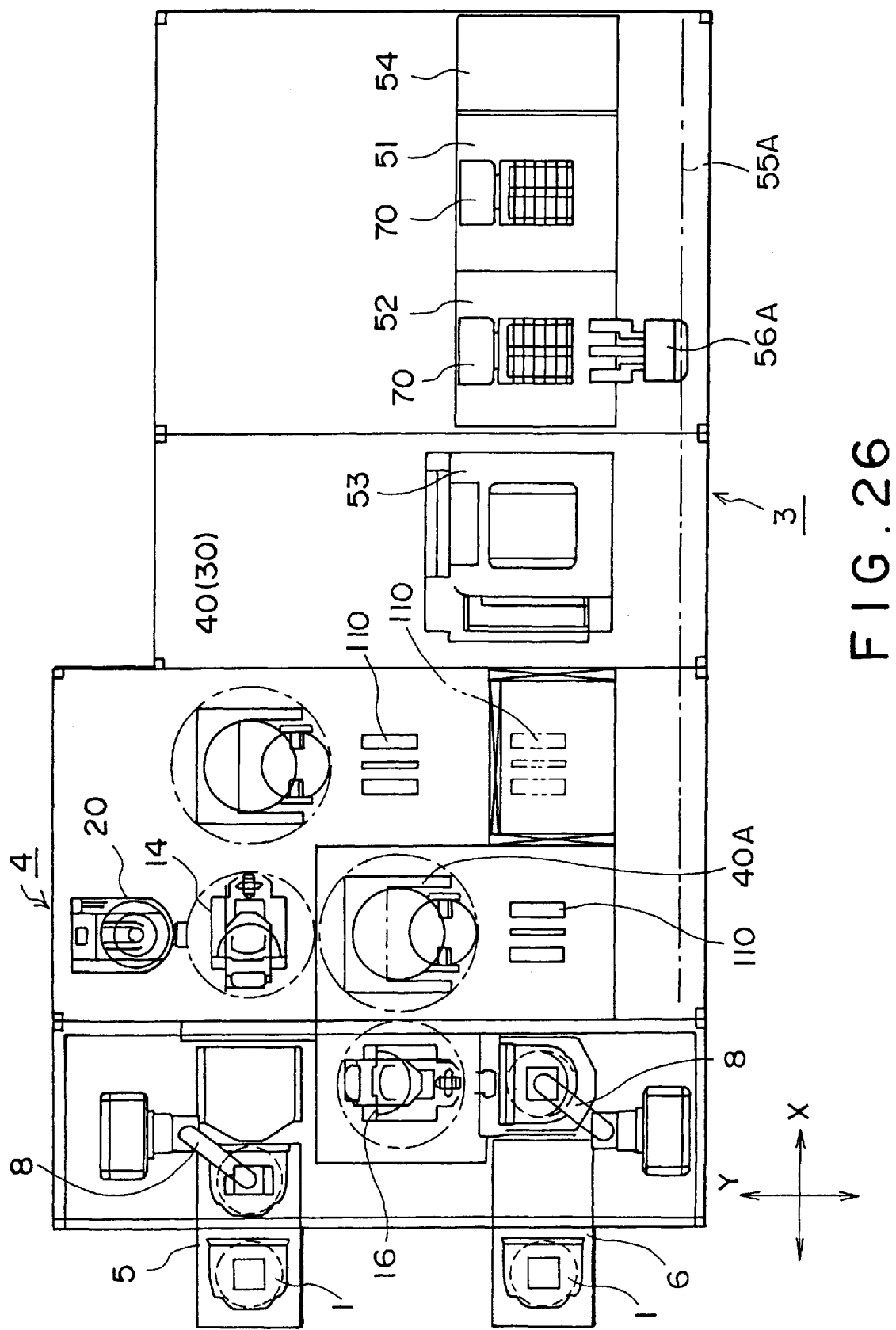
FIG. 26 is a schematic perspective view of the fourth preferred embodiment of the present invention.
Figure 27:
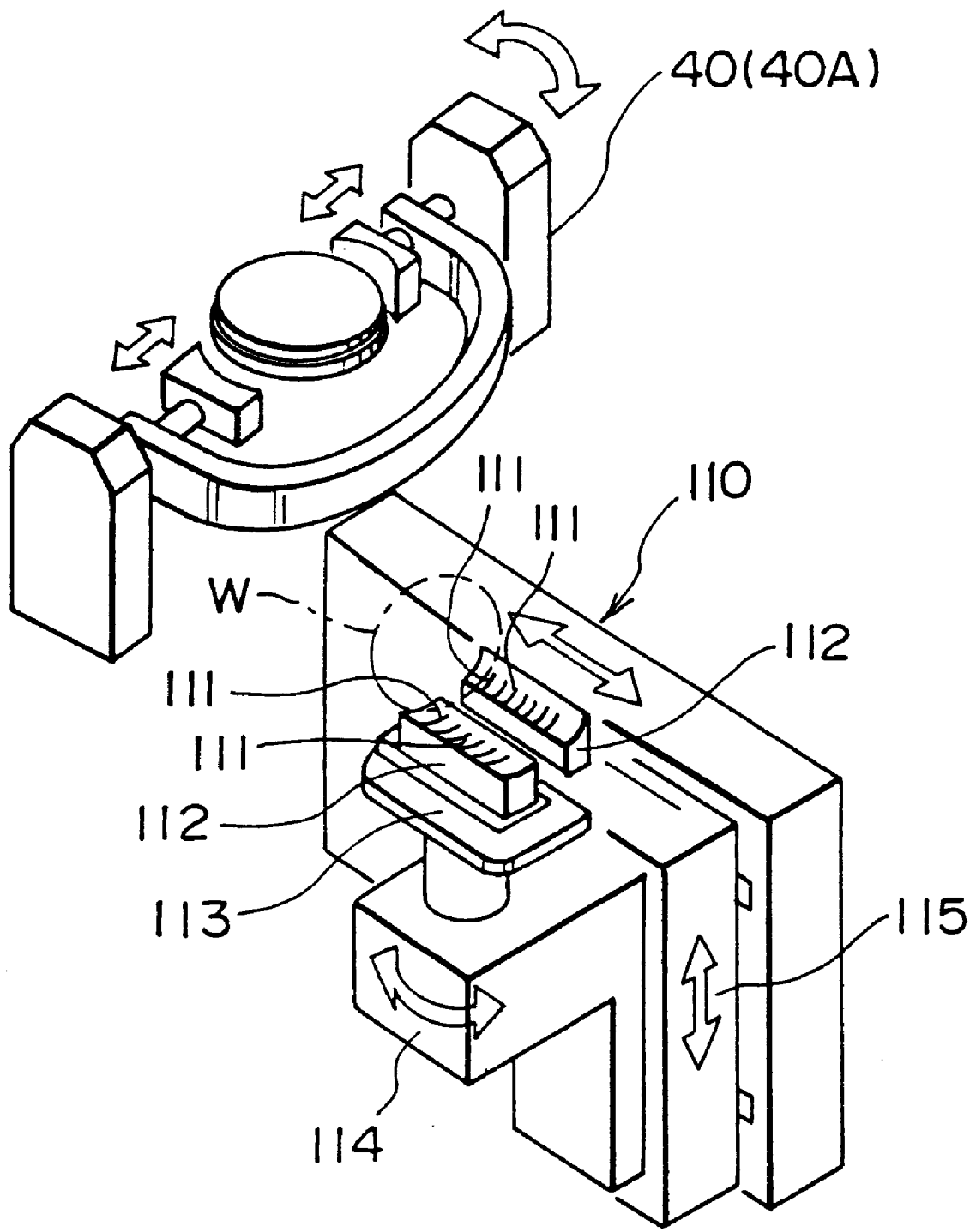
FIG. 27 is a perspective view of a substrate delivery means in the fourth preferred embodiment.

That is, as shown in FIG. 26, a wafer transport arm 56A is movable in horizontal (X, Y) directions, and a transport channel 55A for the wafer transport arm 56A extends from the processing section 3 to the interface section 4. The first and second attitude changing units 40 and 40A are provided in the interface section 4 so as to face the transport channel 55A. Substrate delivery means, e.g., sliders 110, are provided between the first and second attitude changing units 40 and 40A and the transport channel 55A, respectively, so that the wafers W are delivered between the first and second attitude changing units 40 and 40A and the wafer transport arm 56A. As shown in FIG. 27, each of the sliders 110 comprises: a pair of supporting members 112 having a plurality of supporting grooves 111 capable of supporting thereon a plurality of wafers W, e.g., 50 wafers; a horizontal moving part 113 for moving the supporting members 112 in horizontal (Y) directions; a rotating part 114 for rotating (θ) the supporting members 112 and the horizontal moving part 113; and a vertical moving part 115 for moving the supporting members 112, the horizontal moving part 113 and the rotating part 114 in vertical (Z) directions.

Figure 28:
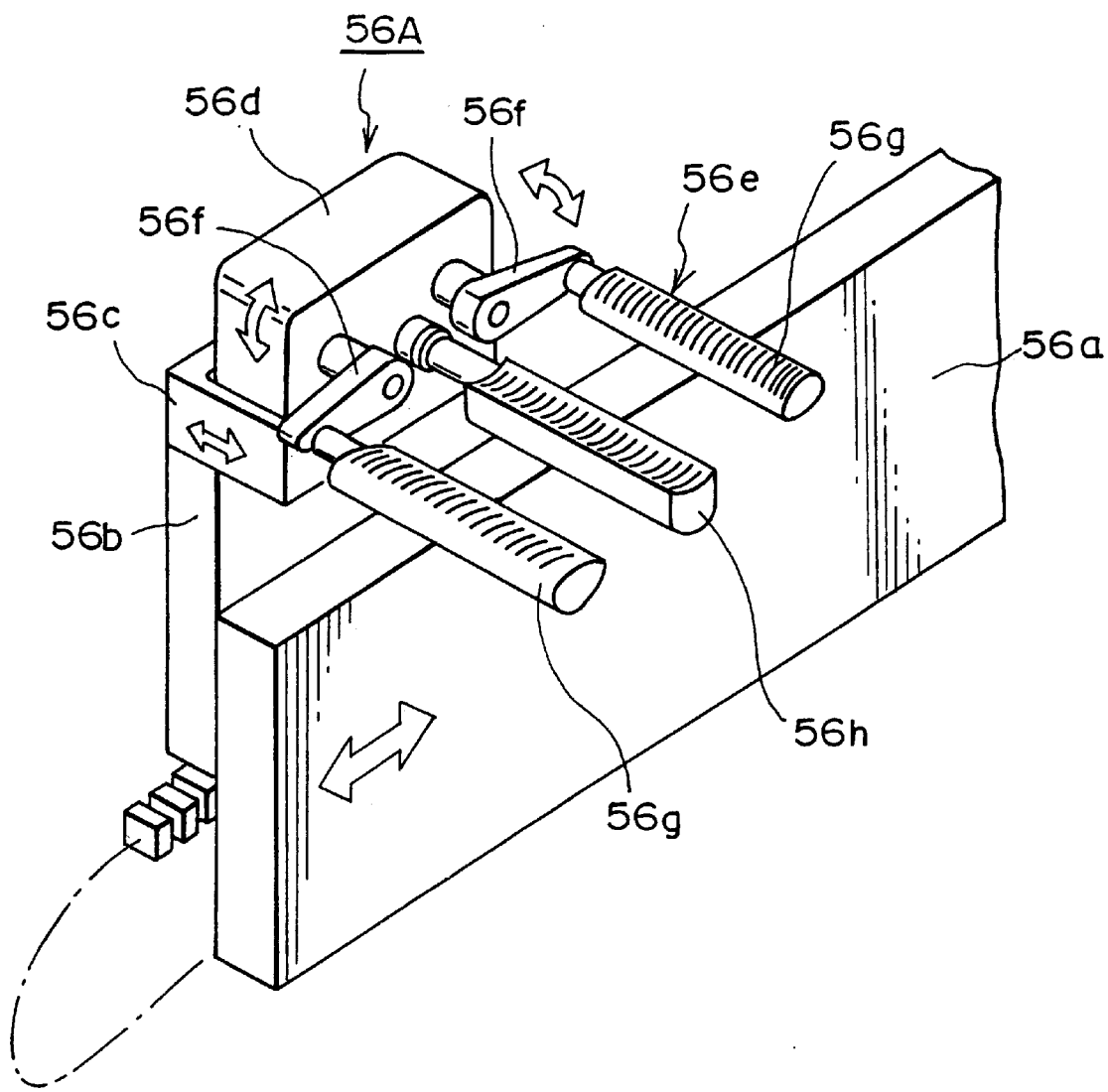
FIG. 28 is a perspective view of a substrate transport means in the fourth preferred embodiment.

As shown in FIG. 28, the wafer transport arm 56A generally comprises: a movable body 56b, which is movable in horizontal (X) directions along the guide rail 56a provided along the transport channel 55A; a horizontal moving body 56c mounted on the upper portion of the movable body 56b so as to be movable in horizontal (Y) directions; and a wafer chuck 56e projecting in the Y directions from the driving part 56d mounted on the upper portion of the horizontal moving body 56c. The wafer chuck 56e comprises: a pair of side holding rods 56g, each of which projects from a rotating arm 56f rotatable in vertical directions by means of a motor (not shown) provided in the driving part 56d; and a lower holding groove 56h located between the side holding rods 56g.

With this construction, the wafers W transported from the supply section 5 to be changed to the vertical state by means of the first attitude changing unit 40 can be received by means of the sliders 110, and the received wafers W can be delivered to the wafer transport arm 56A. The wafer transport arm 56A, which has received the wafers W, moves in horizontal (X, Y) directions to deliver the wafers W between the respective processing units 51 through 53 in the processing section 3, and to deliver the processed wafers W to the slider 110 of the second attitude changing unit 40A. Then, after the wafers W are delivered to the second attitude changing unit 40A by means of the slider 110 to be changed from the vertical state to the horizontal state by means of the second attitude changing unit 40A, the wafers W can be housed in the carrier 1 of the discharge section 6 by means of the wafer loading arm 16.

In the fourth preferred embodiment, the sliders 110 are provided in place of the wafer delivery arm 15. In addition, the wafer outlet 5b of the supply section 5, the wafer unloading arm 15 and the first attitude changing unit 40 are aligned with each other. The sliders 110 provided between the first and second attitude changing units 40 and 40A and the transport channel 55A are parallel to each other, so that the whole movement of the wafers W can be linear. Therefore, with this construction, it is possible to decrease the size of the system and to smoothly transport the wafers W to improve the throughput. In the fourth preferred embodiment, other elements are the same as those in the first preferred embodiment, so that the same reference numbers are used for the same elements, and the descriptions thereof are omitted.

[Fifth Preferred Embodiment]

Figure 29:
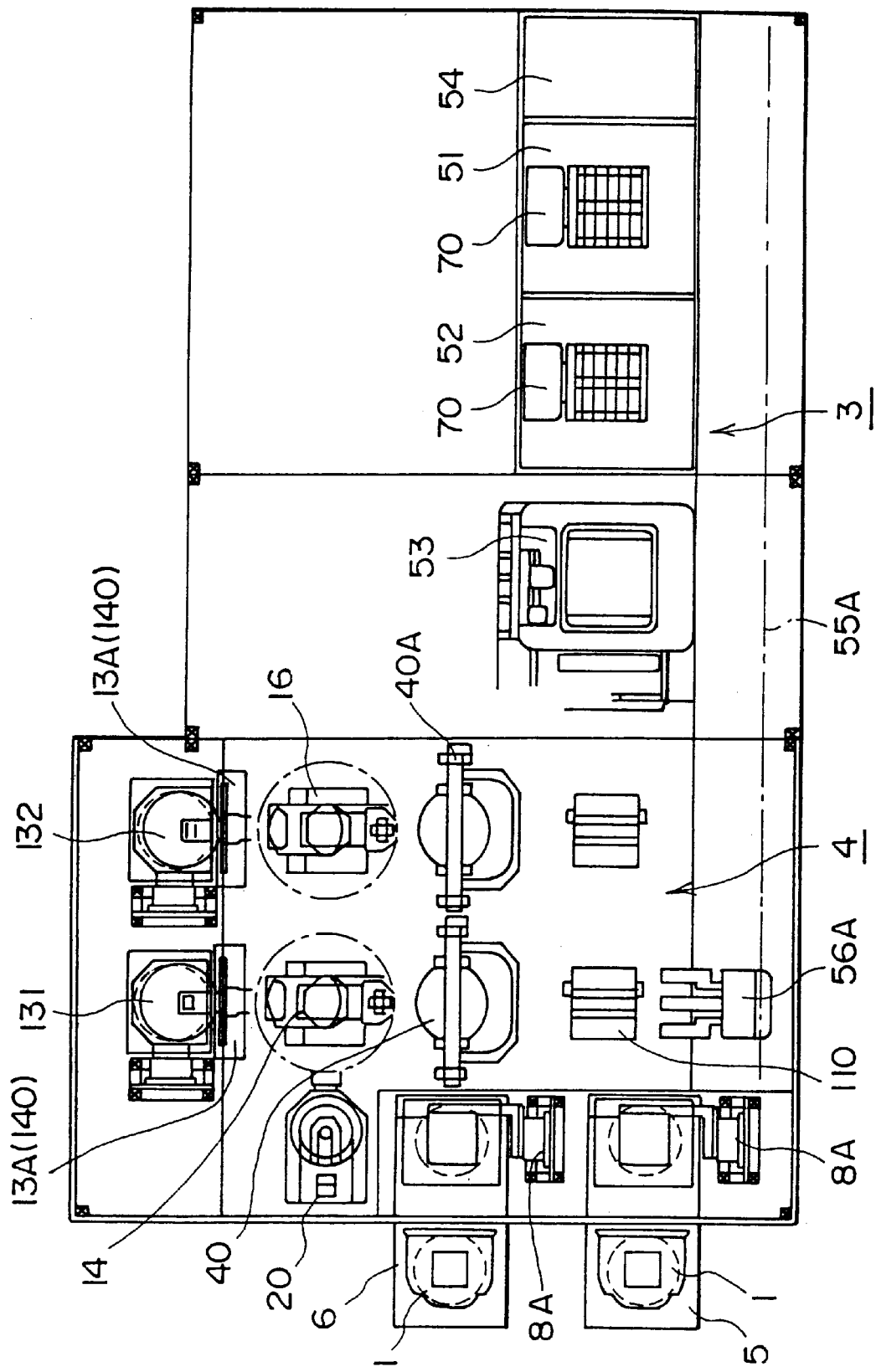
FIG. 29 is a schematic perspective view of the fifth preferred embodiment of the present invention.
Figure 30:
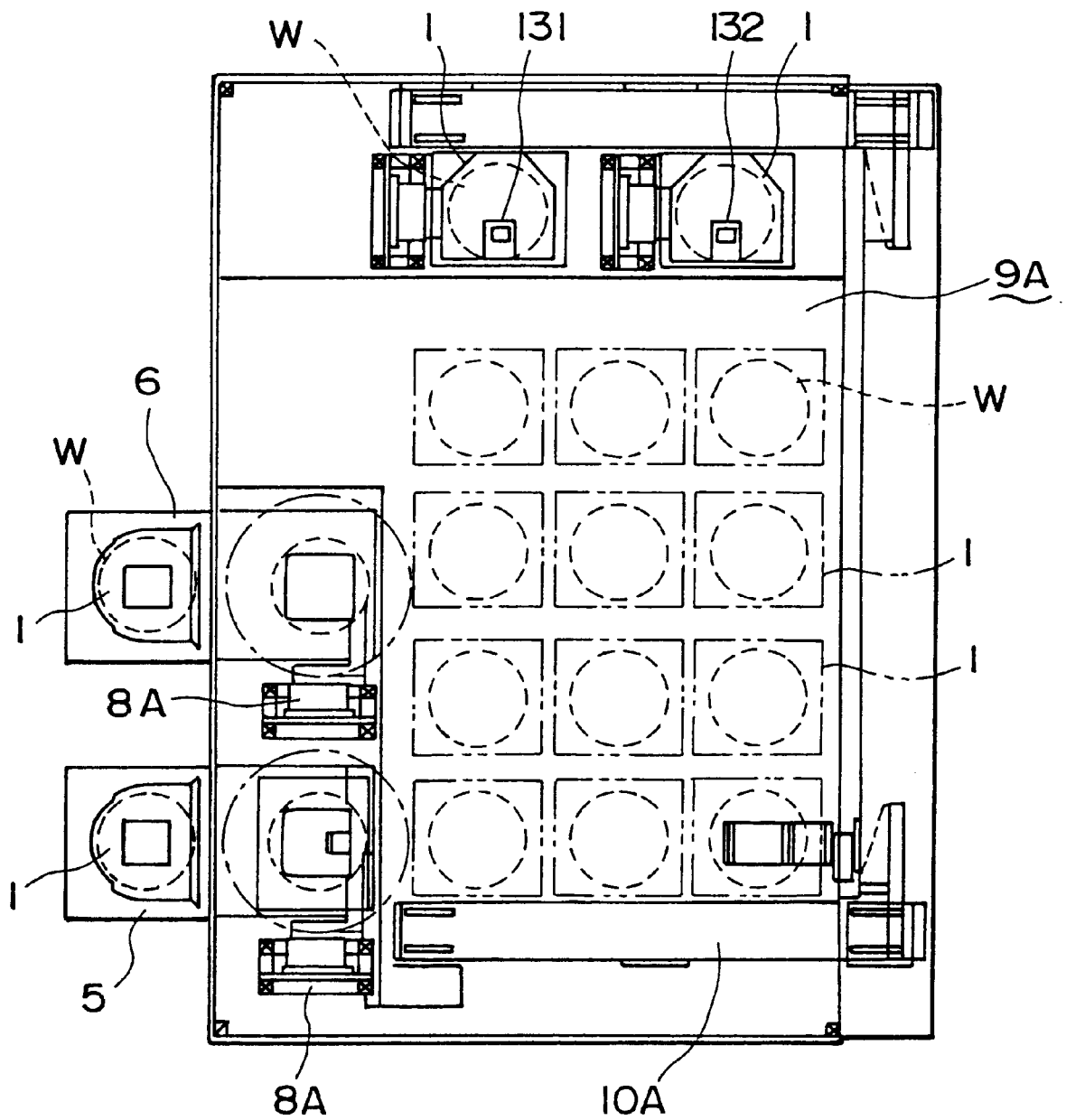
FIG. 30 is a schematic plan view of a container waiting section in the fifth preferred embodiment.
Figure 31:
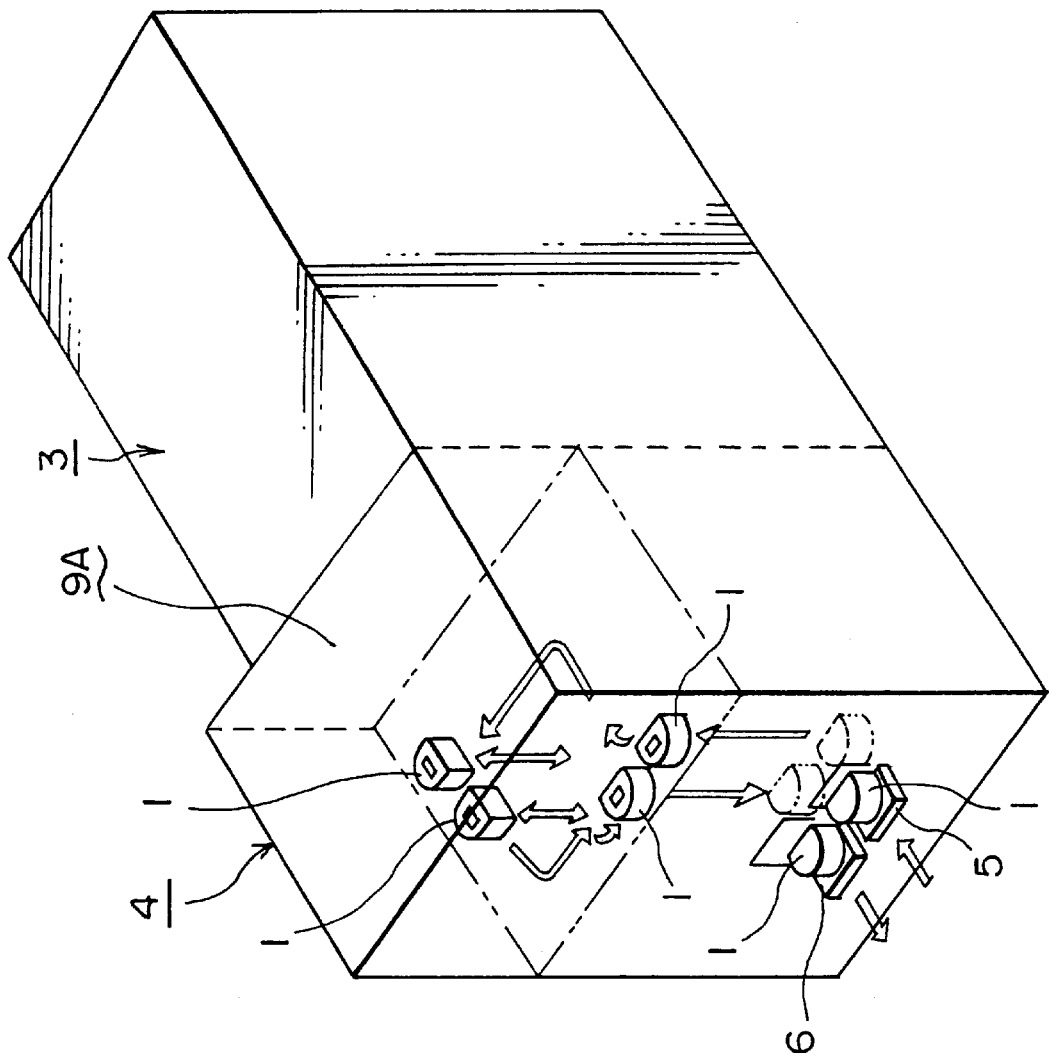
FIG. 31 is a schematic perspective view illustrating a container stock form in the fifth preferred embodiment.

FIG. 29 is a schematic plan view of the fifth preferred embodiment of a cleaning system, to which a substrate transporting and processing system is applied, according to the present invention, FIG. 30 is a schematic plan view of a carrier waiting section in the fifth preferred embodiment, and FIG. 31 is a schematic perspective view illustrating the stock form of the carrier in the fifth preferred embodiment.

In the fifth preferred embodiment, the wafer transport arm 56A movable in horizontal (X, Y) and vertical (Z) directions and the sliders 110 are provided so that the wafers W can be linearly transported similar to the fourth preferred embodiment, and the stock form of the carrier and the transporting form of the wafers are changed.

That is, as shown in FIG. 29, the first attitude changing unit 40 and the second attitude changing unit 40A are provided in parallel to each other via the sliders 110, respectively, so as to face the transport channel 55A. In addition, behind the first and second attitude changing units 40 and 40A, the wafer unloading arm 14 and the wafer loading arm 16 are provided in parallel to each other. Moreover, carrier lifters 131 and 132 serving as second container transport means are provided so as to face the wafer unloading arm 14 and the wafer loading arm 16, so that the wafers W are delivered to the carrier 1 waiting in the carrier waiting section 9.

Figure 32:
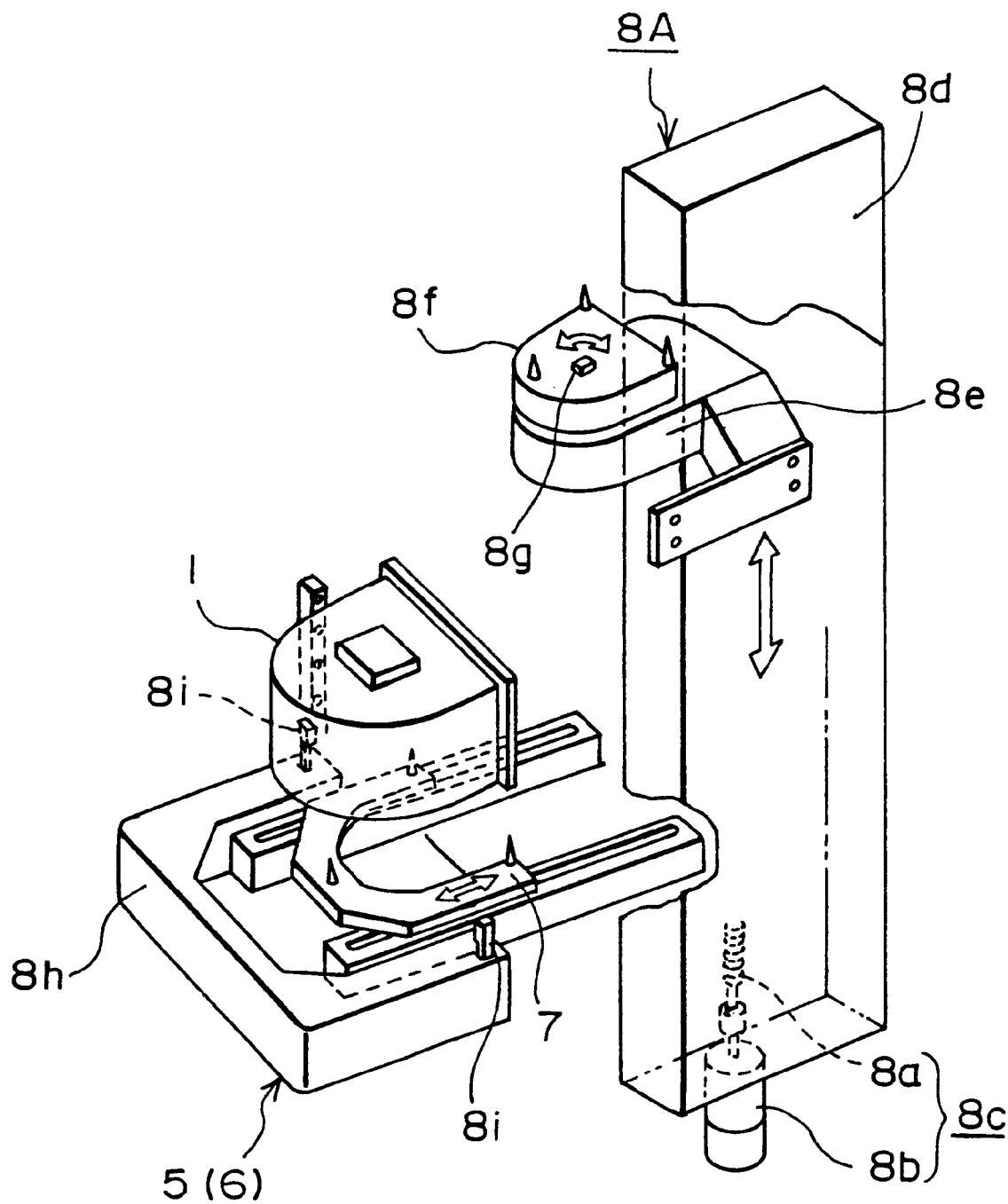
FIG. 32 is a schematic perspective view of a container transport means in the fifth preferred embodiment.

As shown in FIG. 32, the carrier lifter 8A for transporting the carrier 1 between the supply section 5 and the discharge section 6 and the carrier waiting section 9, generally comprises: a ball screw mechanism 8c comprising a ball screw shaft 8a and a pulse motor 8b having a brake; a lifting table 8e movable vertically along a support 8d by means of the ball screw mechanism 8c; and a rotating table 8f mounted on the lifting table 8e so as to be rotatable horizontally. With this construction, the carrier lifter 8A can receive the carrier 1 mounted on the mounting table 7 of the supply section 5 to transport the carrier 1 to the carrier waiting section 9. In addition, the carrier lifter 8A can transport the carrier 1 received from the carrier waiting section 9 to the mounting table 7 of the discharge section 6. Furthermore, a carrier sensor 8g for detecting the presence of the carrier 1 is provided on the rotating table 8f of the carrier lifter 8A. In addition, a cover 8h is provided outside the mounting table 7, and a carrier detecting sensor 8i is mounted on the cover 8h.

As shown in FIGS. 30 and 33, the carrier transport robot 10A provided in the carrier waiting section 9 generally comprises: a pair of slide rails 121 extending in X directions on both sides of the carrier waiting section 9; a movable member 122, which extends between the slide rails 121 and which is movable in X directions; a vertical driving part 123 movable in Y directions along the movable member 122; a lifting table 124 movable in vertical (Z) directions by means of a cylinder (not shown) mounted on the vertical driving part 123; and a carrier hold 126 comprising a pair of holding pawls 125 mounted on the bottom of the lifting table 124 so as to be capable of approaching and leaving each other and of rotating horizontally. The movements in X and Y directions are carried out by means of the ball screw mechanisms 127 and 128. The ball screw mechanisms 127 and 128 and the wafer hold 126 are rotated using the electricity from a cable (not shown) wired in a flexible cable duct 129 connected to a power supply (not shown).

Figure 34:
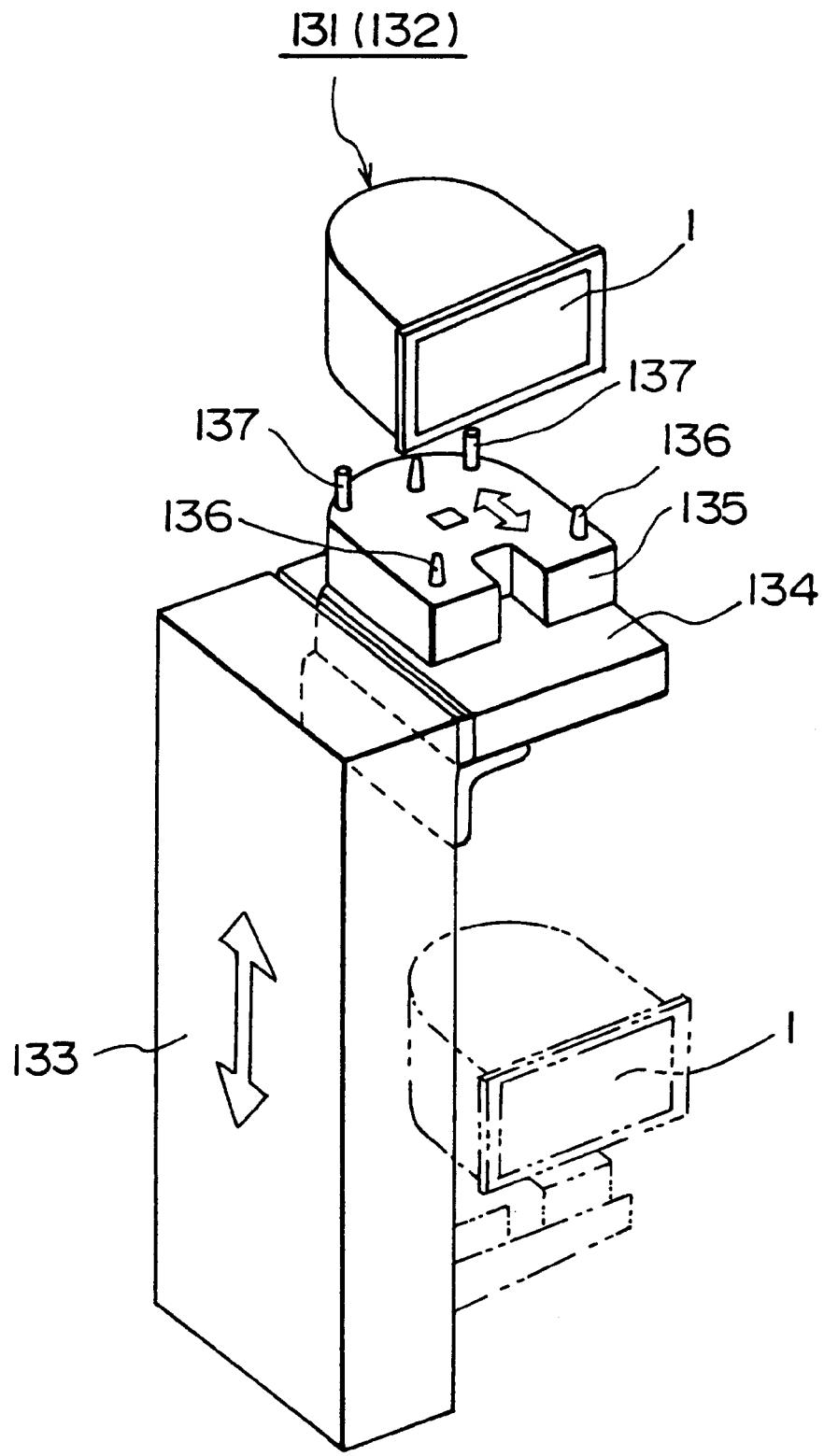
FIG. 34 is a schematic perspective view of a container transport means in the fifth preferred embodiment.

As shown in FIG. 34, each of the carrier lifters 131 and 132 generally comprises: a lifting table 134 movable vertically along the support 133 by means of a vertical cylinder (not shown); and a slide stage 135 mounted on the lifting table 134 so as to be movable horizontally (in Y directions). Carrier positioning pins 136 and carrier supporting pins 137 project from the upper surface of the slide stage 135. Between the carrier lifters 131 and 132 and the carrier waiting section 9, a lid opening/closing unit 13A for opening and closing a lid 1c of the carrier 1, and a wafer counter 140 are provided.

Figure 35:
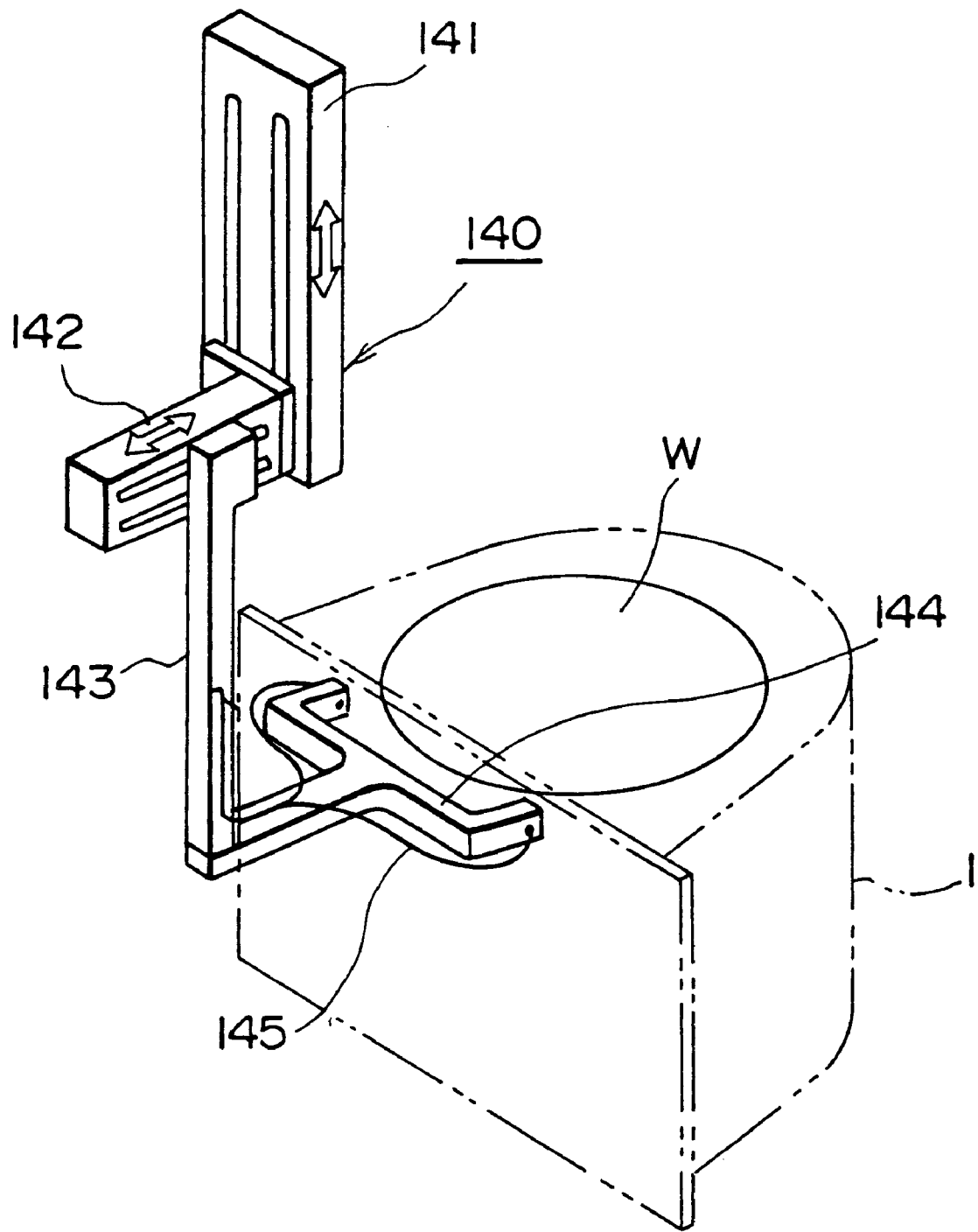
FIG. 35 is a schematic perspective view of a wafer counter in the fifth preferred embodiment.

Since the lid opening/closing unit 13A has the same construction as that of the lid opening/closing unit 13 in the first preferred embodiment, the descriptions thereof are omitted (see FIGS. 7 and 8). As shown in FIG. 35, the wafer counter 140 comprises: a horizontal cylinder 142 movable vertically by means of a ball screw mechanism (not shown) provided in a vertical driving part 141; a fork end arm 144 horizontally mounted on the lower end of a vertical rod 143 movable horizontally by means of the horizontal cylinder 142; and a fiber sensor 145 comprising a light emitting part and a light receiving part, which are mounted on the tip portions of the fork end arm 144. In the wafer counter 140 with this construction, the fork end arm 144 approaches the opening of the carrier 1 to scan vertically along the opening of the carrier 1, so that the number of the wafers W housed in the carrier 1 can be counted.

When the wafers W are inputted, the carrier lifter 131 receives the carrier 1 loaded with the wafers W stocked in the carrier waiting section 9 to put the carrier 1 on a location facing the lower wafer unloading arm 14. Then, the empty carrier 1, from which the wafers W have been unloaded by means of the wafer unloading arm 14, can be moved upwards to the carrier waiting section 9 to be transported into the carrier waiting section 9. When the wafers W are transported from the carrier waiting section 9, the carrier lifter 132 for transporting the wafers W receives the empty carrier 1 located in the carrier waiting section 9 to put the empty carrier 1 on a location facing the wafer loading arm 16. Then, after the wafers W are transported into the carrier 1 by means of the wafer loading arm 16, the carrier 1 can be moved upwards to the carrier waiting section 9 to be transported into the carrier waiting section 9.

In the fifth preferred embodiment, since other elements are the same as those in the first and fourth preferred embodiments, the same reference numbers are used for the same elements, and the descriptions thereof are omitted.

The operation of the fifth preferred embodiment of a cleaning system, according to the present invention, will be described below.

First, the carrier 1 transported to the supply section 5 is transported into the carrier waiting section 9 by means of the carrier lifter 8A to be stocked therein. The carrier 1 stocked in the carrier waiting section 9 is transported to the carrier lifters 131 and 132 by means of the carrier transport robot 10A. As described above, when the wafers are inputted, the carrier 1 is moved downwards from the carrier waiting section 9 to a position facing the wafer unloading arm 14 by means of the carrier lifter 131. The wafers W unloaded from the downward moved carrier 1 by means of the wafer unloading arm 14 are positioned by means of the notch aligner 20, and then, the attitude of the wafers W is changed from the horizontal state to the vertical state. The wafers W changed to the vertical state are received by the slider 110 to be delivered to the wafer transport arm 56A. Then, the wafers W are transported to the respective processing units 51 through 53 by means of the wafer transport arm 56A. After processing, the wafers W are transported from the processing section 3 to the interface section 4 by means of the wafer transport arm 56A, and the wafers W are received by the slider 110 to be delivered to the second attitude changing unit 40A. Then, the wafers W changed from the vertical state to the horizontal state by means of the second attitude changing unit 40A are housed, by means of the wafer loading arm 16, in the empty carrier 1 moved downwards from the carrier waiting section 9 by means of the carrier lifter 132. When the wafers W are housed in the carrier 1, the carrier lifter 132 moves upwards to transport the carrier 1 into the carrier waiting section 9. The carrier 1 transported to the carrier waiting section 9 is transported to the carrier lifter 8 of the discharge section 6 by means of the carrier transport robot 10A. Then, the carrier 1 is received by the carrier lifter 8, and then, the carrier 1 is transported to the discharge section 6.

[Sixth Preferred Embodiment]

Figure 36:
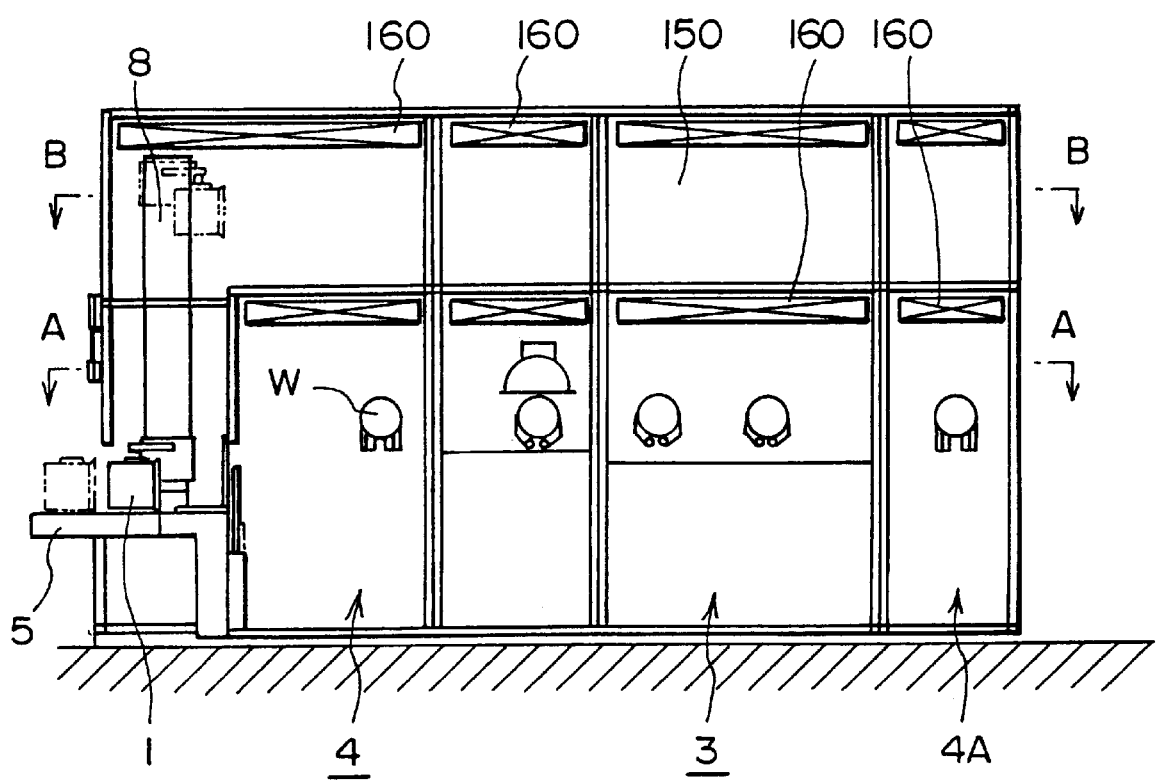
FIG. 36 is a schematic perspective view of the sixth preferred embodiment of the present invention.
Figure 37:
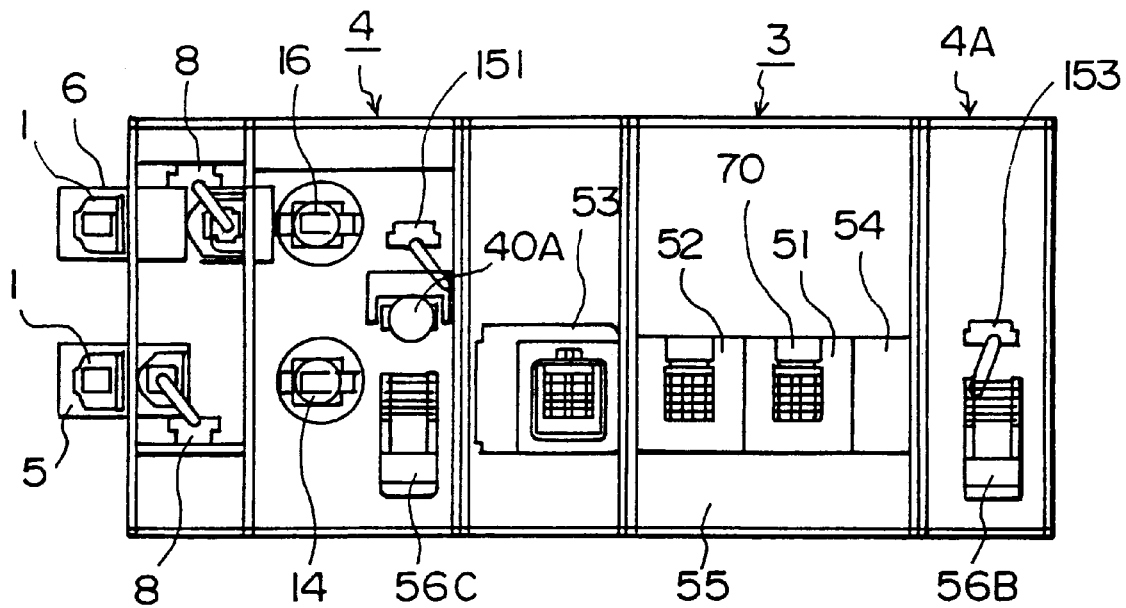
FIG. 37 is a schematic sectional view taken along line A—A of FIG. 36.
Figure 38:
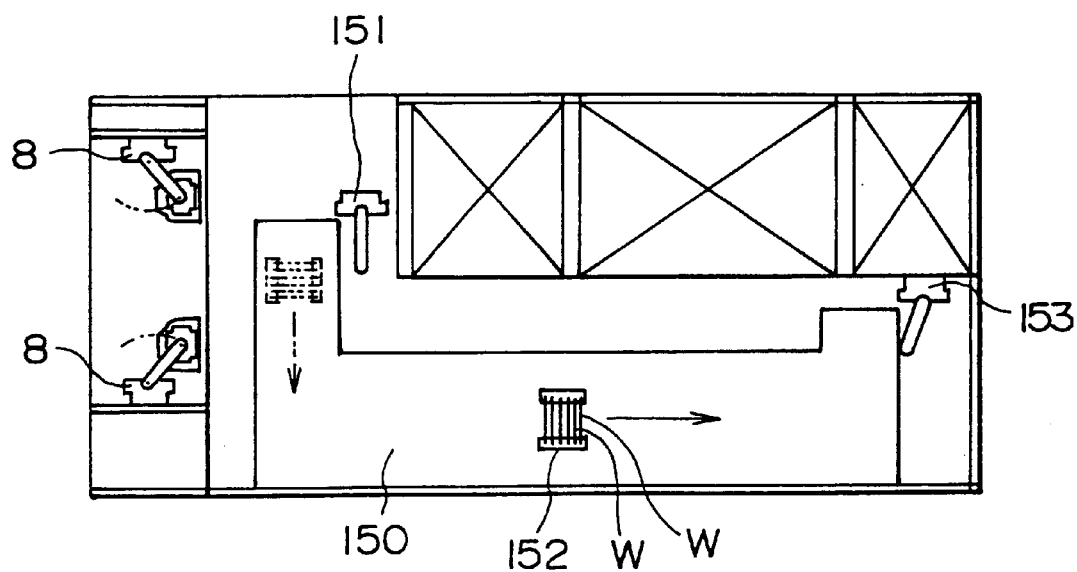
FIG. 38 is a schematic sectional view taken along line B—B of FIG. 36.

FIG. 36 is a schematic side view of the sixth preferred embodiment of a cleaning system, to which a substrate transporting and processing system is applied, according to the present invention, FIG. 37 is a schematic sectional view taken along line A—A of FIG. 36, and FIG. 38 is a schematic sectional view taken along line B—B of FIG. 36.

In the sixth preferred embodiment, the transport time of the wafers W in the processing section 3 can be decreased. As shown in FIGS. 36 and 37, the interface section 4 and the second interface section 4A are provided on both sides of the processing section 3, and the interface sections 4 and 4A are communicated with each other by means of a wafer transport channel 150 provided on the upper portion of the processing section 3. In the wafer transfer channel 150, there is provided a wafer transfer liner 152 (a substrate transfer means) for transferring the wafers W, which are received from the wafer lifter 151 provided in the interface section 4, to the interface section 4A.

In the interface section 4A, there are provided a wafer lifter 153 for moving downwards the wafers W received from the wafer transfer liner 152, and a first wafer transport arm 56B (a first substrate transport means) for receiving the wafers W from the wafer lifter 153 and for transporting the wafers W into the processing section 3. In the interface section 4 and the transport channel 55, there is provided a second wafer transport arm 55C for receiving the wafers W processed by the processing section 3 and for delivering the received wafers W to the attitude changing unit 40A. Furthermore, on the roofs of the processing section 3 and the wafer transfer channel 150, a fan filter unit 160, e.g., a HEPA filter or an ULPA filter, is provided. Similar to the first preferred embodiment, the first attitude changing unit 40 and the notch aligner 20 are provided although these have not been shown in FIG. 37. The first and second attitude changing units may comprise a single unit by changing the contact portion of the wafers W before and after processing. In the sixth preferred embodiment, since other elements are the same as those in the first preferred embodiment, the same reference numbers are used for the same elements, and the descriptions thereof are omitted.

With this construction, the operation of the sixth preferred embodiment of a cleaning system, according to the present invention, will be described below.

First, the wafers W unloaded from the carrier 1 transported to the supply section 5 are positioned, and then, the attitude thereof is changed from the horizontal state to the vertical state. The changed wafers W are transported to the wafer transport channel 150 by means of the wafer lifter 151 to be received by the wafer transfer liner 152 to be transferred to the interface section 4A. The carrier 1 transferred to the interface section 4A is moved downwards into the interface section 4A by means of the wafer lifter 153 to be received by the first wafer transport arm 56B, and then, the carrier 1 is transported to the respective processing units 51 through 53. The wafers W processed by the processing section 3 are received by the second wafer transport arm 56C, and then, the attitude thereof is changed from the vertical state to the horizontal state by means of the attitude changing unit 40A. Then, the wafers W are housed in the carrier 1 of the discharge section 6 by means of a wafer loading arm (not shown).

As described above, the unprocessed wafers W are transported to the respective processing units 51 through 53 in the processing section 3 by means of the first wafer transport arm 56B, and the processed wafers W are transported by means of the second wafer transport arm 56C. Therefore, in comparison with the transport of the wafers W using a single wafer transport arm, even if the number of the processing units increases, the wafers W can be sequentially transported, so that the throughput can be improved.

[Seventh Preferred Embodiment]

Figure 39:
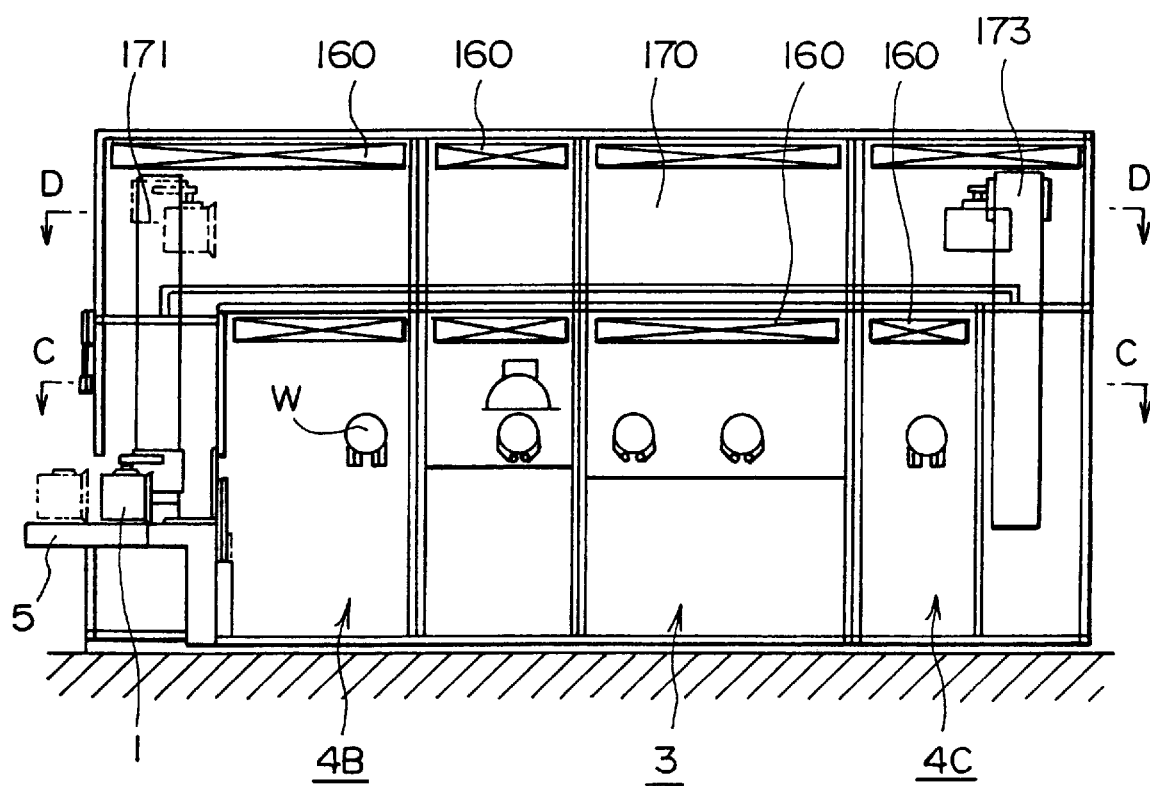
FIG. 39 is a schematic sectional view of the seventh preferred embodiment of the present invention.
Figure 39:
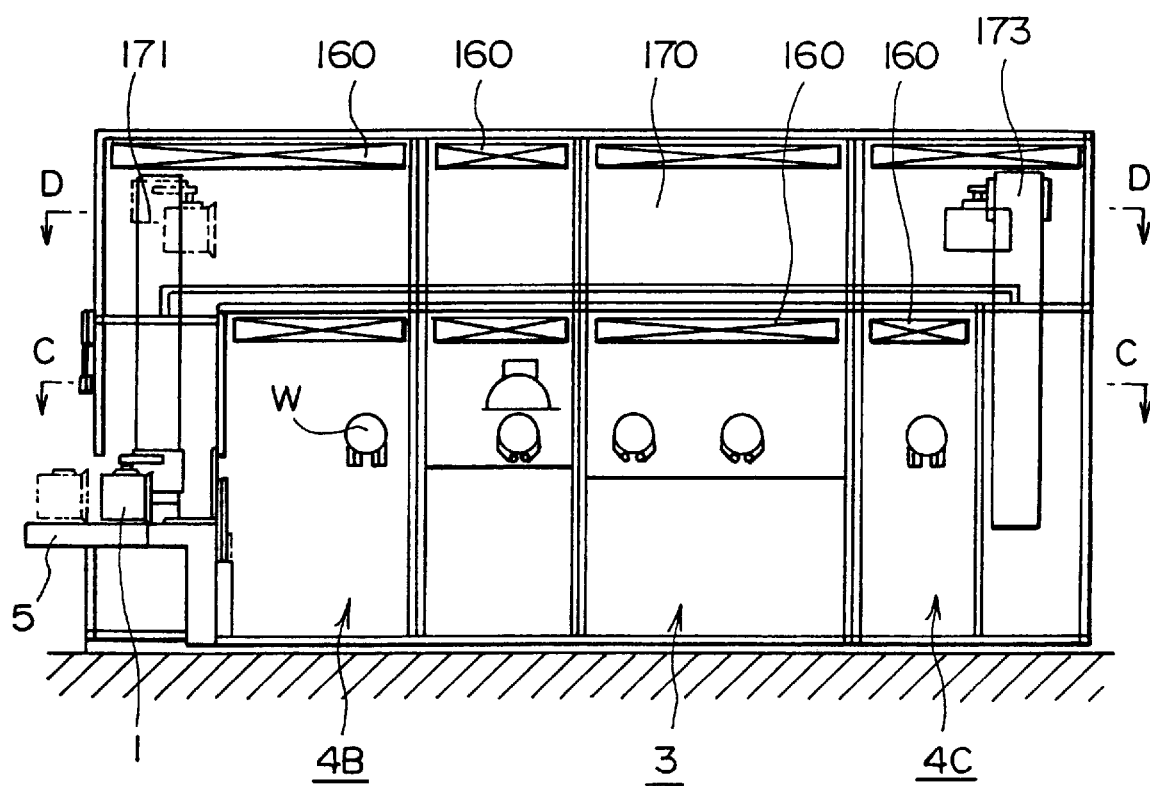

FIG. 39 is a schematic side view of the seventh preferred embodiment of a cleaning system, to which a substrate transporting and processing system is applied, according to the present invention, FIG. 40 is a schematic sectional view taken along line C—C of FIG. 39, and FIG. 41 is a schematic sectional view of line D—D of FIG. 39.

Similar to the sixth preferred embodiment, the transport time of the wafers W in the processing section 3 can be decreased in the seventh preferred embodiment. As shown in FIGS. 39 and 40, the interface sections 4B and 4C are provided on both sides of the processing section 3. The interface sections 4B and 4C are communicated with each other by means of a carrier transfer channel 170 provided above the processing section 3. In the carrier transfer channel 170, there is provided a carrier transfer liner 172 (a container transfer means) for transferring the carrier 1, which is received from a carrier lifter 171 provided in the supply section 5, to the interface section 4.

In the interface section 4C, there are provided a carrier lifter 173 for moving downwards the carrier 1 received from the carrier transfer liner 172, a wafer unloading arm 14 for unloading the wafers W from the carrier moved downwards by means of the carrier lifter 173, a notch aligner 20 for positioning the wafers W, a first attitude changing unit 40 for changing the attitude of the wafers W from a horizontal state to a vertical state, and a first wafer transfer arm 56B for receiving the wafers W from the first attitude changing unit 40 to transport the received wafers W to the respective processing units 51 through 53 of the processing section 3. The interface section 4B is provided adjacent to the supply section 5 and discharge section 6. In the interface section 4B, there is provided a wafer loading arm 16 for loading the wafers W into the carrier 1 of the discharge section 6, a second attitude changing unit 40A for changing the attitude of the wafers W from a vertical state to a horizontal state, and a second wafer transport arm 56C for receiving the wafers W processed by the processing section 3 to deliver the received wafers W to the second attitude changing unit 40A.

Furthermore, a carrier waiting section 9A is provided on one side of the carrier transfer channel 170 so that the carrier 1 loaded with the wafers W or an empty carrier 1 can be stocked in the carrier waiting section 9A. Alternatively, the carrier waiting section 9A may be provided, not at a location adjacent to the carrier transfer channel 170, on the interface section 4B similar to the first preferred embodiment. In addition, on the roofs of the processing section 3 and the carrier transfer channel 170, a fan filter unit 160, e.g., a HEPA filter or an ULPA filter, is provided. In the seventh preferred embodiment, since other elements are the same as those in the first preferred embodiment, the same reference numbers are used for the same elements, and the descriptions thereof are omitted.

The operation of the seventh preferred embodiment will be described below.

First, the carrier 1 transported to the supply section 5 is transported to the carrier transfer channel 170 by means of the carrier lifter 171, and the carrier 1 is transferred toward the interface section 4C by means of the carrier transfer liner 172. The carrier 1 transported to a location above the interface section 4C is transported into the interface section 4C by means of the carrier lifter 173. Then, the wafers W unloaded from the carrier 1 by means of the wafer unloading arm 14 are positioned by means of the notch aligner 20, and then, the wafers W are delivered to the first attitude changing unit 40. The attitude of the wafers W is changed from a horizontal state to a vertical state by means of the first attitude changing unit 40, and then, the wafers W are received by the first wafer transport arm 56B to be transported to the respective processing units 51 through 53 in the processing section 3. After the wafers W processed by the processing section 3 are received by the second wafer transport arm 56C, and the attitude of the wafers W is changed from the vertical state to the horizontal state. Then, the wafers W are housed in the carrier 1 of the discharge section 6 by means of the wafer loading arm 16. On the other hand, the empty carrier 1, from which the wafer W has been unloaded, is transported in the opposite manner to be stocked in the carrier waiting section 9A if necessary.

As described above, after the carrier 1 transported into the supply section 5 is transferred to the interface section 4C and the attitude of the wafers W are changed to the vertical state, the unprocessed wafers W are transported to the respective processing units 51 through 53 in the processing section 3 by means of the first wafer transfer arm 56B, and the processed wafers W are transported by means of the second wafer transport arm 56C. Therefore, even if the number of the processing units is high, the wafers W can be sequentially transported, so that the throughput can be improved.

[Eighth Preferred Embodiment]

The eighth preferred embodiment of a cleaning system, according to the present invention, will be described below.

Figure 42:
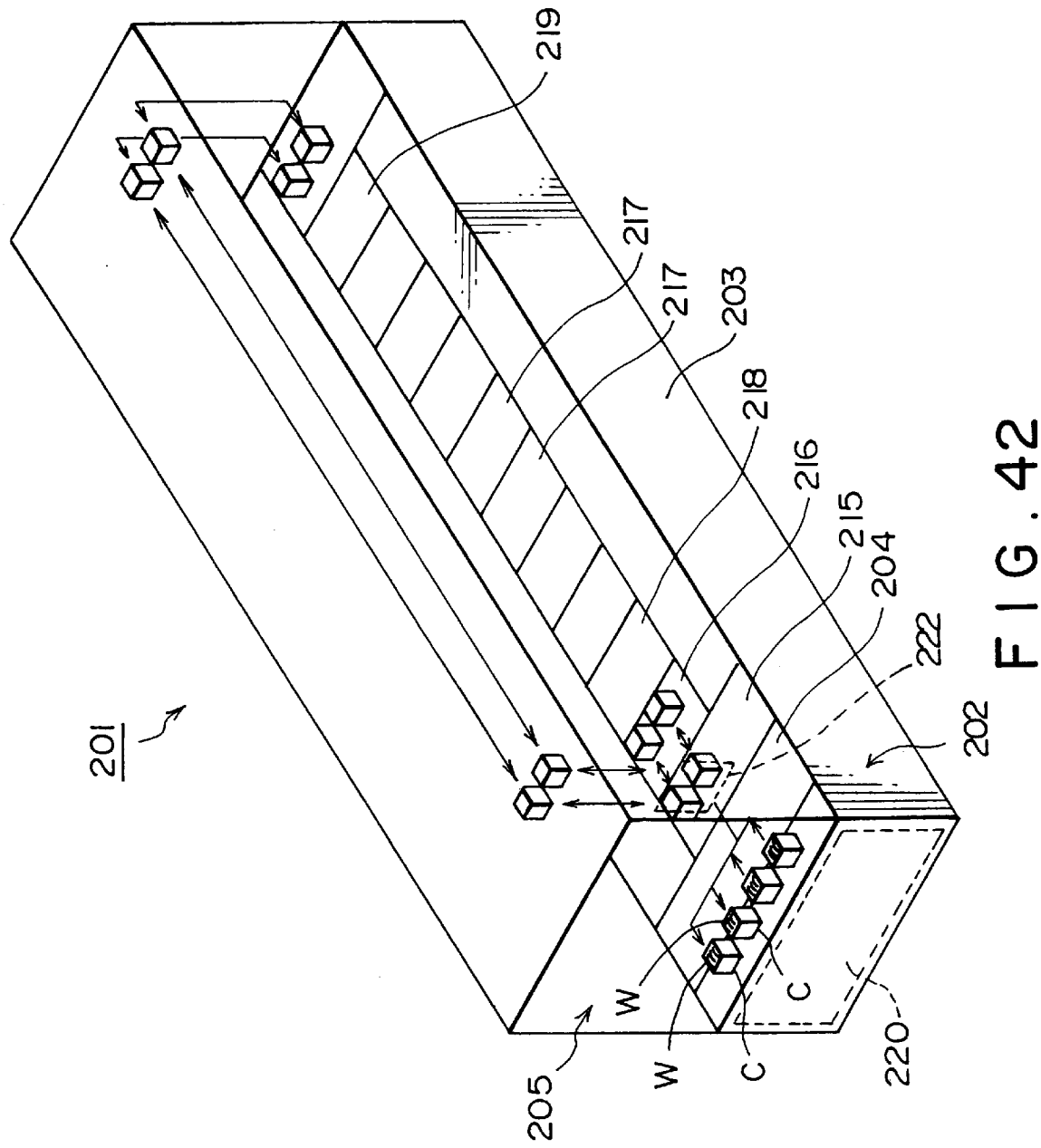
FIG. 42 is a schematic sectional view of a cleaning system according to the present invention.

FIG. 42 is a perspective view of a cleaning system 201, located in a clean room, for cleaning wafers W serving as objects to be processed. The cleaning system 201 comprises: an interface section 202, on which cassettes C are mounted by means of an automatic guided vehicle (AGV) (not shown) traveling in the clean room; a cleaning section 203 for cleaning and drying the wafers W; a transfer unit 204 for transporting the cassettes C between the interface section 202 and the cleaning section 203. A plurality of wafers W serving as objects to be processed, which are cleaned in the cleaning system 201, are housed in the cassette C.

A transport gate 205 is formed in the side of the interface section 202, and the cassettes C transported by the AGV (not shown) are transported into and from a cleaning system 201 via the transport gate 205. The cassette C transported to the cleaning system 201 houses therein the wafers W, which are to be cleaned in the cleaning section 203. The cassette C transported from the cleaning system 201 houses therein the wafers W, which have been cleaned by the cleaning section 3.

Figure 43:
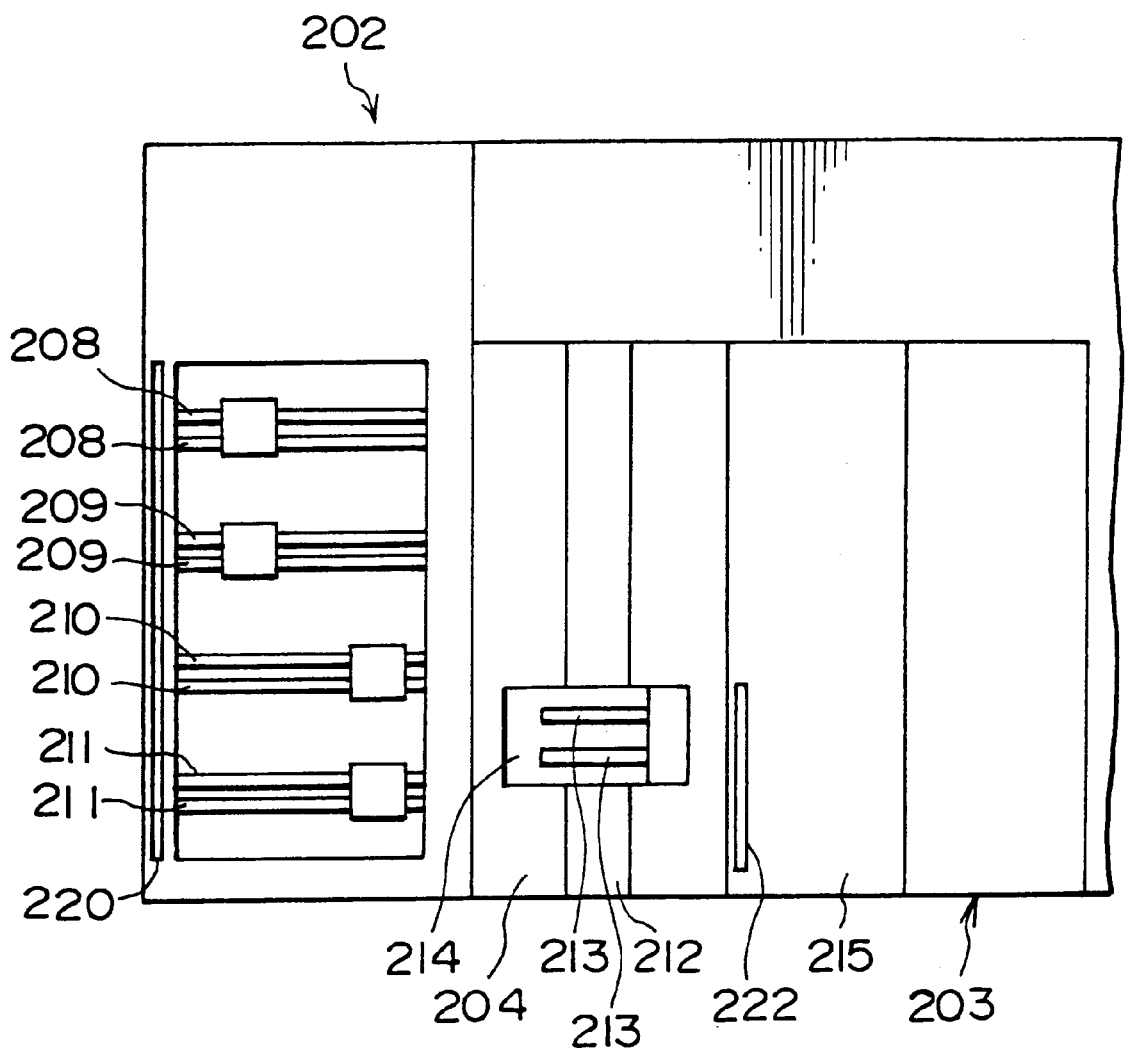
FIG. 43 is a plan view of an interface section of FIG. 42.

As shown in FIG. 43, four rails 208, 209, 210 and 211 are provided on the upper surface of the interface section 2 so that the cassettes C are movable laterally on the rails 208,209, 210 and 211. In the shown embodiment, the cassettes C loaded with the wafers W, which have been cleaned, are transferred on two rear rails 208 and 209. On these rails 208 and 209, the cassettes C transported from the cleaning section 203 by means of an arm 213 of the transfer unit 4, which will be described in detail later, are transferred to the right position on the rails 208 and 209 in the drawing. Then, the cassettes C transferred to the right position on the rails 208 and 209 are moved on the rails 208 and 209 to be transported to the left position on the rails 208 and 209. In the shown embodiment, on the two front rails 210 and 211, the cassettes C loaded with the wafers W to be cleaned by means of the cleaning system 201 are transferred. On these rails 210 and 211, the cassettes C transported by the AGV or the like are transferred to the left position on the rails 210 and 211 in the drawing. Then, the cassettes C transported to the left position on the rails 210 and 211 are moved on the rails 210 and 211 to be transported to the right position on the rails 210 and 211. FIG. 43 shows the state that the cassettes C on the rails 208 and 209 are transported to the left position on the rails 208 and 209 and the cassettes C on the rails 210 and 211 are transported to the right position on the rails 210 and 211.

As shown in FIG. 43, a guide rail 212 extending in longitudinal directions is provided on the upper surface of the transfer unit 204. On the upper surface of an arm body 214 traveling along the guide rail 212, a vertically movable and rotatable arm 213 is mounted. This arm 213 picks up the cassettes C on the rails 210 and 211 to transport the cassettes C into the waiting section 15 of the cleaning section 3, which will be described later, and picks up the cassettes C from a waiting section 215 to transfer the cassettes C to the rails 208 and 209, so that the cassettes C are transported between the interface section 202 and the cleaning section 203.

In the front of the cleaning section 203, the waiting section 215 for delivering the cassettes C by means of the arm 213 of the transfer unit 204 is located. In the processing section 203, an unloader 216 is located behind the waiting section 215. Behind the unloader 216, various cleaning baths 217 and drying baths 218 for cleaning and drying the wafers W are located in series. In the rearmost, a loader 219 is located. As described above, when the cassette C is transported from the rails 210 and 211 of the interface section 202 into the waiting section 215 of the cleaning section 203 by means of the arm 213, the cassette C is lifted to a location above the cleaning section 203 by means of a lifter (not shown). Thereafter, the cassette C is transported to the rearmost of the cleaning section by means of the liner, and then, the cassette C is moved downward by means of the lifter (not shown), so that the cassette C loaded with the uncleaned wafers W is transported to the waiting section 215, and then, the cassette C transported to the waiting section 215 is transported to the loader 219. Then, the wafers W are unloaded from the cassette C in the loader 219 to be sequentially batch transported to the respective processing sections to be cleaned and dried. The wafers W thus processed are supplied to the unloader 216. On the other hand, the empty cassette C, from which the wafers W are unloaded in the loader 219, is lifted again to a position above the cleaning section 203 by means of the lifter, and then, the empty cassette C is transported to the frontmost of the cleaning section 203 by means of the liner to be moved downward by means of the lifter (not shown), so that the empty cassette C is transported to the waiting section 215. Thereafter, the cassette C thus transported to the waiting section 215 are supplied to the unloader 216. Then, the cleaned wafers W are housed again in the empty cassette C in the unloader 216. After the cassette C loaded with the cleaned wafers W is transported to the waiting section 215, and then, the cassette C transported to the waiting section the cassette C is transferred onto the rails 208 and 209 of the interface section 202 by means of the arm 213.

As shown in FIG. 42, the cleaning system 201 is provided with a first shutter 220 for opening and closing the transport gate 205 of the interface section 202, and a second shutter 222 for establishing and blocking the communication between the interface section 202 and the cleaning section 203. FIG. 42 shows the state that the first shutter 220 is moved downwards and the second shutter 222 is moved upwards.

Figure 44:
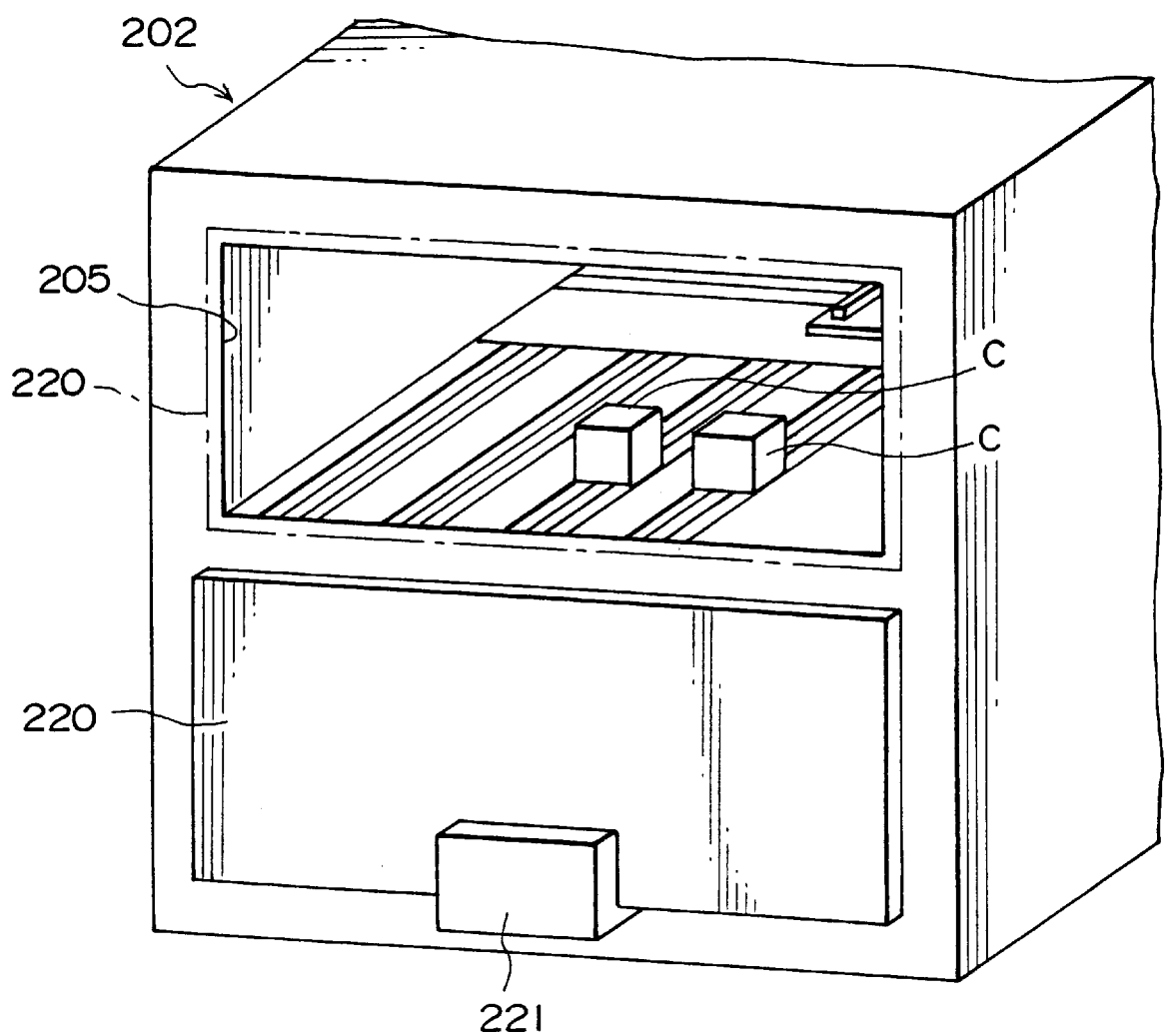
FIG. 44 is an explanatory drawing of a first shutter.

As shown in FIG. 44, a first driving part 221 for vertically moving the first shutter 220 is located below the transport gate. The first driving part 221 comprises, e.g., a cylinder or a motor. In the case of a motor, an encoder is directly connected to a driving shaft of the motor, and the rotation of the motor is controlled by pulse signals. For example, the first driving part 221 comprises a stepping motor driven by pulse signals, and the rotation of the stepping motor is controlled so as to switch the state of the first shutter 220 between a state wherein the first shutter 220 is moved upwards to close the transport gate 205 and a state wherein the first shutter 220 is moved downwards to open the transport gate 205. In order to recognize the vertical movement of the first shutter 220, a sensor (not shown), e.g., a photo sensor or a proximity sensor, is provided for detecting the opening and closing of the transport gate 205. In FIG. 44, the first shutter 220 shown by the solid line is moved downwards by means of the first driving part 221. When the first shutter 220 is moved downwards, the transport gate 205 is open so as to allow the cassette C, which is transported by the AGV (not shown), to be transported into and from the interface section 202. On the other hand, when the first shutter 220 is moved upwards by the first driving part 221, the first shutter is moved to a position shown by the dashed line 220' in FIG. 3 so that the transport gate 205 is closed. Thus, when the transport gate 205 is closed by the first shutter 220, air in the clean room is not introduced into the interface section 202 of the cleaning system 201.

Figure 45:
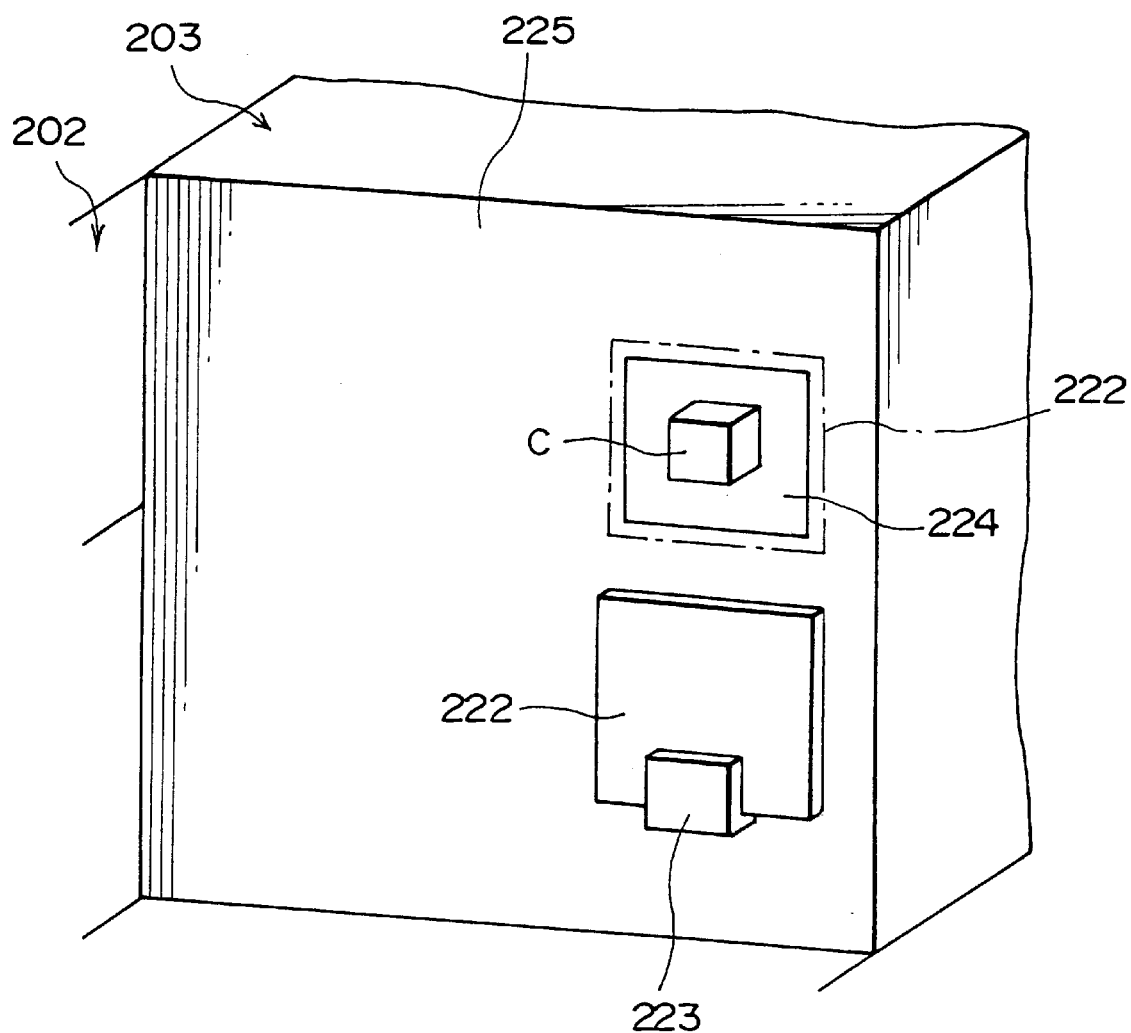
FIG. 45 is an explanatory drawing of a second shutter.

As shown in FIG. 45, the cleaning system 201 is divided into the interface section 202 and the cleaning section 203 by a partition plate 225. The partition plate 225 has a transport passage 224 for transporting the cassette between the interface section 202 and the cleaning section 203. The second shutter 222 is supported on a second driving part 223 located below the transport passage 224. Similar to the first driving part 221, the second driving part 223 comprises, e.g., a motor or a cylinder, and the second shutter 222 is moved vertically by means of the second driving part 223. Similar to the first driving part 221, the vertical movement of the second shutter 222 is controlled so as to switch the state of the second shutter 222 between a state wherein the second shutter 222 is moved upwards to close the transport passage 224 and a state wherein the second shutter 222 is moved downwards to open the transport passage 224. In addition, the opening and closing of the second shutter 222 are detected by, e.g., a photo sensor or a proximity sensor. In FIG. 45, the second shutter 222 shown by the solid line is moved downwards by means of the second driving part 223. Thus, when the second shutter 222 is moved downwards, the transport passage 224 is open to allow the cassette C supported on the arm 213 of the transfer unit 204 to be transported between the interface section 202 and the cleaning section 203 via the transport passage 224. On the other hand, when the second shutter 222 is moved upwards by means of the second driving part 223, the second shutter 222 is moved to a position shown by the dashed line 222' in FIG. 44, so that the transport passage 224 is closed. Thus, when the transport passage 224 is closed by the second shutter 222, the air communication between the interface section 202 and the cleaning section 203 is blocked.

When the first shutter 220 is open, the second shutter 222 is closed, and when the second shutter 222 is open, the first shutter 220 is closed. That is, when the first driving part 221 causes the first shutter 220 to move upwards, the second driving part 223 causes the second shutter 222 to move downwards, and when the second driving part 223 causes the second shutter 222 upwards, the first driving part 221 causes the first shutter 220 to move downwards.

A process for cleaning the wafers W in the cleaning system 201 will be described below.

First, cassettes C loaded with wafers W to be cleaned are transported to the front of the interface section 2 of the first shutter 201 by means of an AGV (not shown). In this stage, both of the first and second shutters 220 and 222 are moved upwards, and both of the transport gate 205 on the side of the interface section 202 and the transport passage 224 20 between the interface section 202 and the cleaning section 203 are closed. Then, when the AGV travels to the front of the interface section 202 to be stopped at a predetermined position, e.g., a control means (not shown) transmits a signal to the cleaning system 201 to recognize that the second shutter 222 is closed. Thereafter, the first shutter 220 is moved downwards by means of the first driving part 221, so that the transport gate 205 is open. Thereafter, the cassettes C transported by the AGV are transported into the interface section 202 via the transport gate 5, and two cassettes C are transferred to the left position on the rails 210 and 211 in the shown embodiment. Thus, when the transport of the cassettes C into the interface section 2 is completed, the first shutter 220 is moved upwards by means of the first driving part 221, so that the transport gate 205 is closed.

Then, the cassettes C are moved to the right position on the rails 210 and 211. After recognizing that the first shutter 220 is closed, the second shutter 222 is moved downwards by means of the second driving part 223, so that the transport gate 224 is open. Then, the cassettes C transferred onto the rails 210 and 211 by means of the arm 213 of the transfer unit 204 are picked up, one by one, to be sequentially transported into the waiting section 215 of the cleaning section 203. Thus, after the two cassettes C are transported into the waiting section 215, the second shutter 222 is moved upwards by means of the second driving part 223, so that the transport passage 224 is closed again. Then, after the two cassettes C are lifted by means of the lifter (not shown) in the cleaning section 203, the cassettes C are transported to the rearmost of the cleaning section 203 by means of the liner to be moved downwards by means of the lifter (not shown), so that the cassettes C loaded with the uncleaned wafers W are transported to the loader 219. Then, in the loader 219, the wafers W are unloaded from the two cassettes C to be sequentially batch transported to the respective cleaning section 203 to be cleaned and dried therein. The wafers W thus cleaned and dried are supplied to the unloader 216.

On the other hand, after the empty cassettes C, from which the wafers W have been unloaded in the loader 219, are lifted above the cleaning section 203 by means of the lifter again, the empty cassettes C are transported to the frontmost of the cleaning section 203 by means of the liner to be moved downwards by means of the lifter (not shown), so that the empty cassettes C are transported to the waiting section 215. Thereafter, the cassettes C thus transported to the waiting section 215 are supplied to the unloader 216. Then, the cleaned wafers W are housed in the cassettes C in the unloader 216 again. Then, the cassettes C loaded with the cleaned wafers W are transported from the unloader 216 to the waiting section 215.

Then, the second shutter 222 is moved downwards by means of the second driving part 223, so that the transport passage 224 is open. Then, the cassettes C transferred to the waiting section 215 are picked up, one by one, by means of the arm 213 of the transfer unit 4 to be sequentially transported to the right position on the rails 208 and 209 of the interface section 2. Thus, after two cassettes C are transported onto the rails 208 and 209, the second shutter 222 is move upwards by means of the second driving part 223, so that the transport passage 224 is closed again.

Then, the cassettes C are moved to the left position on the rails 208 and 209. Then, the first shutter 220 is moved downwards by means of the first driving part 221, so that the transport gate is open. Thereafter, the cassettes C, which have been transported to the left position on the rails 208 and 209, are unloaded by means of the AGV (not shown) to be suitably transported to the next step.

In the preferred embodiment of the cleaning system described above, since any one of the transport gate 205 of the interface section 202 and the transport passage 224 between the interface section 202 and the cleaning section 3 is always closed, air in the cleaning room does not directly enter the cleaning section 203 when the cassettes C are transported into or from the cleaning section 203. Therefore, it is possible to prevent particles and so forth suspended in the clean room from entering the cleaning section 203 of the cleaning system 201, so that the wafers W can be cleaned in a clean environment. In addition, since unnecessary airflow is not produced in the cleaning section 203, e.g., it is possible to prevent water marks from remaining on the surface of the wafer W when the IPA drying is carried out in the drying bath 218, so that it is possible to improve the reliability of the cleaning of the wafer W. Moreover, since the transport path of the cassette C can be linear in comparison with the case that a baffle board or the like is provided like the prior art, the carrying time of the cassette C can be decreased, so that the operation efficiency of the whole system can be improved.

Since air flows from top to bottom in the clean room, if the first driving part 221 and the second driving part 223 are located below the transport passage 224, it is possible to prevent the circulation of dust or the like, which may be produced from the first and second driving parts 221 and 223.

In the above preferred embodiment, while the cleaning system 1 for cleaning the wafers W has been mainly described, the present invention may be applied to a cleaning system for processing objects to be processed, such as LCD substrates.

According to this preferred embodiment, if the first and second shutters 220 and 221, which can be open and closed, are provided, it is possible to eliminate a bad influence of air entering the system from external environment when cleaning objects to be processed, and it is possible to decrease the cleaning time, so that the reliability and operation efficiency of the whole system can be improved. Therefore, according to the present invention, objects to be processed can be smoothly cleaned, and, for example, the production efficiency can be improved in the production of semiconductor devices.

[Other Preferred Embodiments]

In the first preferred embodiment, while the wafer unloading arm 14 and the wafer loading arm 16 have been separately provided, e.g., two stages of wafer holding sections for holding the wafers W may be provided, so that the wafers W can be loaded into and unloaded from the carrier 1 by means of a single wafer loading/unloading arm having wafer loading and unloading portions. Therefore, since the wafers W can be loaded and unloaded by means of a single arm, the size of the system can be further decreased.

In the first preferred embodiment, while the wafer transport arm 56 for delivering the wafers W to the respective processing units of the processing section 3 and the wafer delivery arm 15 for receiving the processed wafers W have been provided, it is not always required to provide two kinds of arms, and a single transport arm may be used both as the wafer transport arm 56 and the wafer delivery arm 15.

In the preferred embodiments described above, while the substrate transporting and processing system of the present invention has been applied to the cleaning system for semiconductor wafers, it may be applied to other processing systems. In addition, the substrate transporting and processing system of the present invention may be applied to the transport of LCD glass substrates.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A substrate transporting and processing system comprising:
    a supply section for a container, which container is dimensioned for housing therein, in a horizontal state, a plurality of substrates to be processed;
    a discharge section for the container;
    substrate unloading means for unloading a plural number of said plurality of substrates from the container;
    substrate loading means for loading a plural number of substrates into a container;
    attitude changing means for changing the attitude of a plural number of substrates of said plurality of substrates between a horizontal state and a vertical state;
    a processing section for suitably processing a plural number of substrates of said plurality of substrates simultaneously in one group; and
    a substrate transport means for delivering, in a vertical state, substrates between said attitude changing means and said processing section and for transporting the plural number of substrates in said processing section.

2. The substrate transporting and processing system according to claim 1, wherein said substrate unloading means and said substrate loading means comprise substrate unloading/loading means having a substrate unloading section and a substrate loading section.

3. The substrate transporting and processing system according to claim 1, which further comprises:
    a container waiting section for housing an empty container; and
    container transport means for transporting the container in said supply and discharge sections and between said supply and discharge sections and said container waiting section.

4. The substrate transporting and processing system according to claim 3, wherein said container waiting section has container moving means for moving said container.

5. The substrate transporting and processing system according to claim 1, which further comprises container transport means for transporting a container between said supply and discharge sections and a substrate unloading position, at which a plural number of substrates is unloaded from the container by said substrate unloading means, and a substrate loading position, at which a plural number of substrates is loaded into the container by said substrate loading means.

6. The substrate transporting and processing system according to claim 1, which further comprises:
    a container waiting section for housing said container;
    first container transport means for transporting said container between said supply and discharge sections and said container waiting section; and
    second container transport means for transporting said container between said container waiting section and said substrate unloading and loading means.

7. The substrate transporting and processing system according to claim 1, which further comprises positioning means for positioning a substrate unloaded from said container.

8. The substrate transporting and processing system according to claim 1, wherein said attitude changing means has space adjusting means for adjusting and changing a space between adjacent substrates.

9. The substrate transporting and processing system according to claim 1, wherein said processing section has a processing bath for receiving a plural number of substrates, and a moving mechanism for transporting together a group of substrates to be received by the processing bath into and from said processing bath.

10. The substrate transporting and processing system according to claim 8, wherein said moving mechanism is formed so as to be capable of transporting the plural number of substrates to be received by said processing bath into and from at least one additional processing bath.

11. The substrate transporting and processing system according to claim 1, wherein said processing section comprises a processing bath for receiving the plural number of substrates of said plurality of substrates together, chemical supply means for supplying a chemical into the processing bath, and cleaning solution supply means for supplying a cleaning solution into the processing bath.

12. The substrate transporting and processing system according to claim 1, wherein said processing section has cleaning means for cleaning at least a substrate holding section of said substrate transport means.

13. The substrate transporting and processing system according to claim 1, wherein said processing section has cleaning/drying means for cleaning and drying the plural number of substrates of said plurality of substrates.

14. The substrate transporting and processing system according to claim 1, wherein said supply section has a container inlet and a substrate outlet, and said discharge section has a container outlet and a substrate inlet.

15. The substrate transporting and processing system according to claim 1, wherein said supply section and said discharge section are provided in parallel, and said processing section faces said supply and discharge sections.

16. The substrate transporting and processing system according to claim 1, which further comprises first transport means for delivering a plural number of substrates of said plurality of substrates from said attitude changing means to said processing section, and second substrate transport means for delivering the plural number of substrates of said plurality of substrates from said processing section to said attitude changing means.

17. The substrate transporting and processing system according to claim 1, wherein said substrate transport means is movable to a position facing said attitude changing means, and which further comprises substrate delivery means, provided between said substrate transport means and said attitude changing means, for delivering a group of substrates therebetween.

18. The substrate transporting and processing system according to claim 1, comprising a plurality of containers each dimensioned for housing a group of substrates, and said substrate unloading means, said attitude changing means and processing section each dealing with a common group of multiple substrates.

19. The substrate transporting and processing system according to claim 18 wherein each of said containers includes a lid to close off said container, and said substrate transporting and processing system further comprising means for opening and closing substrate lids.

20. A substrate transporting and processing system comprising:
    a supply section for a container which container is dimensioned for housing therein, in a horizontal state, a plurality of substrates to be processed;

a discharge section for the container;

substrate unloading means for unloading a plural number of substrates of the plurality of substrates from the container;

substrate loading means for loading a plural number of substrates into a container;

attitude changing means for changing the attitude of a plural number of substrates of said plurality of substrates between a horizontal state and a vertical state;

a processing section for suitably processing a plural number of substrates of said plurality of substrates simultaneously in one group;

substrate transfer means for transferring the plural number of substrates of which the attitude has been changed by said attitude changing means, to an interface provided on an opposite side of said processing section to that of said supply and discharge sections, and a substrate transport means for delivering the plural number of substrates in the vertical state between said interface and said processing section and for transporting the same plural number of substrates in said processing section.

21. The substrate transporting and processing system according to claim 20, which further comprises second substrate transport means for delivering the plural number of substrates of said plurality of substrates between said processing section and said attitude changing means and for transporting the plural number of substrates of said plurality of substrates in said processing section.

22. The substrate transporting and processing system according to claim 20, comprising a plurality of containers each dimensioned for housing a group of substrates, and said substrate unloading means, said attitude changing means and processing section each dealing with a common group of multiple substrates.

23. The substrate transporting and processing system according to claim 22 wherein each of said containers includes a lid to close off said container, and said substrate transporting and processing system further comprising means for opening and closing substrate lids.

24. A substrate transporting and processing system comprising:

a supply section for a container, which container is dimensioned for housing therein, in a horizontal state, a plurality of substrates to be processed;

a discharge section for the container;

a processing section for suitably processing a plural number of substrates of said plurality of substrates simultaneously in one group;

an interface section provided on an opposite side of said processing section to said supply and discharge sections; and container transfer means for transferring the container of said supply section, to said interface section, said interface section including:

substrate unloading means for unloading a plural number of substrates of said plurality of substrates from said container, first attitude changing means for changing the attitude of the plural number of substrates, which are unloaded from the container by said substrate unloading means, from a horizontal state to a vertical state, substrate transport means for delivering, in the vertical state, the plural number of substrates unloaded from the container between said first attitude changing means and said processing section and for transferring the plural number of substrates unloaded from the container in said processing section, second attitude changing means, provided on the side of said supply and discharge sections, for changing the attitude of the plural number of substrates subjected to said first attitude changing means from the vertical state to the horizontal state, and substrate loading means for loading the plural number of substrates subjected to said second attitude changing means into a container.

25. The substrate transporting and processing system according to claim 21, which further comprises second substrate transport means for delivering a plural number of substrates between said processing section and said second attitude changing means and for transporting in said processing section the plural number of substrates to be received by said second attitude changing means.

26. The substrate transporting and processing system according to claim 4, which further comprises a container waiting section provided along a transfer channel of said container transfer means.

* * * * *